(12) United States Patent
Blonigan et al.

(10) Patent No.: US 8,444,364 B2
(45) Date of Patent: May 21, 2013

(54) AUTO-SEQUENCING MULTI-DIRECTIONAL INLINE PROCESSING APPARATUS

(75) Inventors: Wendell Thomas Blonigan, Pleasanton, CA (US); Masato Toshima, Sunnyvale, CA (US); Kam S. Law, San Jose, CA (US); David Eric Berkstresser, Los Gatos, CA (US); Steve Kleinke, San Jose, CA (US); Craig Lyle Stevens, Ben Lomond, CA (US)

(73) Assignee: Orbotech LT Solar, LLC., San Jose, CA (US)

( * ) Notice: Subject to any disclaimer, the term of this patent is extended or adjusted under 35 U.S.C. 154(b) by 342 days.

(21) Appl. No.: 12/965,798

(22) Filed: Dec. 10, 2010

(65) Prior Publication Data

US 2011/0142573 A1 Jun. 16, 2011

Related U.S. Application Data

(60) Provisional application No. 61/285,505, filed on Dec. 10, 2009.

(51) Int. Cl.
*B65G 53/46* (2006.01)

(52) U.S. Cl.
USPC .......................................... 414/221; 414/939

(58) Field of Classification Search .................. 414/221, 414/758, 761, 763, 773, 783, 936, 941
See application file for complete search history.

(56) References Cited

U.S. PATENT DOCUMENTS

| | | | | |
|---|---|---|---|---|
| 3,158,086 A | * | 11/1964 | Weimer | 99/423 |
| H000422 H | * | 2/1988 | Daniels et al. | 414/763 |
| 4,752,180 A | * | 6/1988 | Yoshikawa | 414/737 |
| 5,855,468 A | * | 1/1999 | Cagle et al. | 414/761 |
| 6,036,782 A | | 3/2000 | Tanaka et al. | |
| 6,064,629 A | | 5/2000 | Stringer et al. | |
| 6,159,301 A | * | 12/2000 | Sato et al. | 118/728 |
| 6,286,230 B1 | * | 9/2001 | White et al. | 34/403 |
| 6,435,798 B1 | * | 8/2002 | Satoh | 414/217 |
| 6,746,198 B2 | * | 6/2004 | White et al. | 414/222.13 |
| 6,979,168 B2 | * | 12/2005 | Uchimaki et al. | 414/217.1 |
| 7,128,516 B2 | * | 10/2006 | Sugiyama et al. | 414/676 |
| 7,283,660 B2 | * | 10/2007 | Ganot et al. | 382/151 |
| 7,290,978 B2 | * | 11/2007 | Tran | 414/763 |
| 7,806,641 B2 | * | 10/2010 | Guo et al. | 414/217 |
| 7,845,529 B2 | * | 12/2010 | Okajima et al. | 225/96.5 |

(Continued)

FOREIGN PATENT DOCUMENTS

| | | |
|---|---|---|
| CN | 102094188 A | 6/2011 |
| CN | 102122609 A | 7/2011 |

(Continued)

OTHER PUBLICATIONS

Office Action in U.S. Appl. No. 12/965,791 dated Sep. 25, 2012.

(Continued)

*Primary Examiner* — Joshua Rudawitz
(74) *Attorney, Agent, or Firm* — Nixon Peabody LLP; Joseph Bach, Esq.

(57) ABSTRACT

An apparatus and method for concurrent processing of several substrates. The system employs a novel architecture which, while being linear, may autonomously sequence processing and move substrates in different directions as necessary. The system moves several substrates concurrently; however, unlike the prior art it does not utilize trays.

19 Claims, 83 Drawing Sheets

U.S. PATENT DOCUMENTS

| | | | |
|---|---|---|---|
| 8,246,284 B2 * | 8/2012 | Borden | 414/217 |
| 2004/0197184 A1 * | 10/2004 | Sugiyama et al. | 414/758 |
| 2005/0183827 A1 | 8/2005 | White et al. | |
| 2006/0177288 A1 * | 8/2006 | Parker et al. | 414/217 |
| 2006/0197235 A1 * | 9/2006 | Farnworth et al. | 257/787 |
| 2006/0286193 A1 * | 12/2006 | Ando et al. | 425/385 |
| 2008/0233283 A1 | 9/2008 | Choi et al. | |
| 2009/0045182 A1 | 2/2009 | Lerner et al. | |
| 2010/0087028 A1 * | 4/2010 | Porthouse et al. | 438/61 |
| 2010/0202860 A1 * | 8/2010 | Reed et al. | 414/221 |
| 2010/0203242 A1 * | 8/2010 | Borden | 427/248.1 |
| 2011/0139372 A1 | 6/2011 | Blonigan et al. | |
| 2011/0142572 A1 * | 6/2011 | Blonigan et al. | 414/217 |

FOREIGN PATENT DOCUMENTS

| | | |
|---|---|---|
| CN | 102122610 A | 7/2011 |
| EP | 1422317 A1 | 5/2004 |
| EP | 2261391 A1 | 12/2010 |
| EP | 2333813 A2 | 6/2011 |
| EP | 2333814 A2 | 6/2011 |
| EP | 2336389 A1 | 6/2011 |
| JP | 2011-124579 A | 6/2011 |
| JP | 2011-137228 A | 7/2011 |
| WO | WO 2009/119580 A1 | 10/2009 |

OTHER PUBLICATIONS

Office Action in U.S. Appl. No. 12/965,791 dated Dec. 28, 2012.

European Extended Search Report for EP10194536.8 dated Apr. 1, 2011.

* cited by examiner

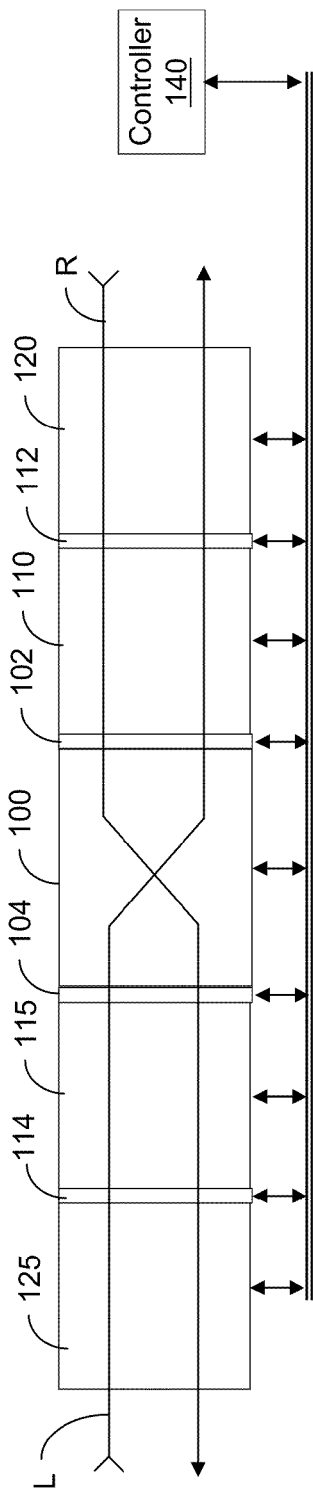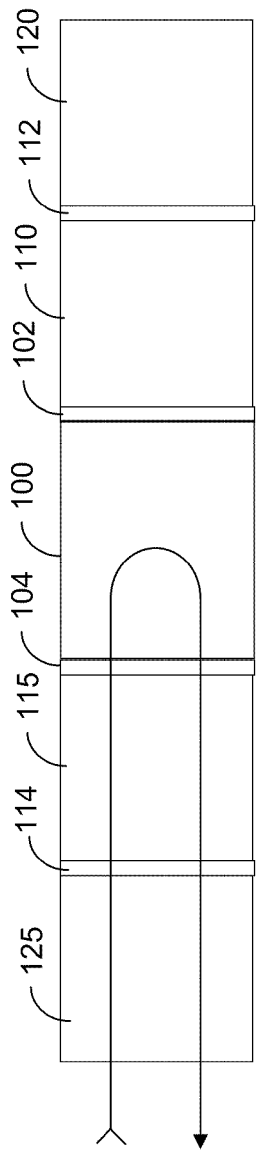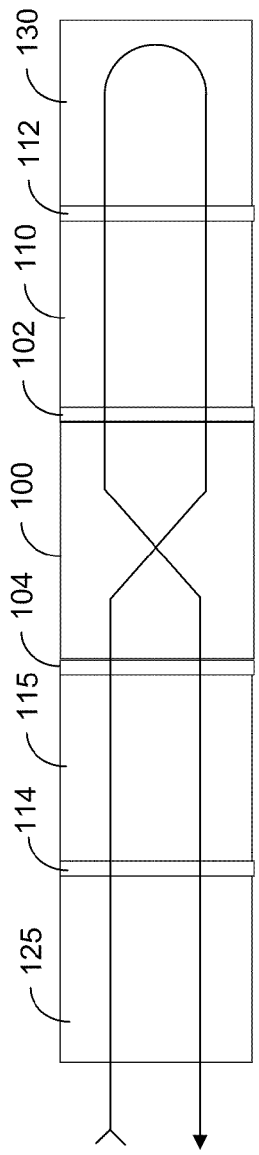

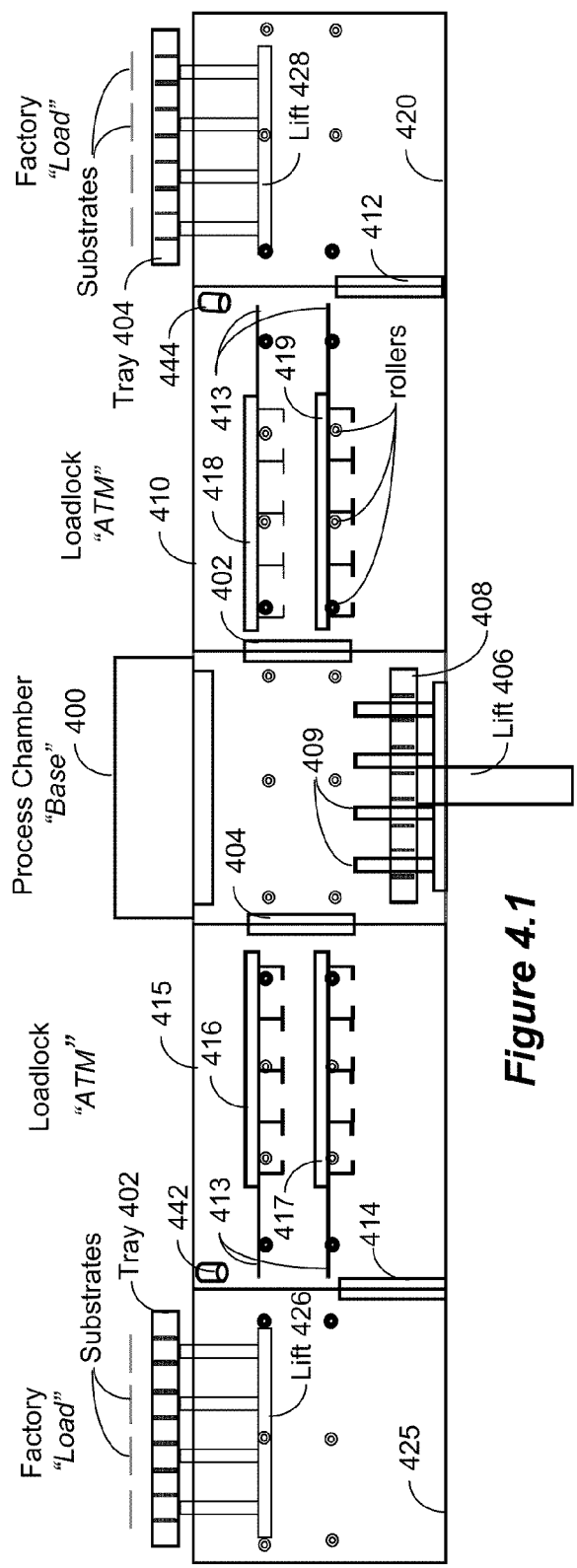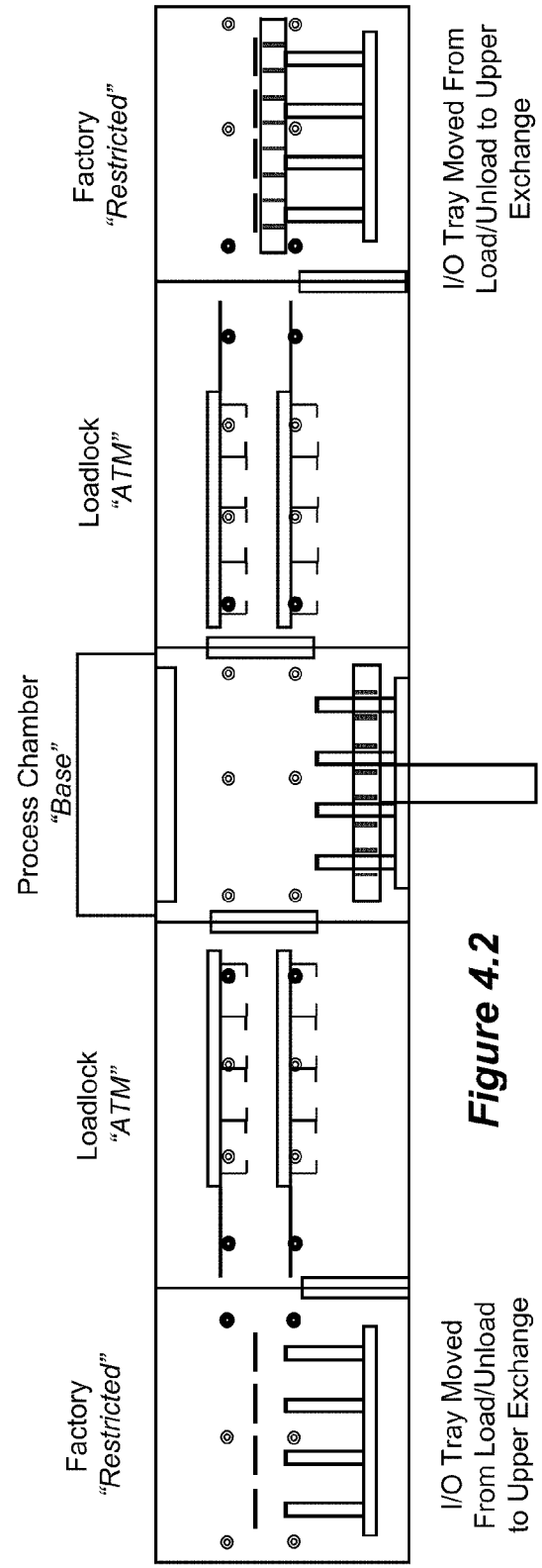

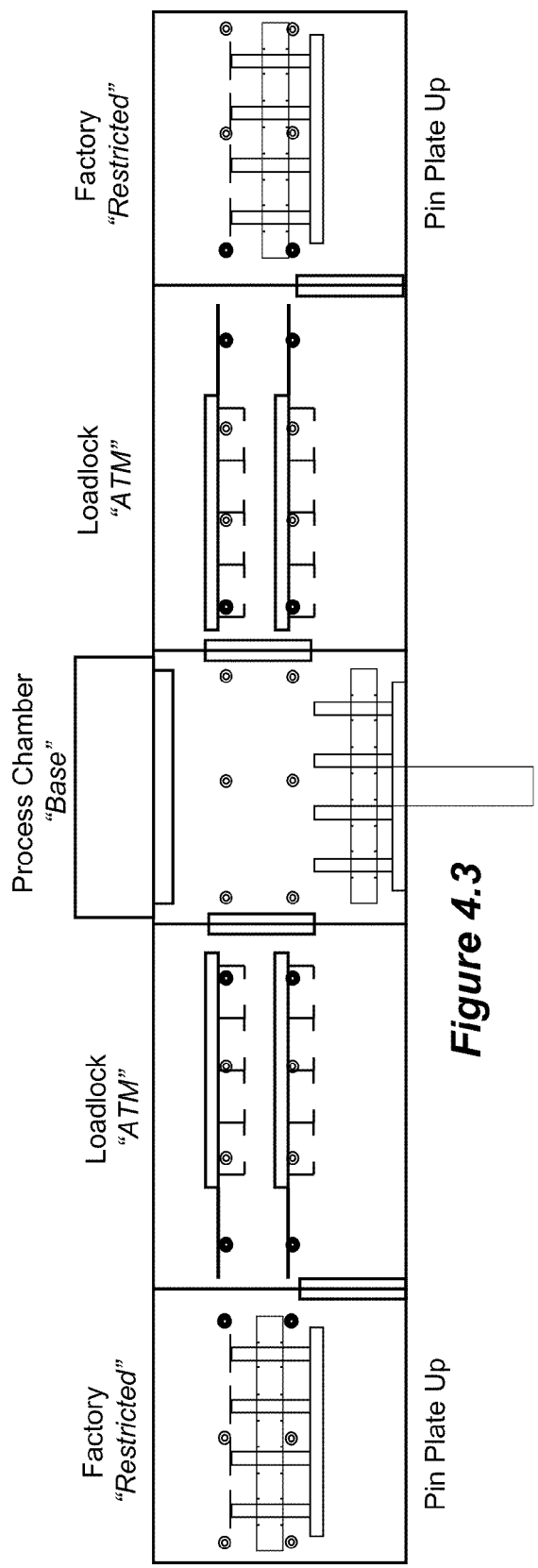
*Figure 4.3*
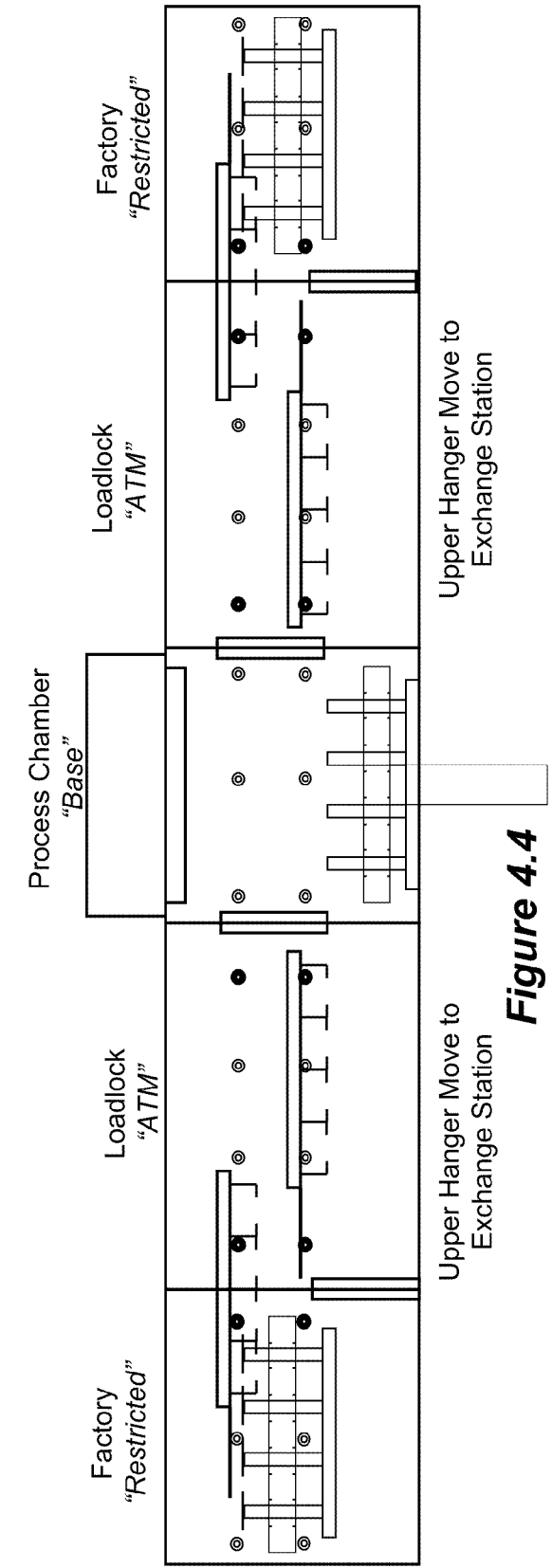
*Figure 4.4*

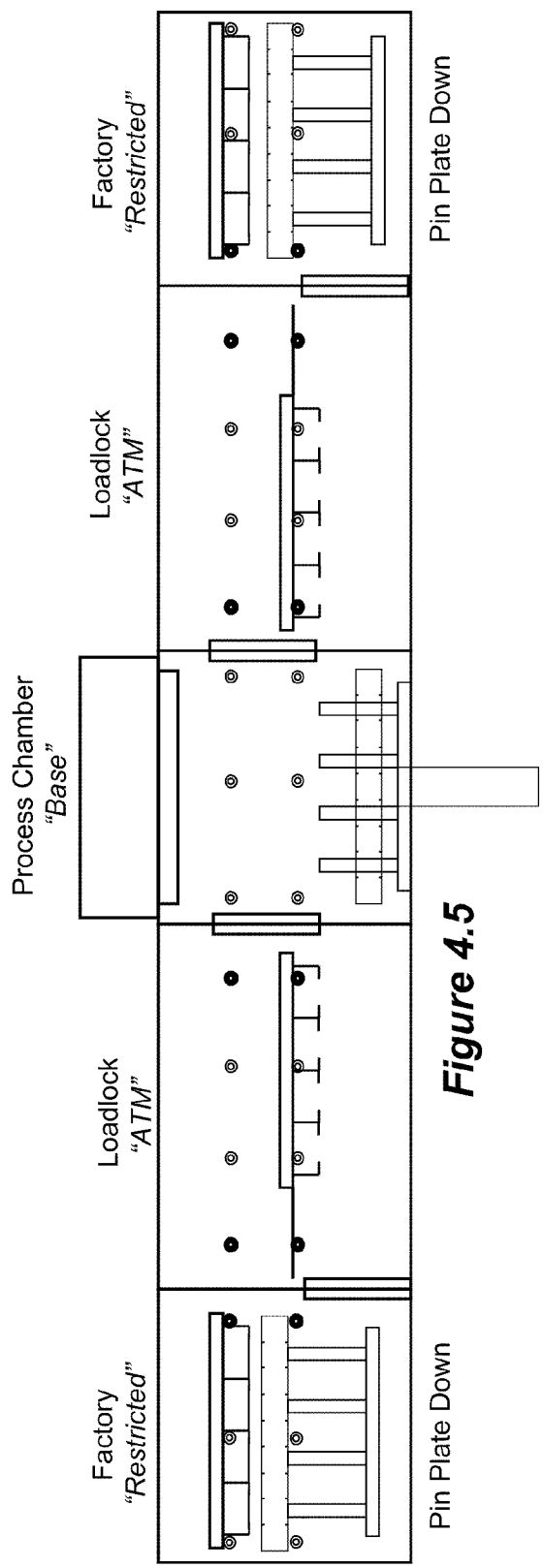
*Figure 4.5*
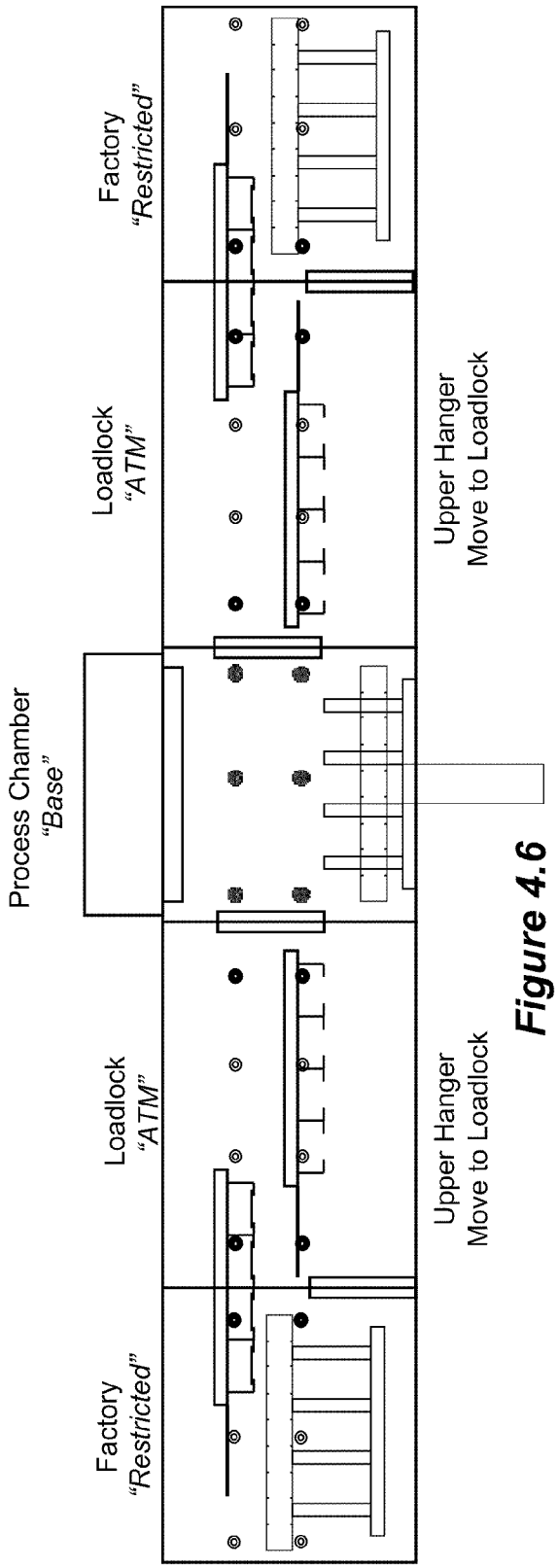
*Figure 4.6*

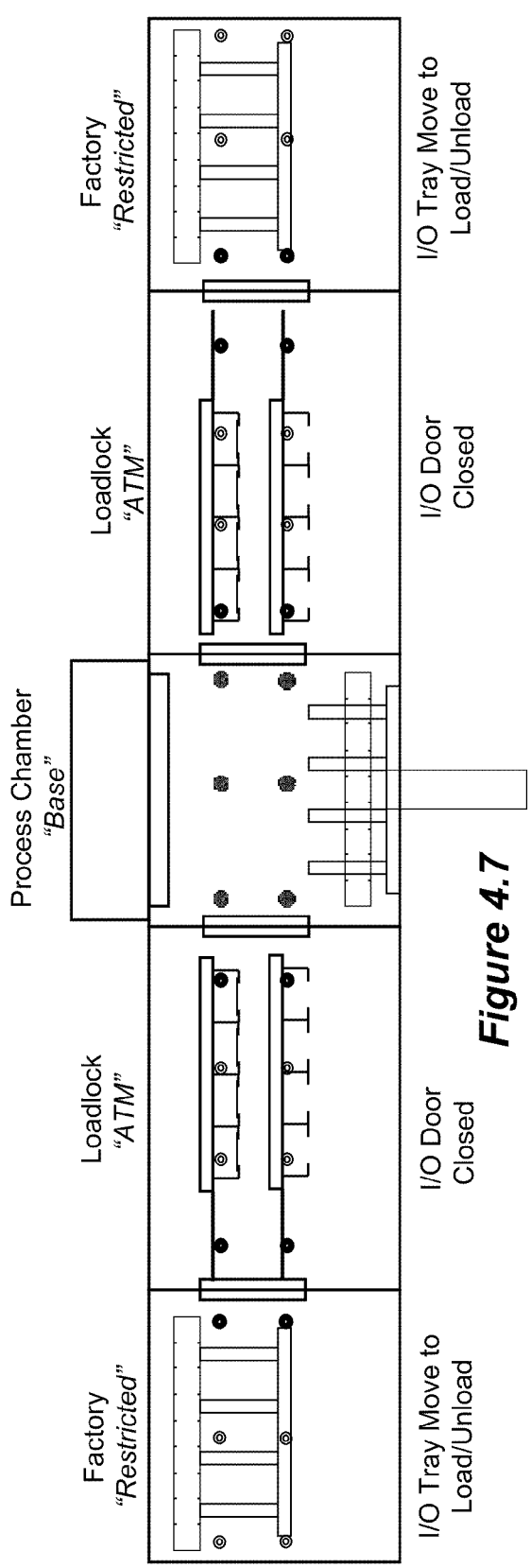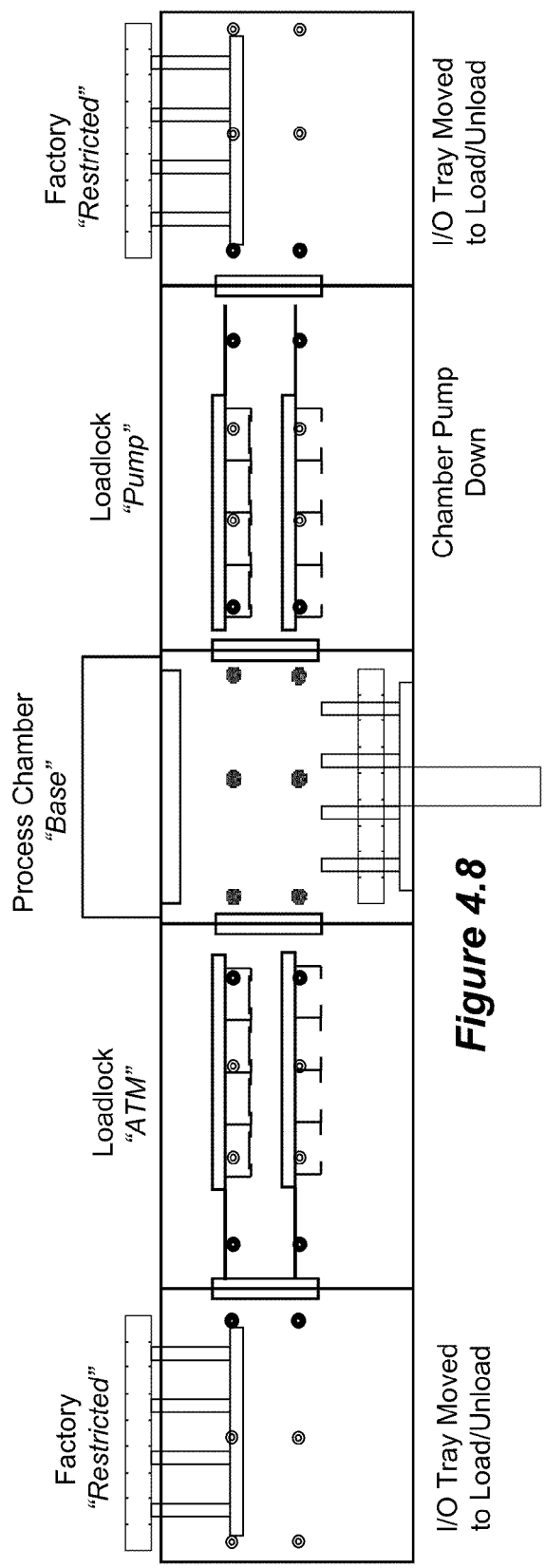

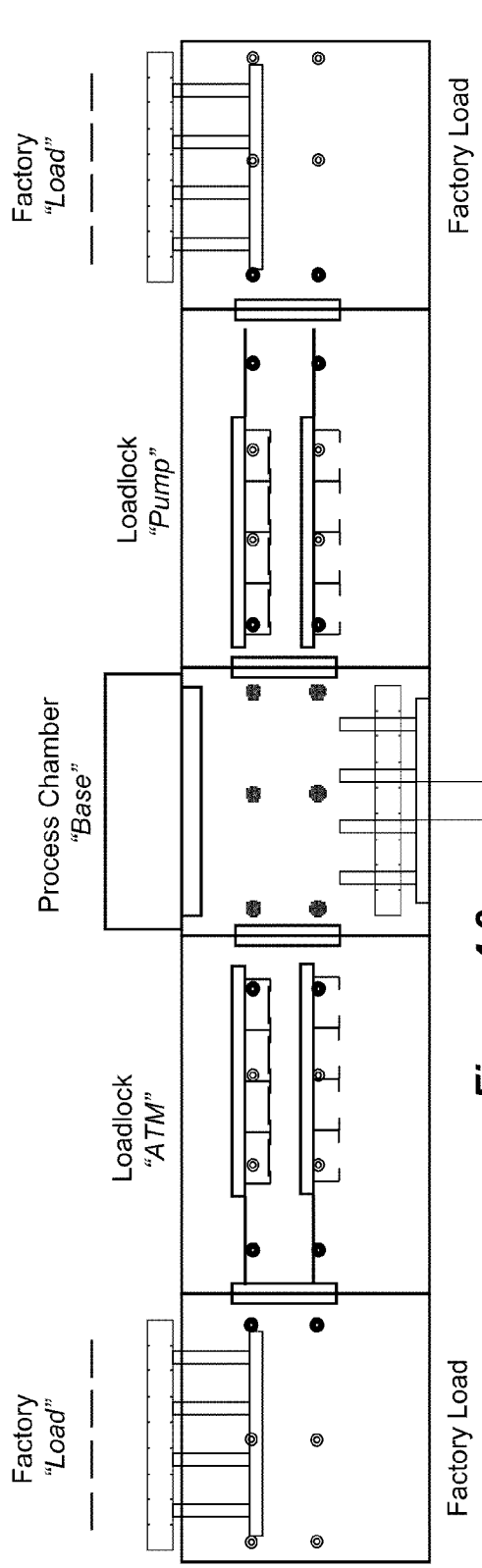
Figure 4.9
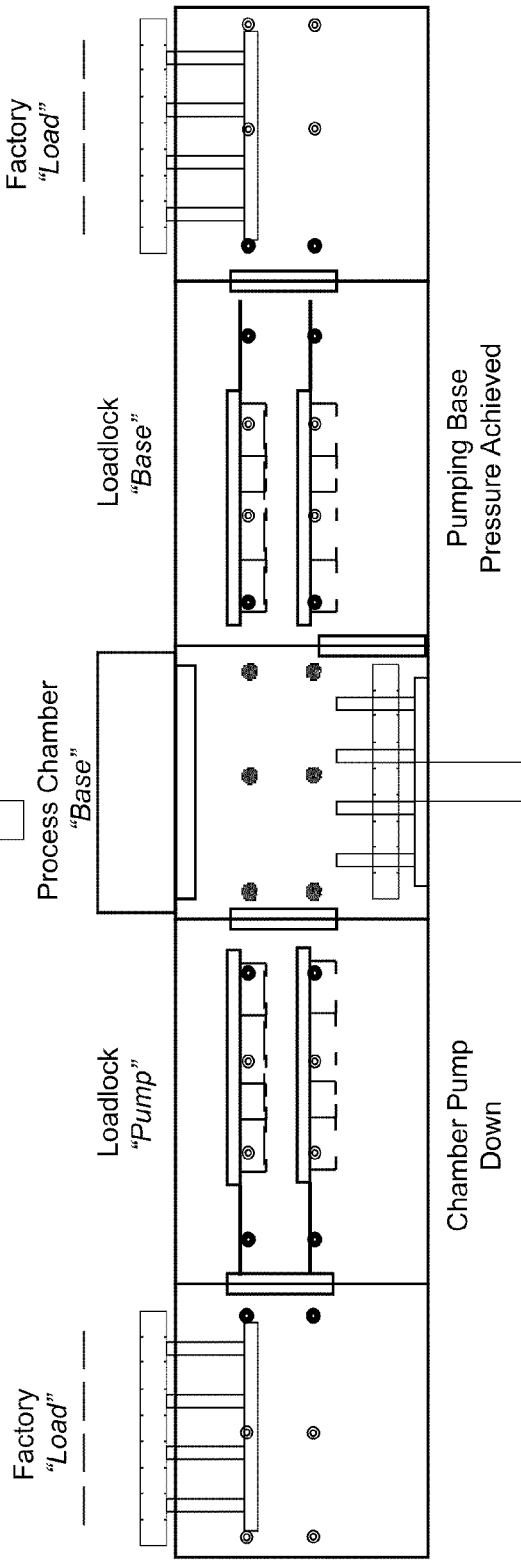
Figure 4.10

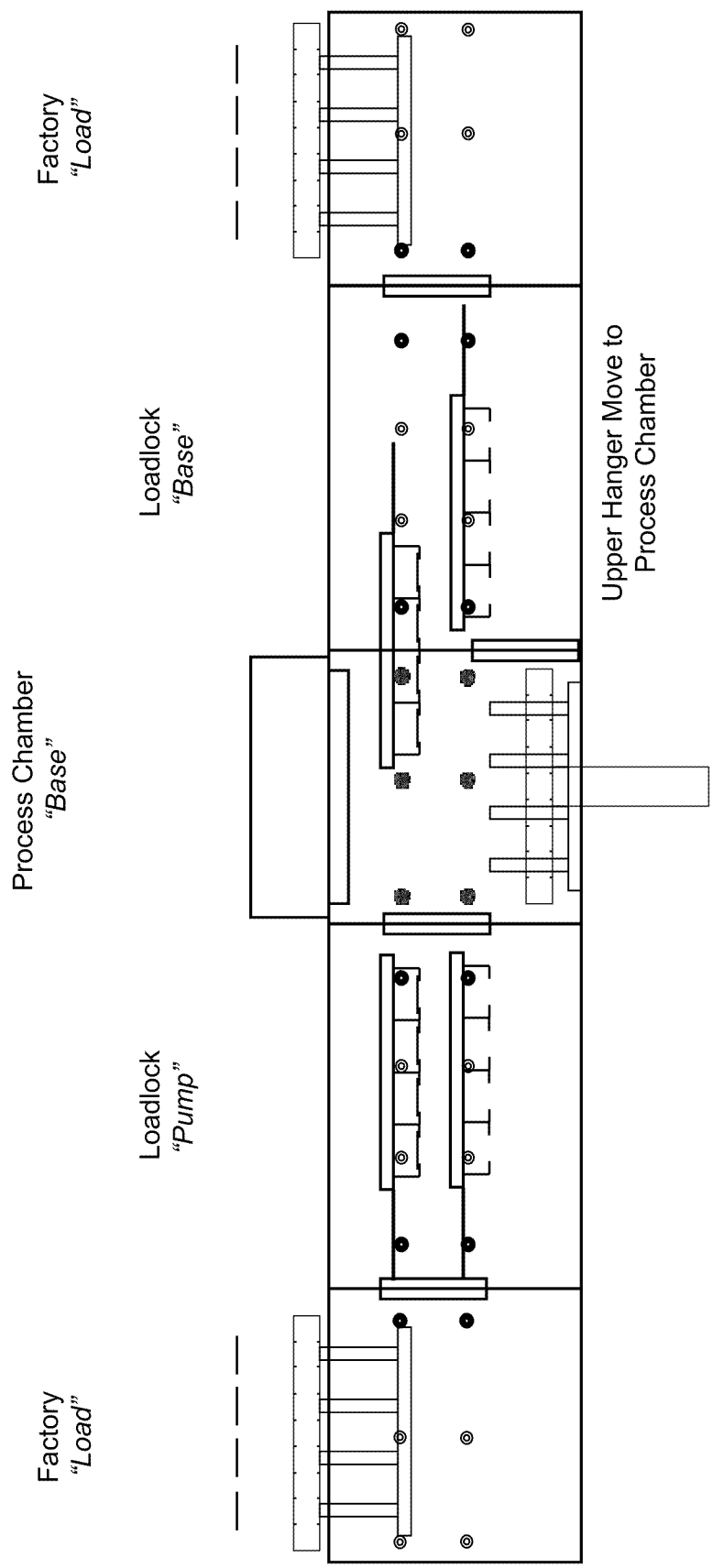
*Figure 4.11*

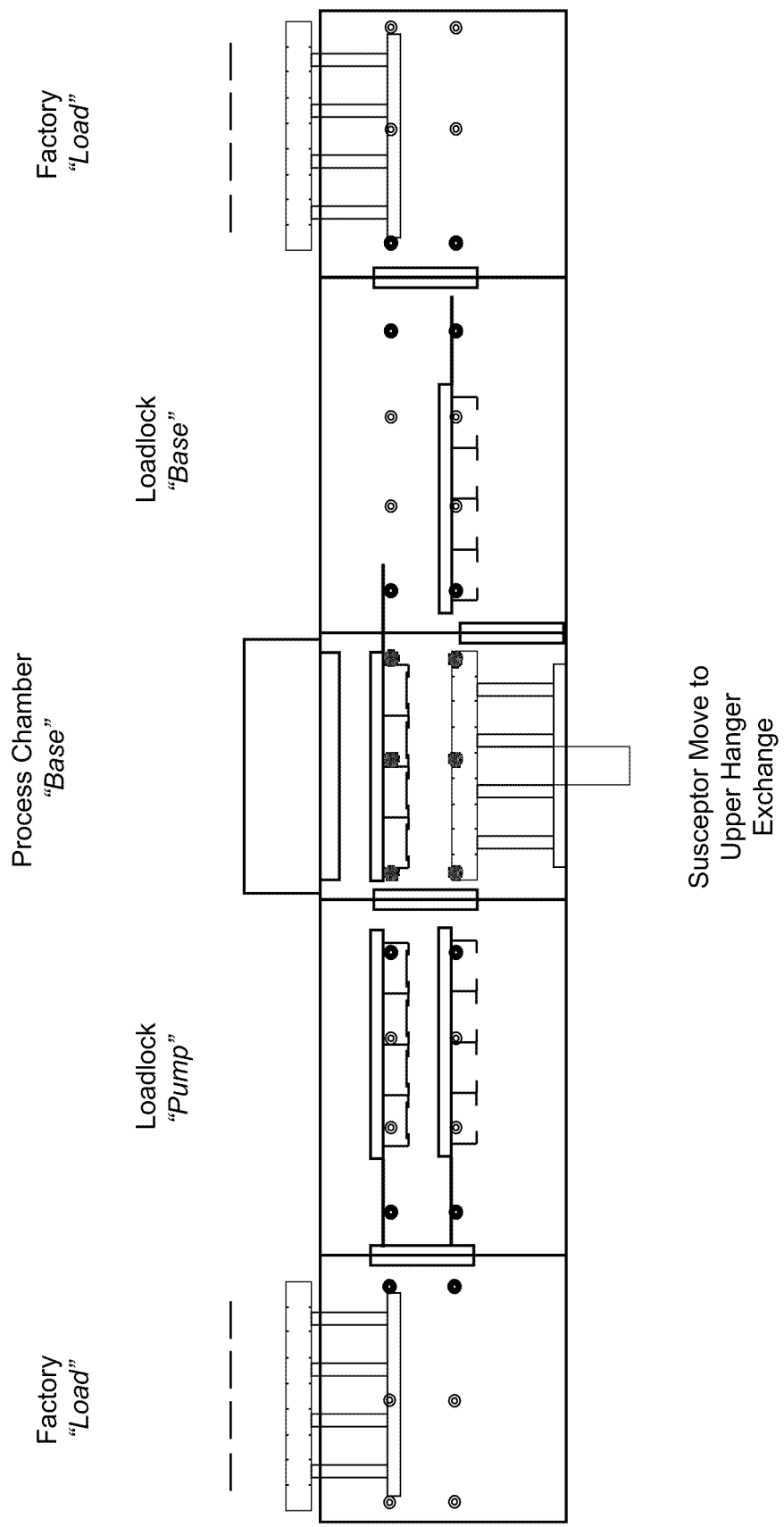
Figure 4.12

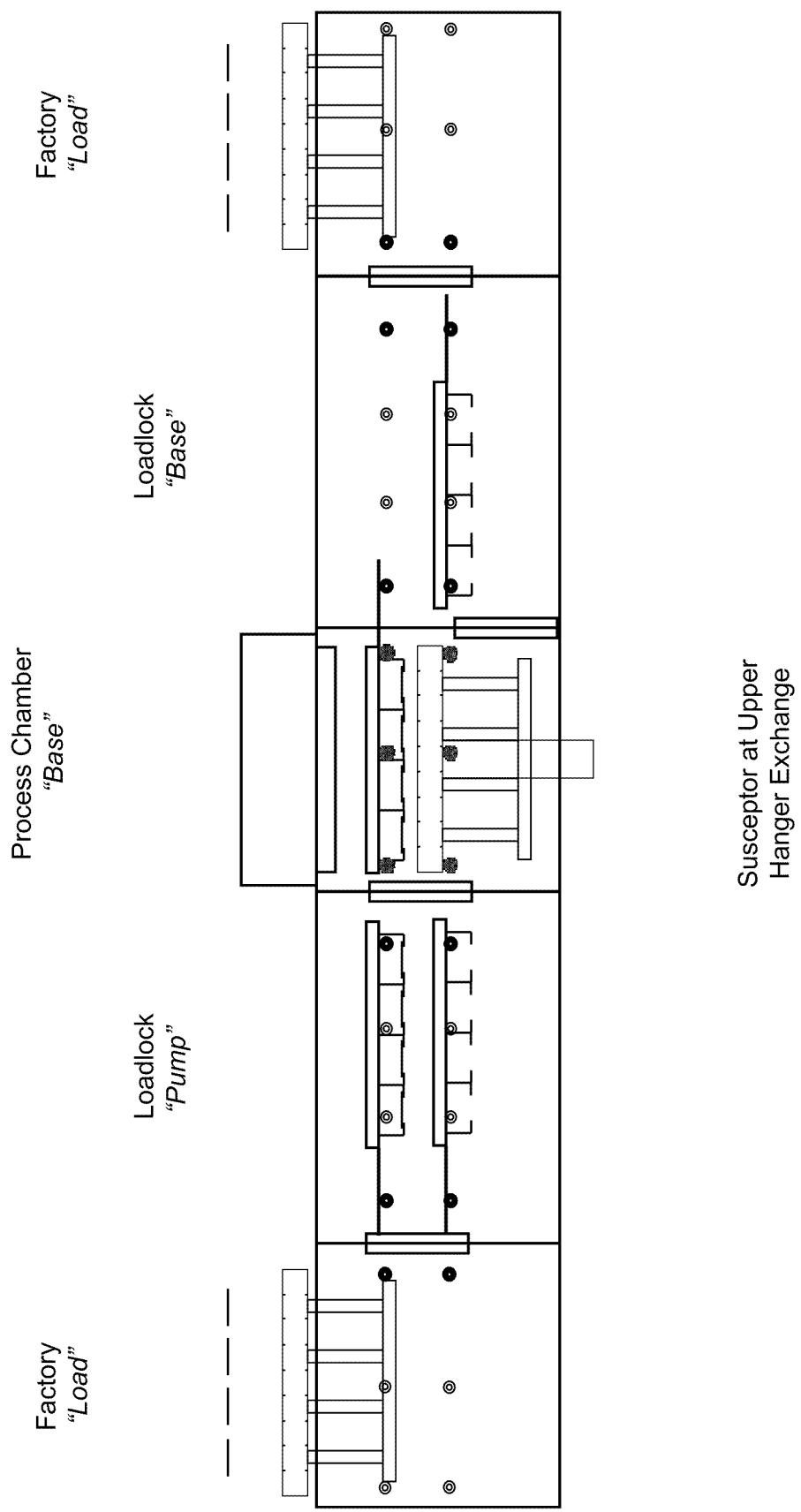
Figure 4.13

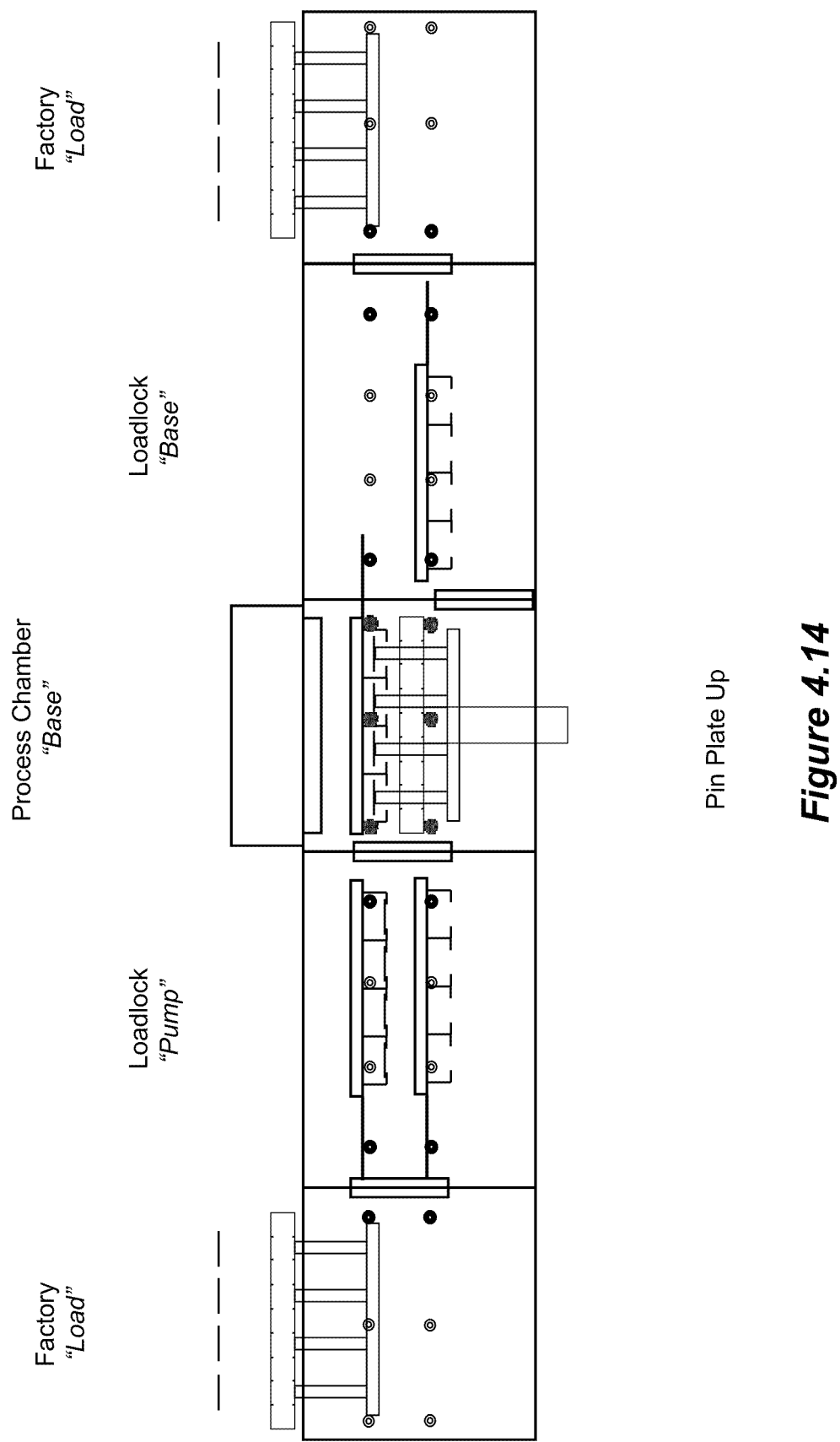
*Figure 4.14*

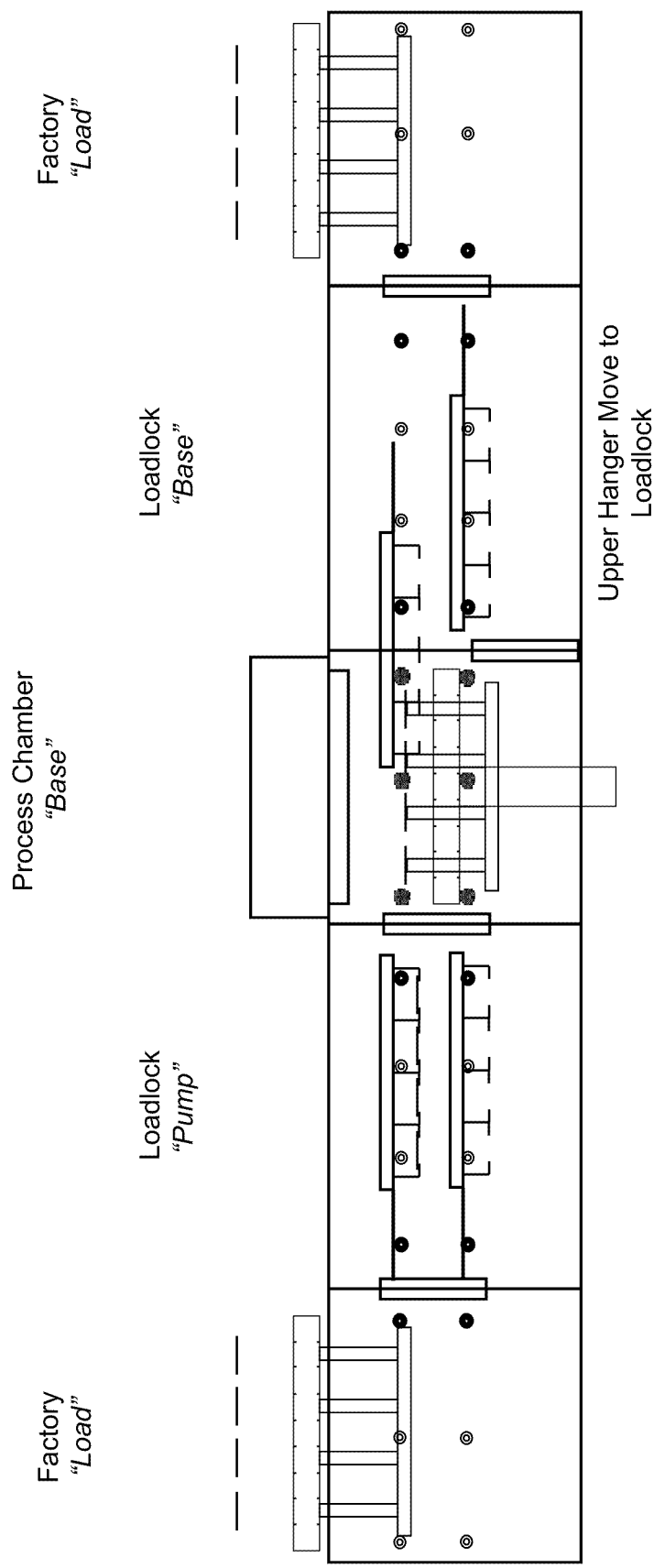
Figure 4.15

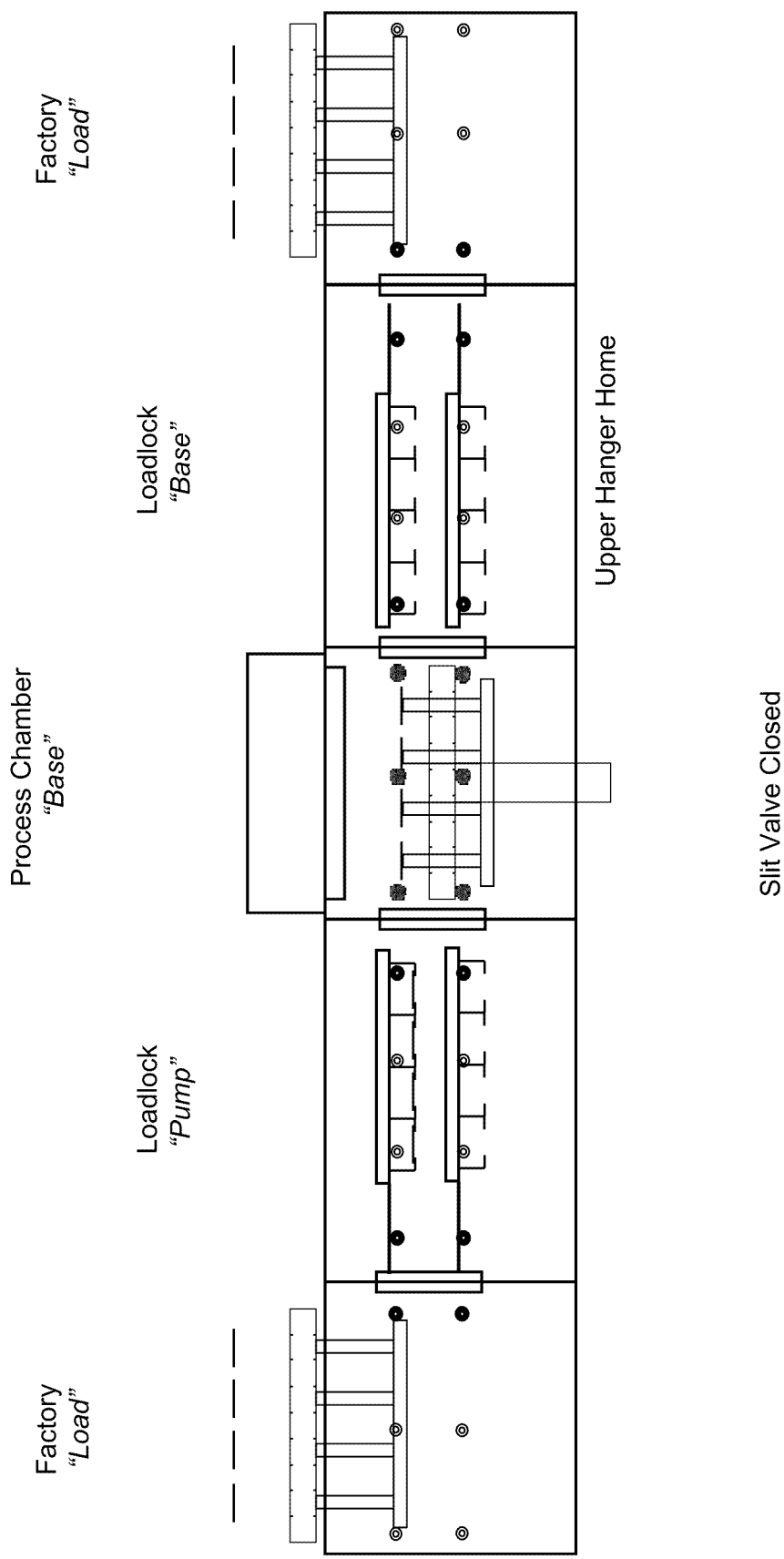
Figure 4.16

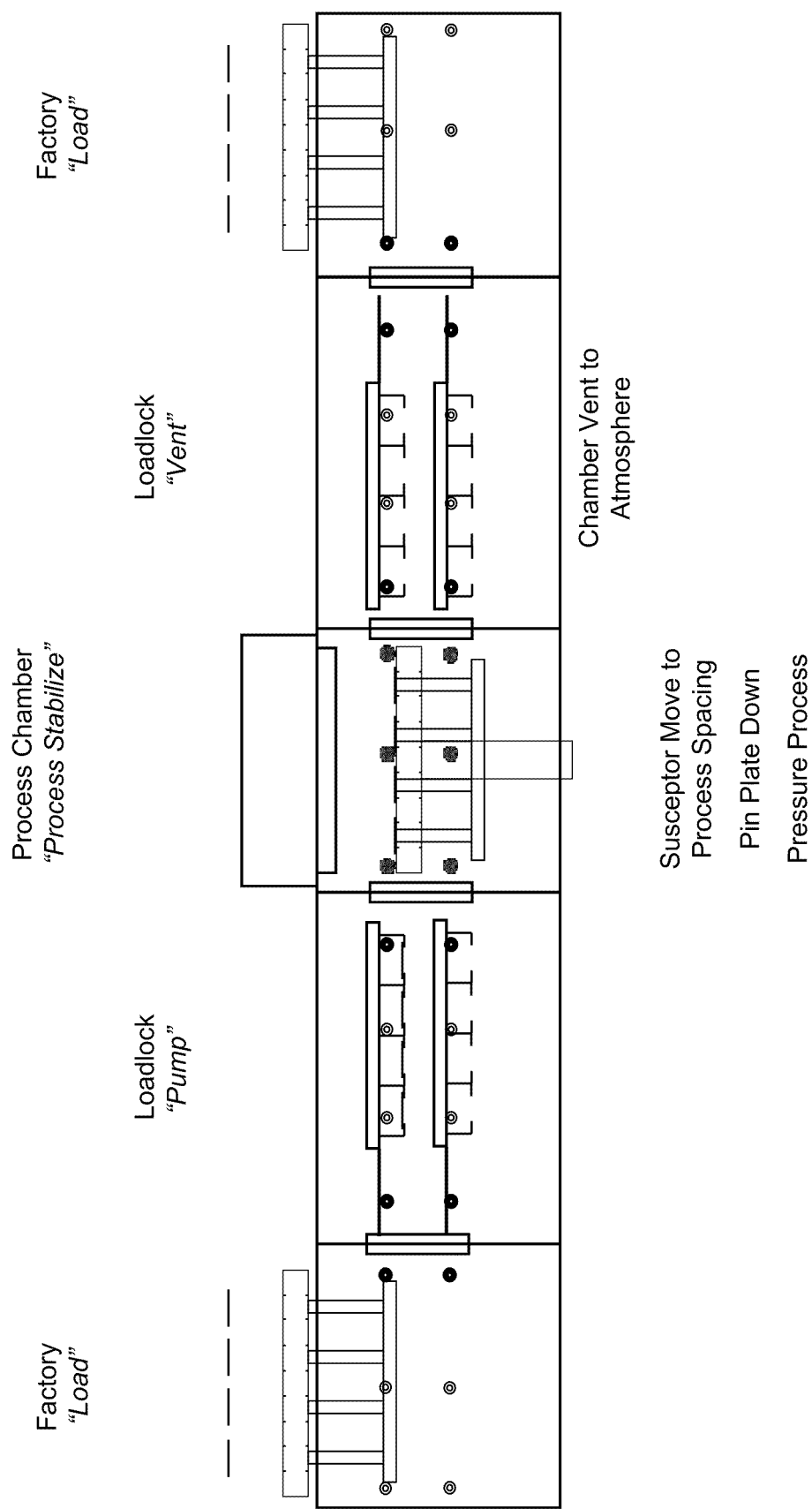
Figure 4.17

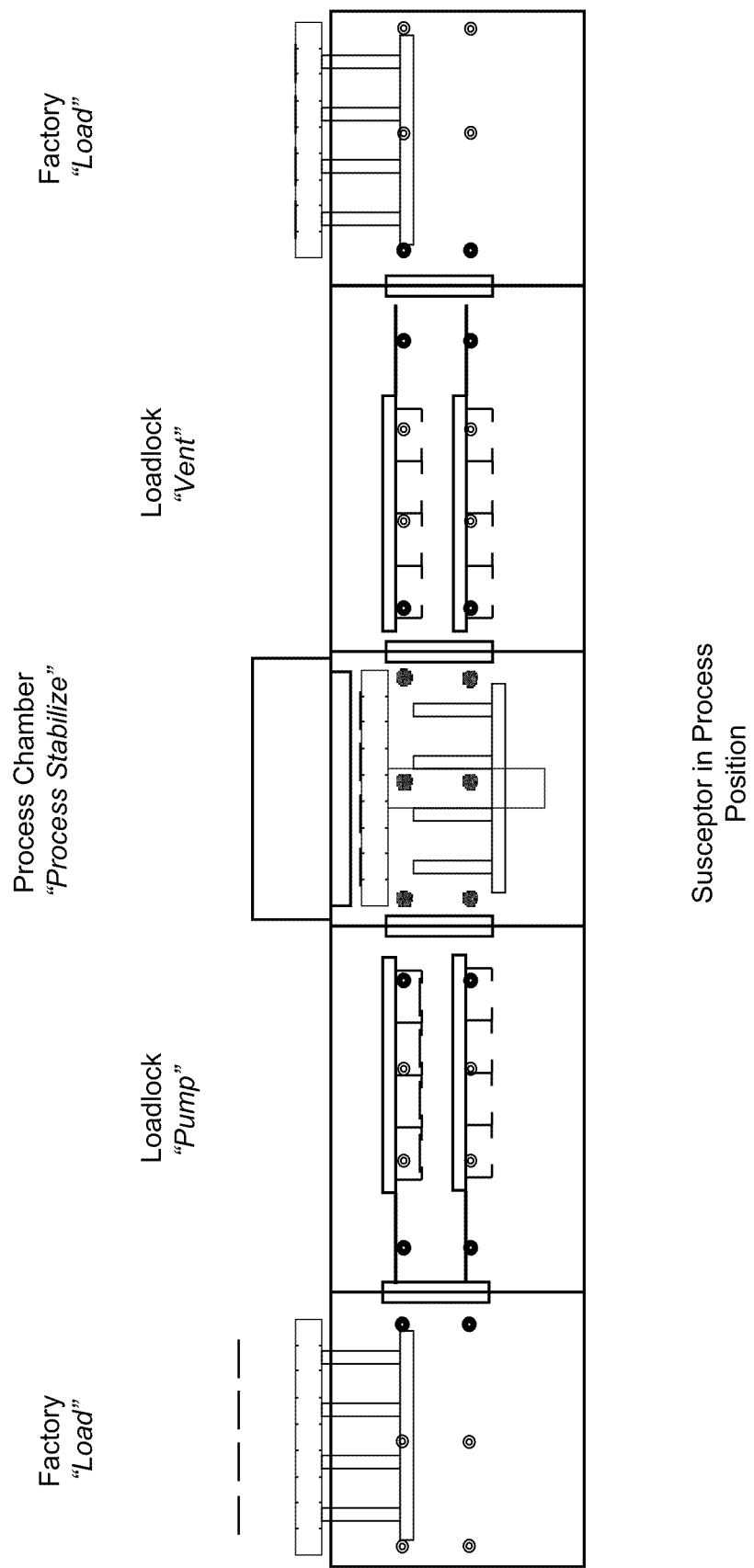
Figure 4.18

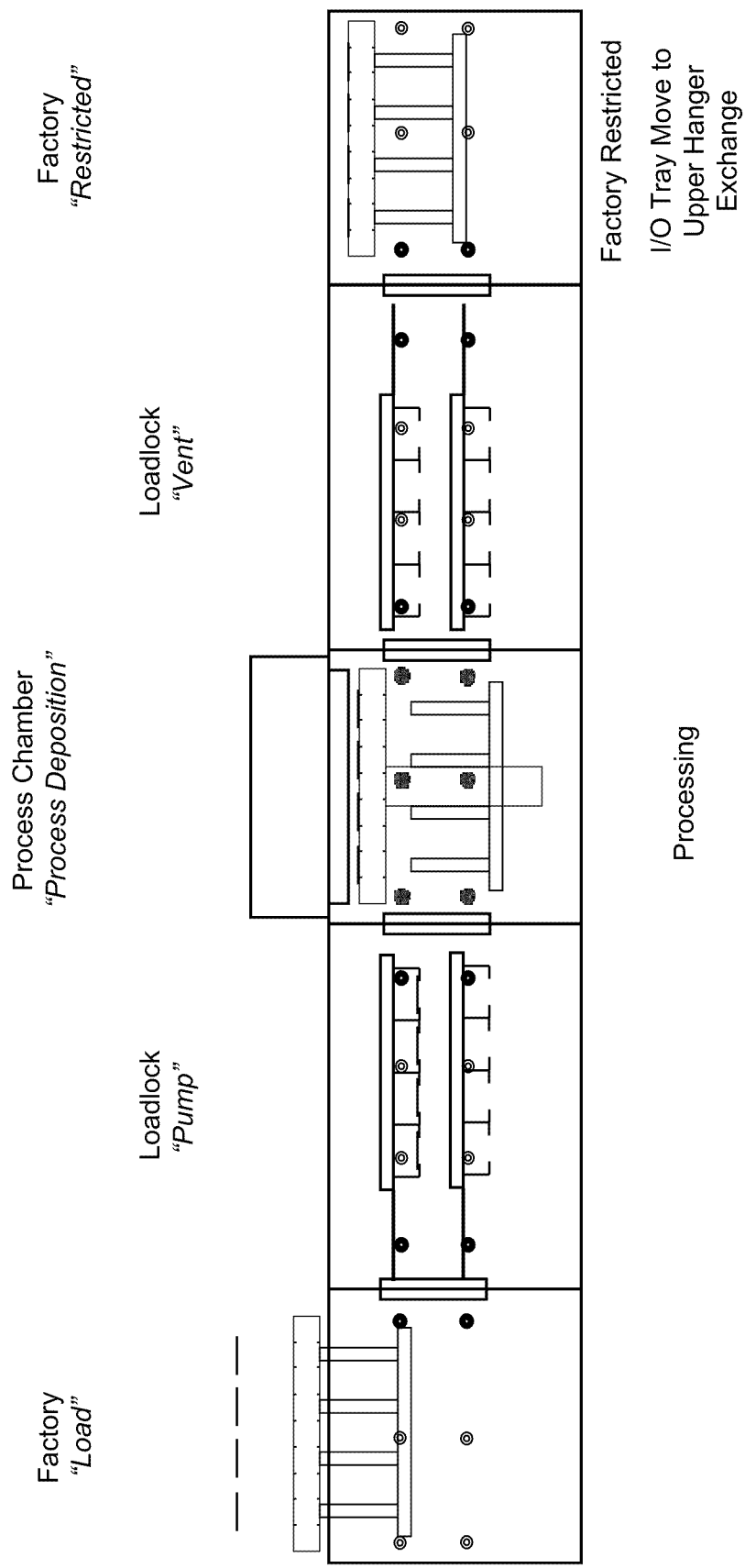
Figure 4.19

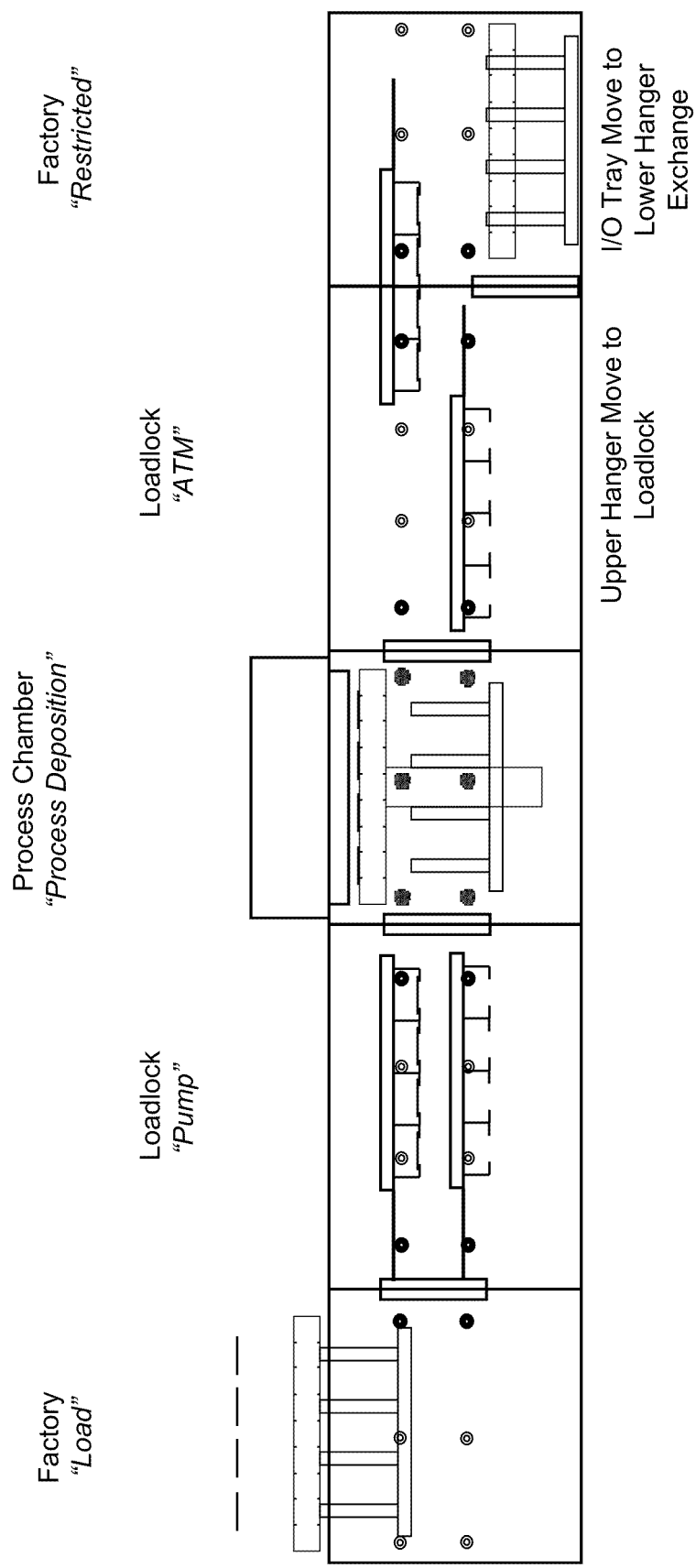
*Figure 4.20*

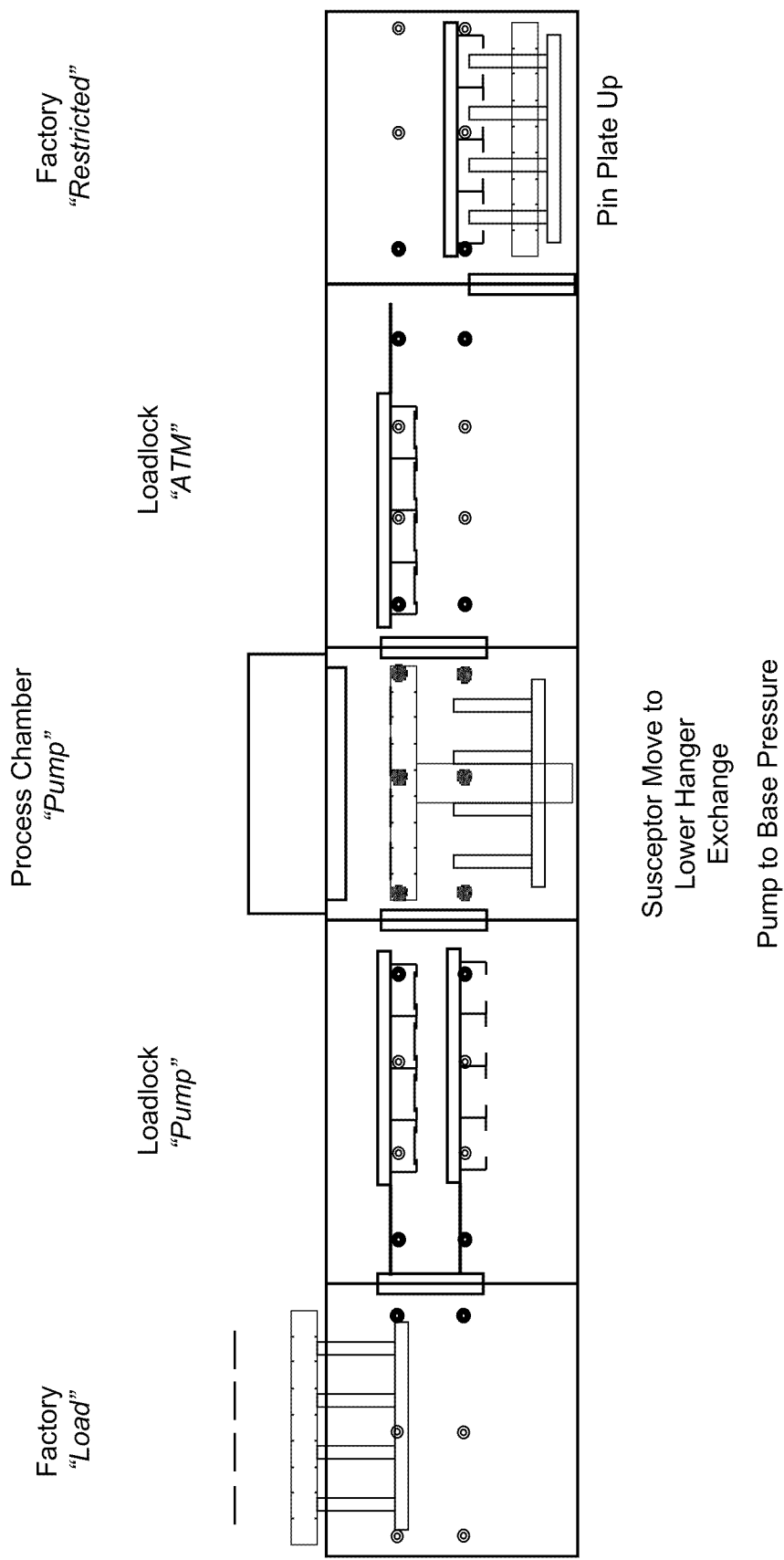
Figure 4.21

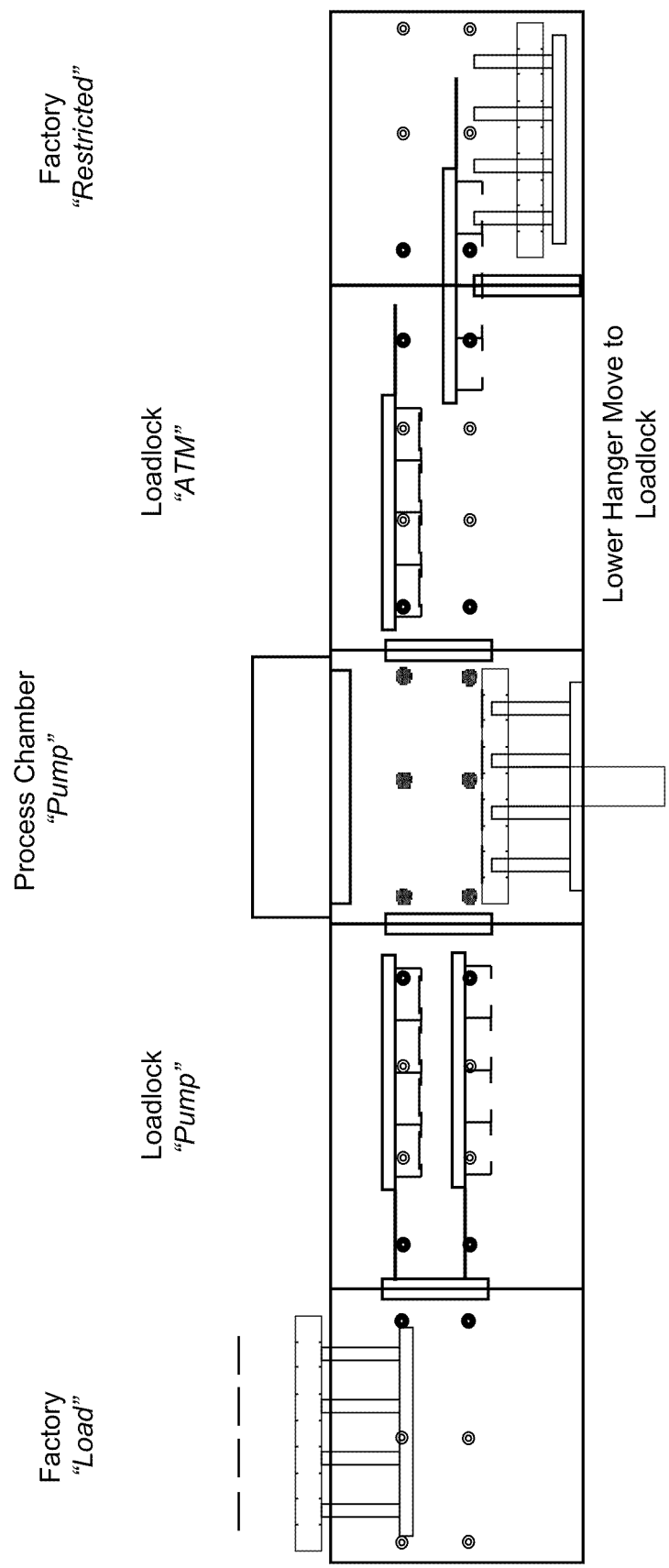
Figure 4.22

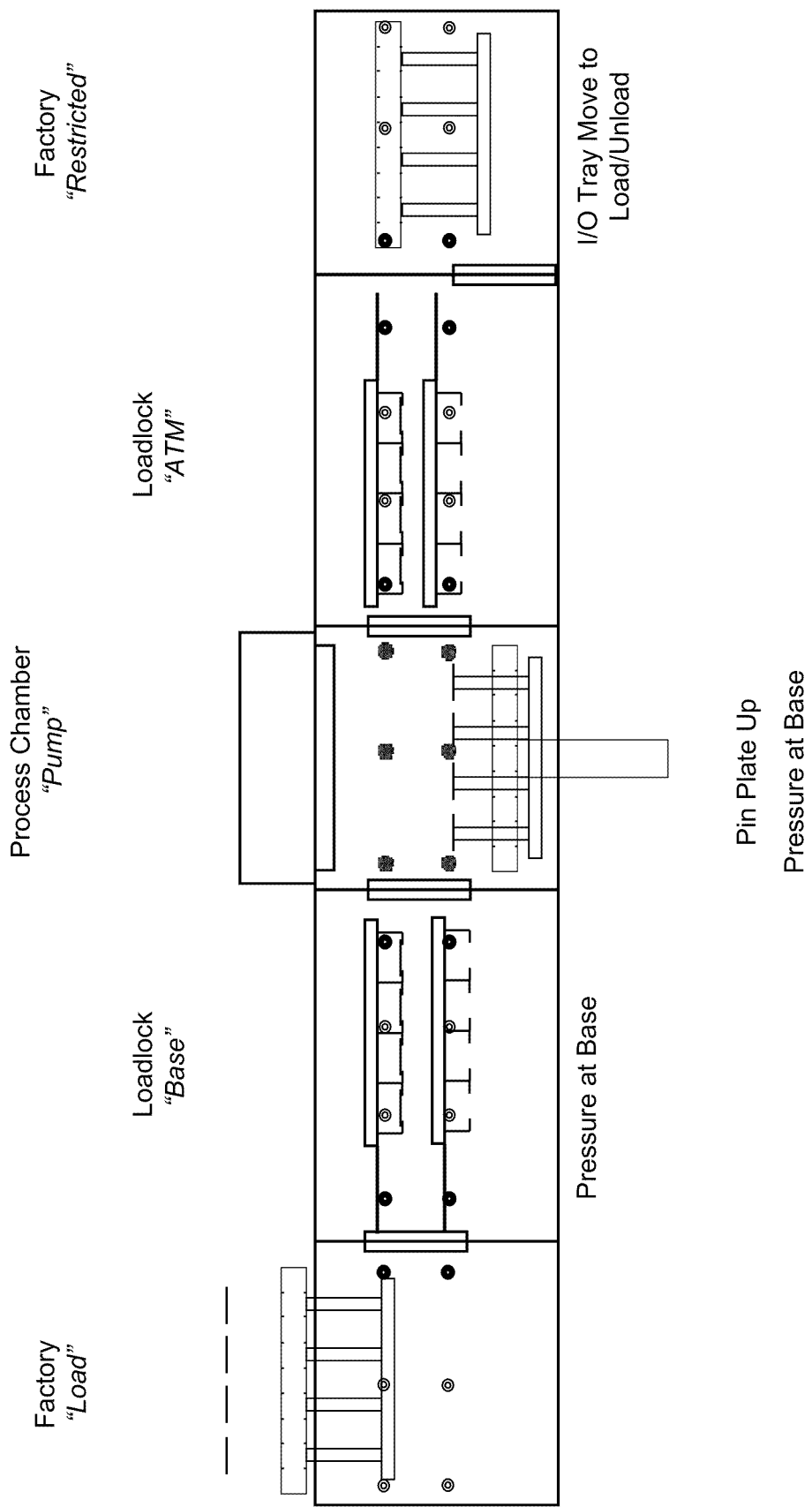
Figure 4.23

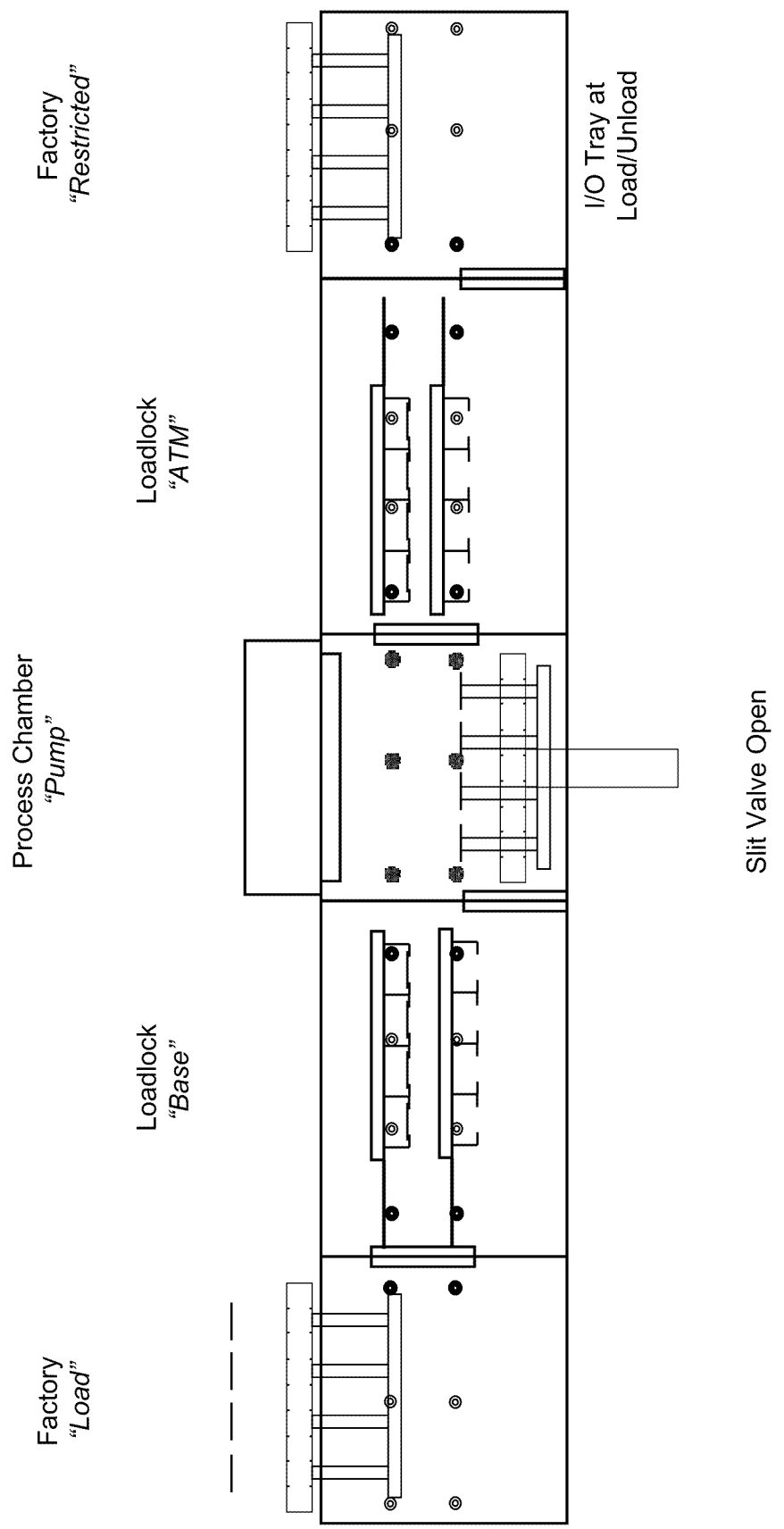
Figure 4.24

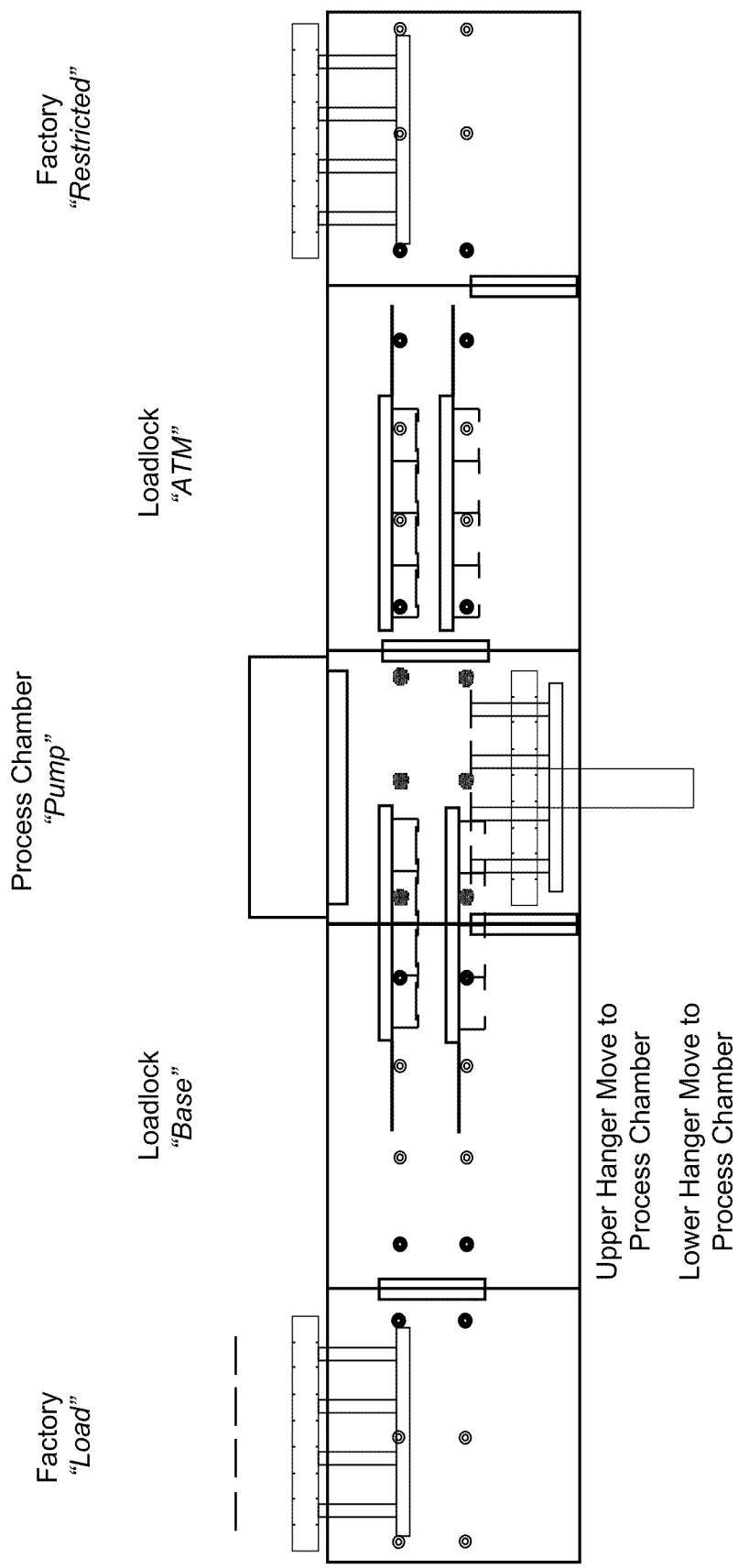
Figure 4.25

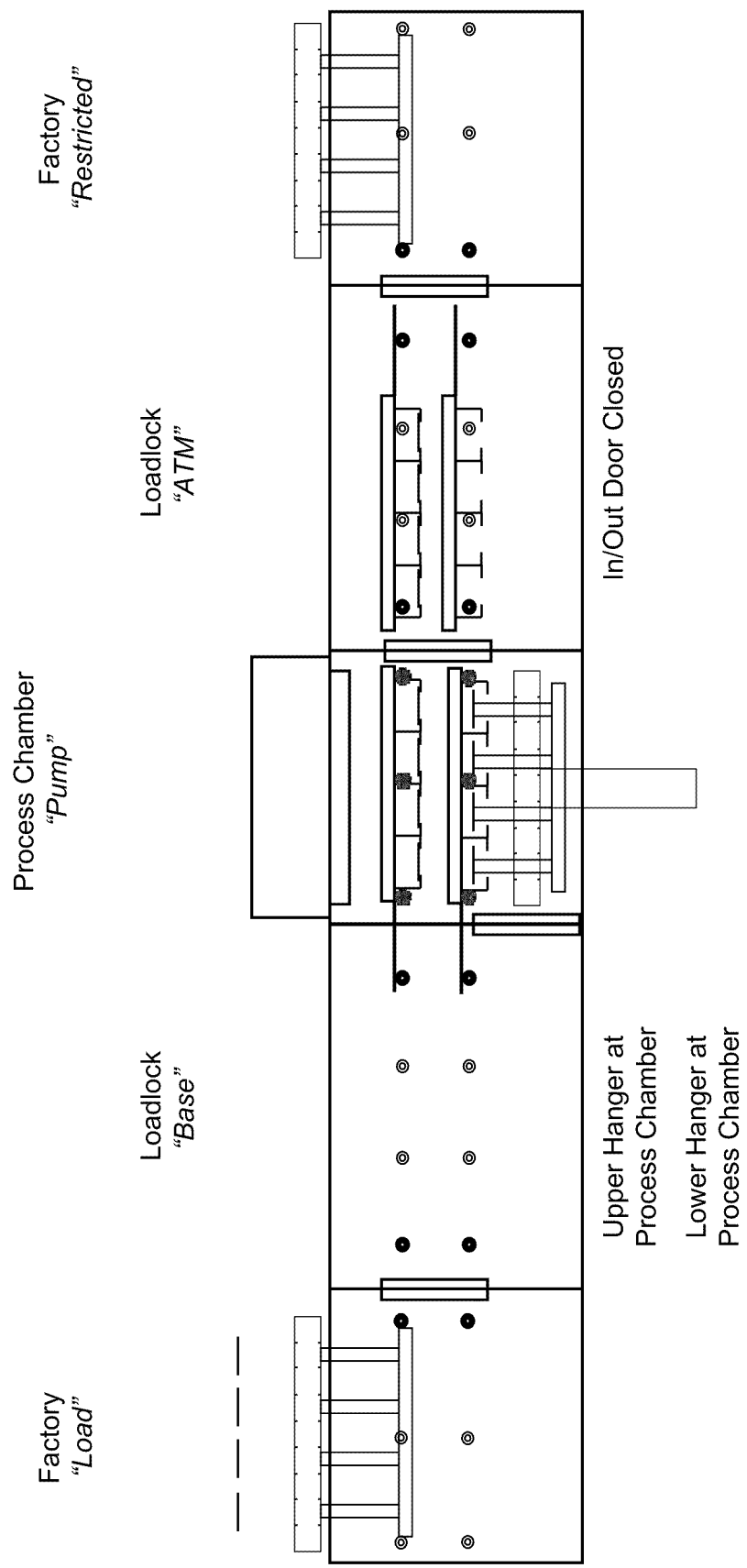
Figure 4.26

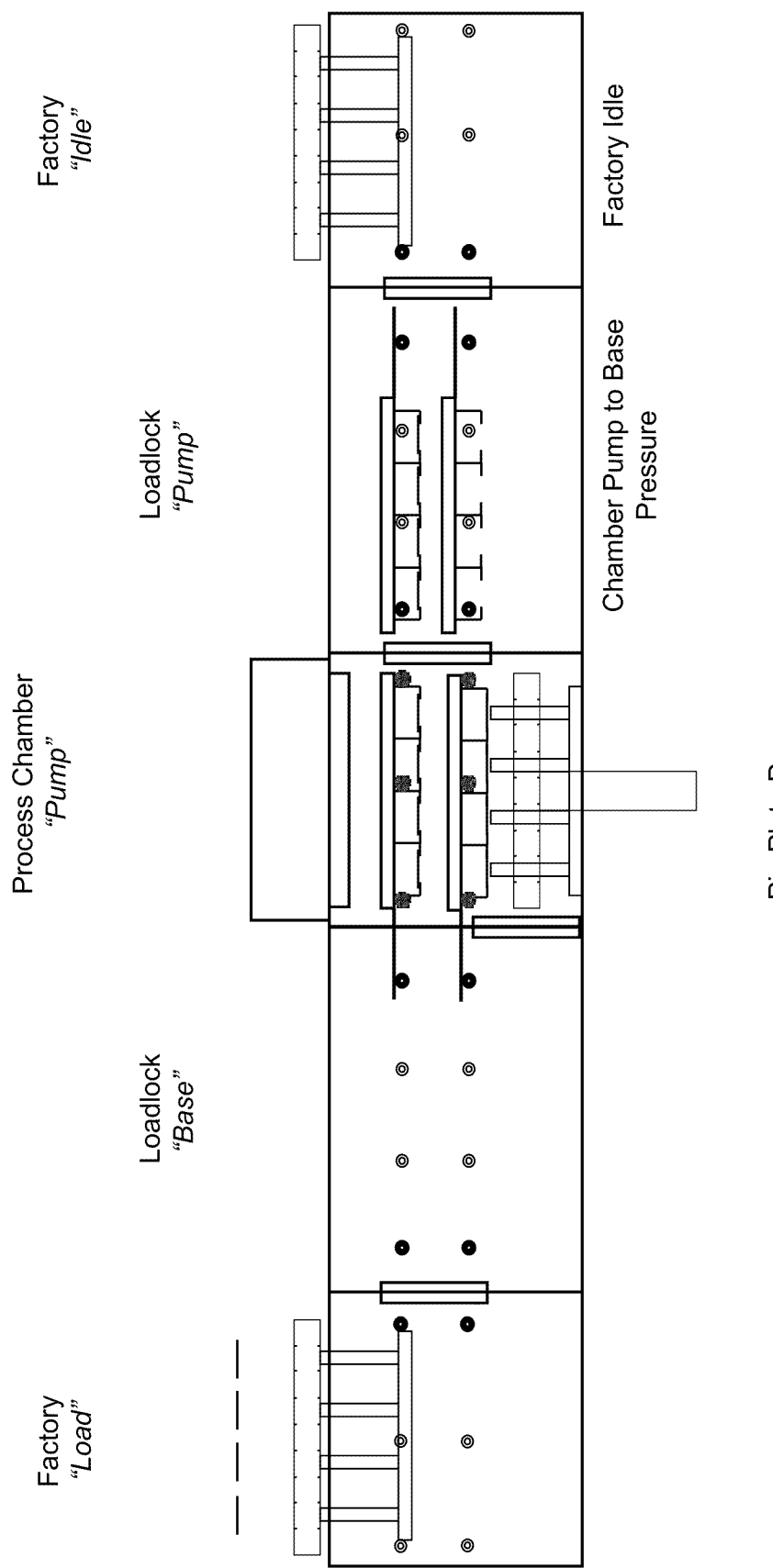
Figure 4.27

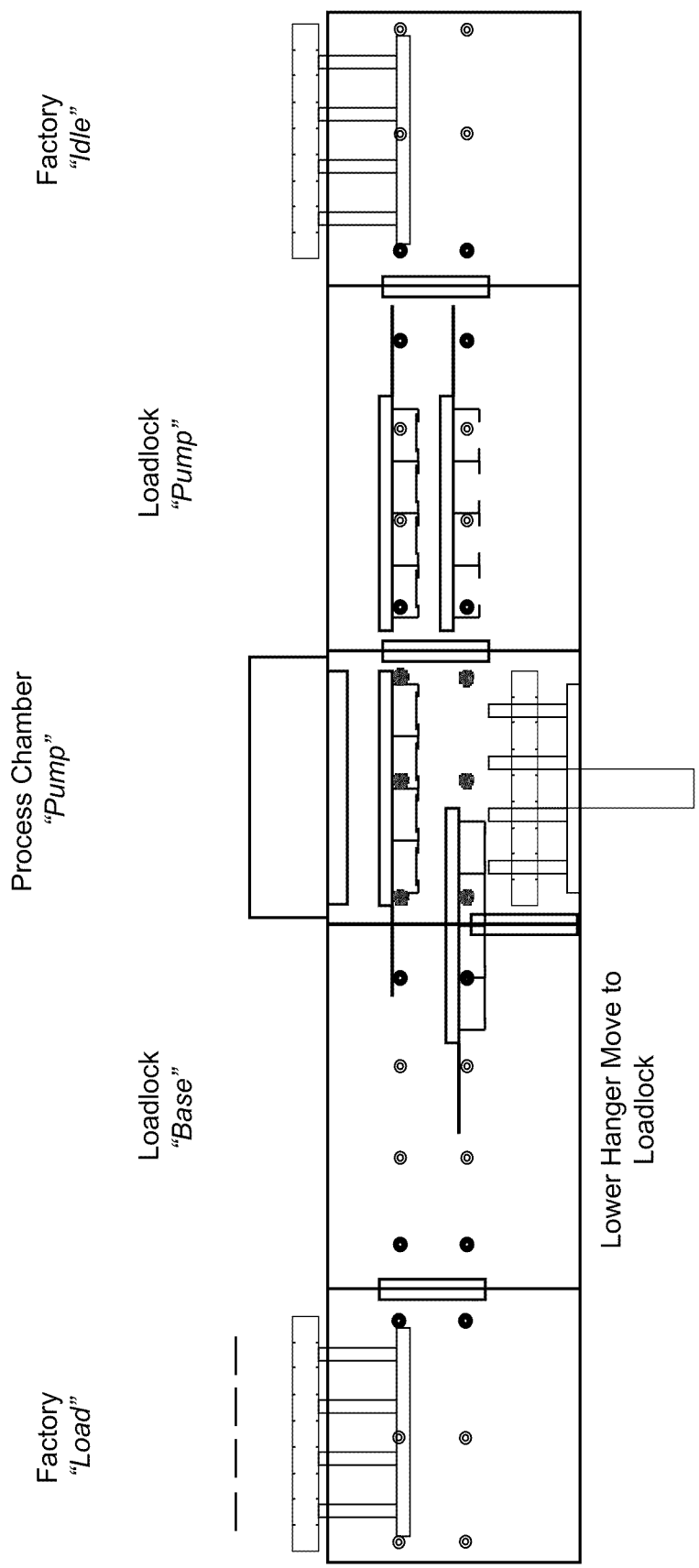
*Figure 4.28*

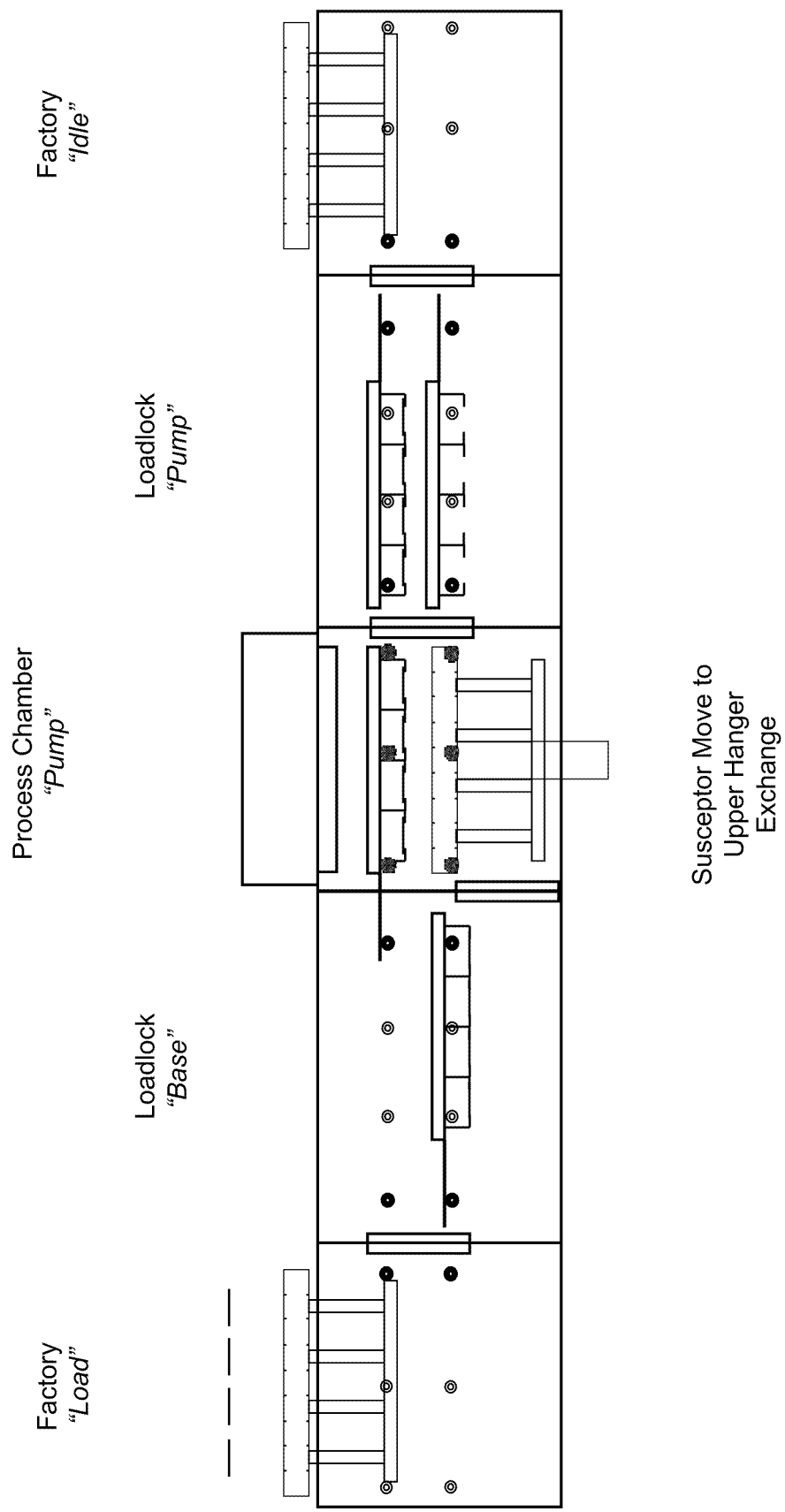
Figure 4.29

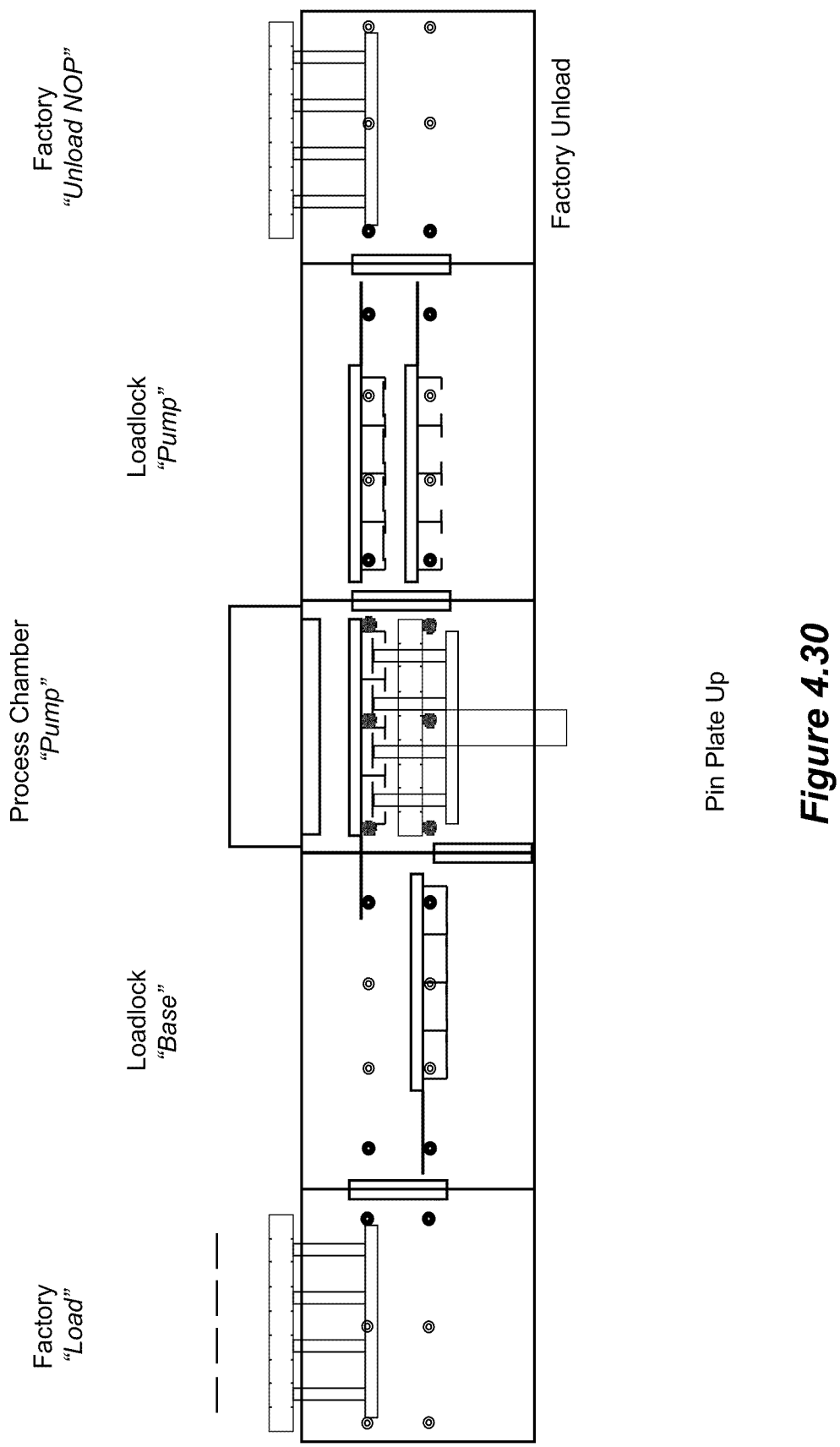
*Figure 4.30*

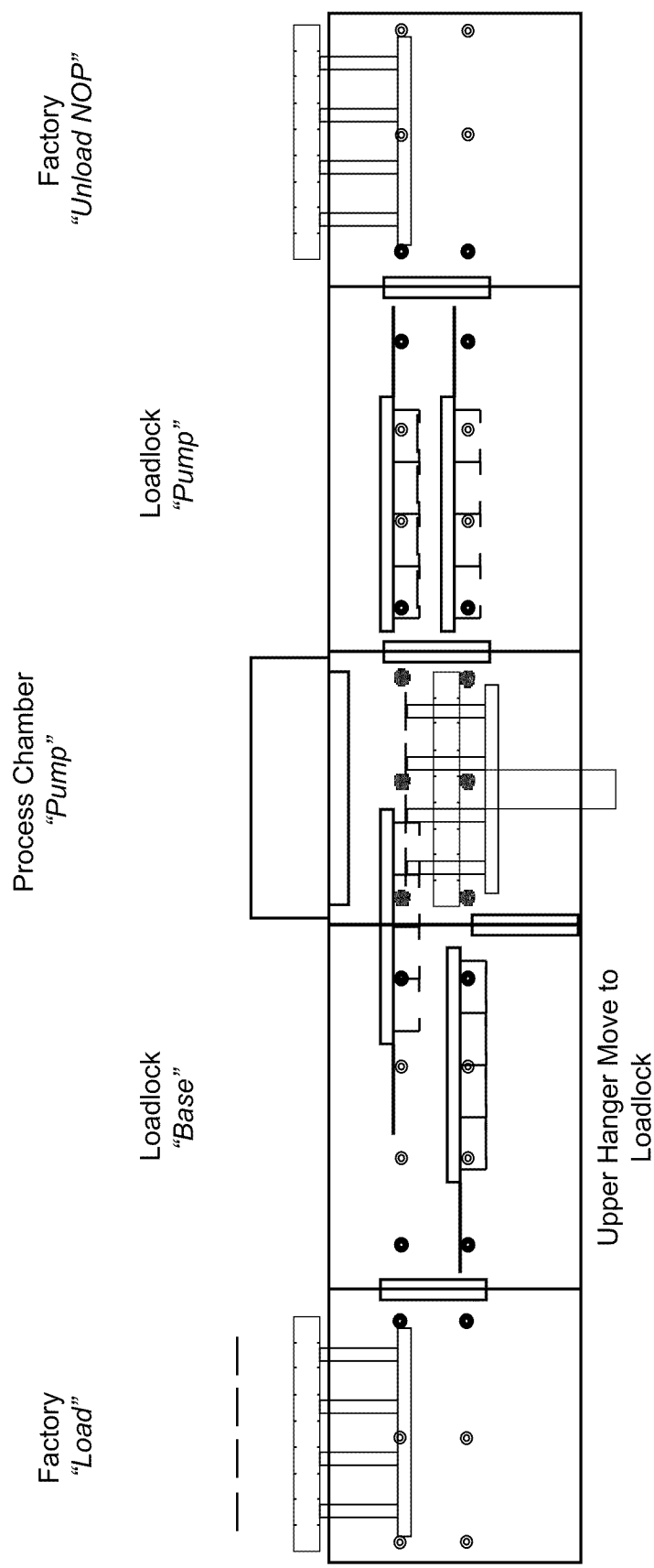
Figure 4.31

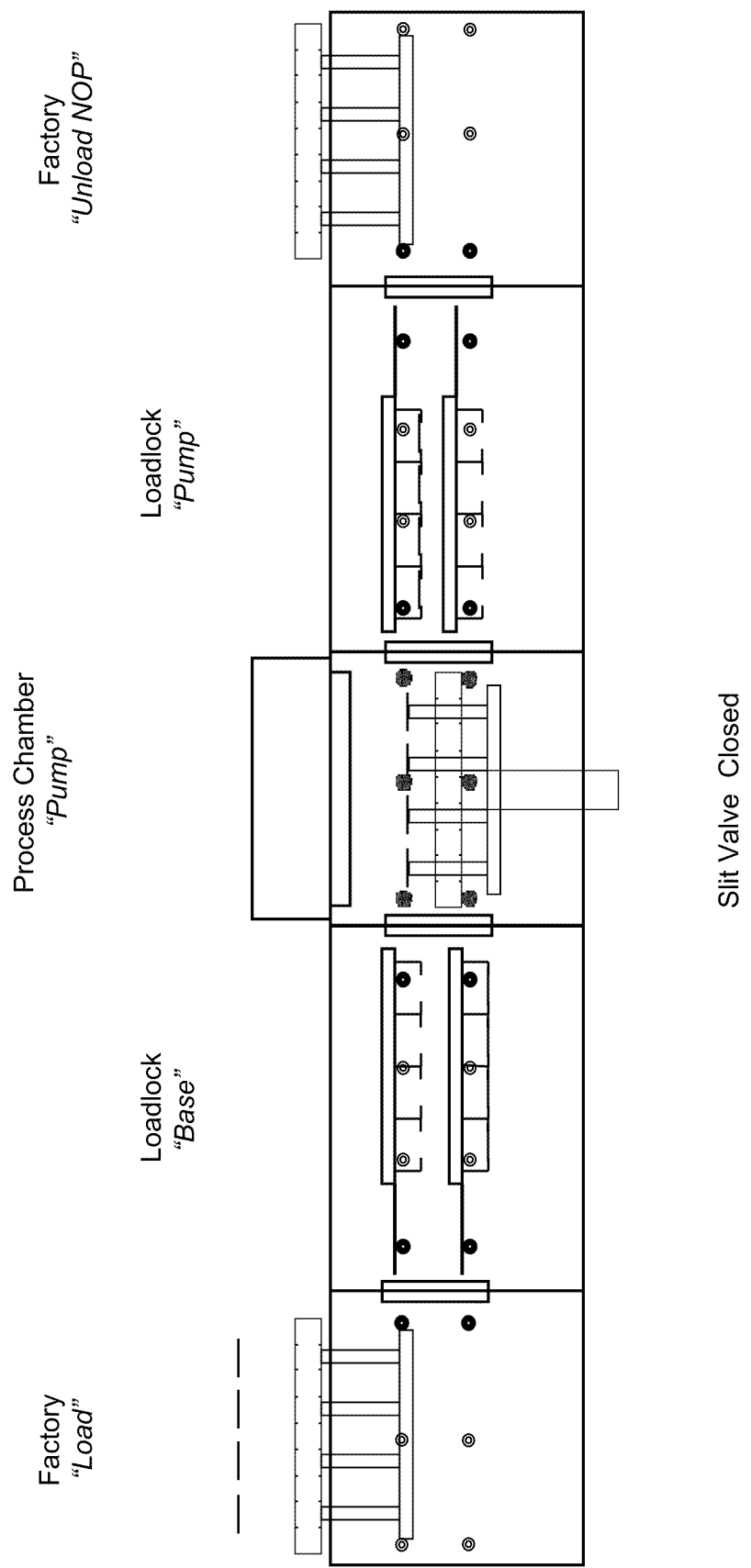
Figure 4.32

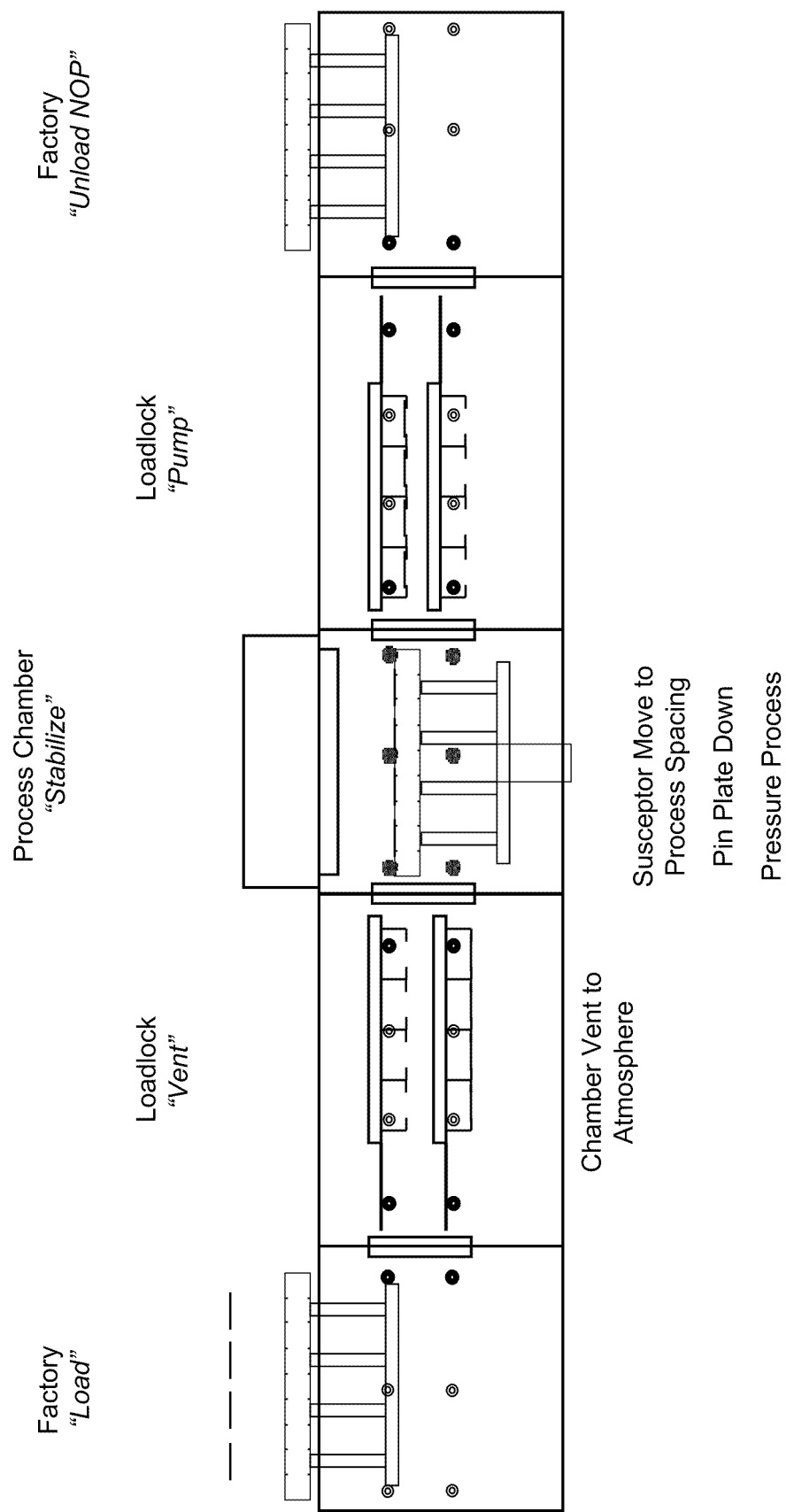
*Figure 4.33*

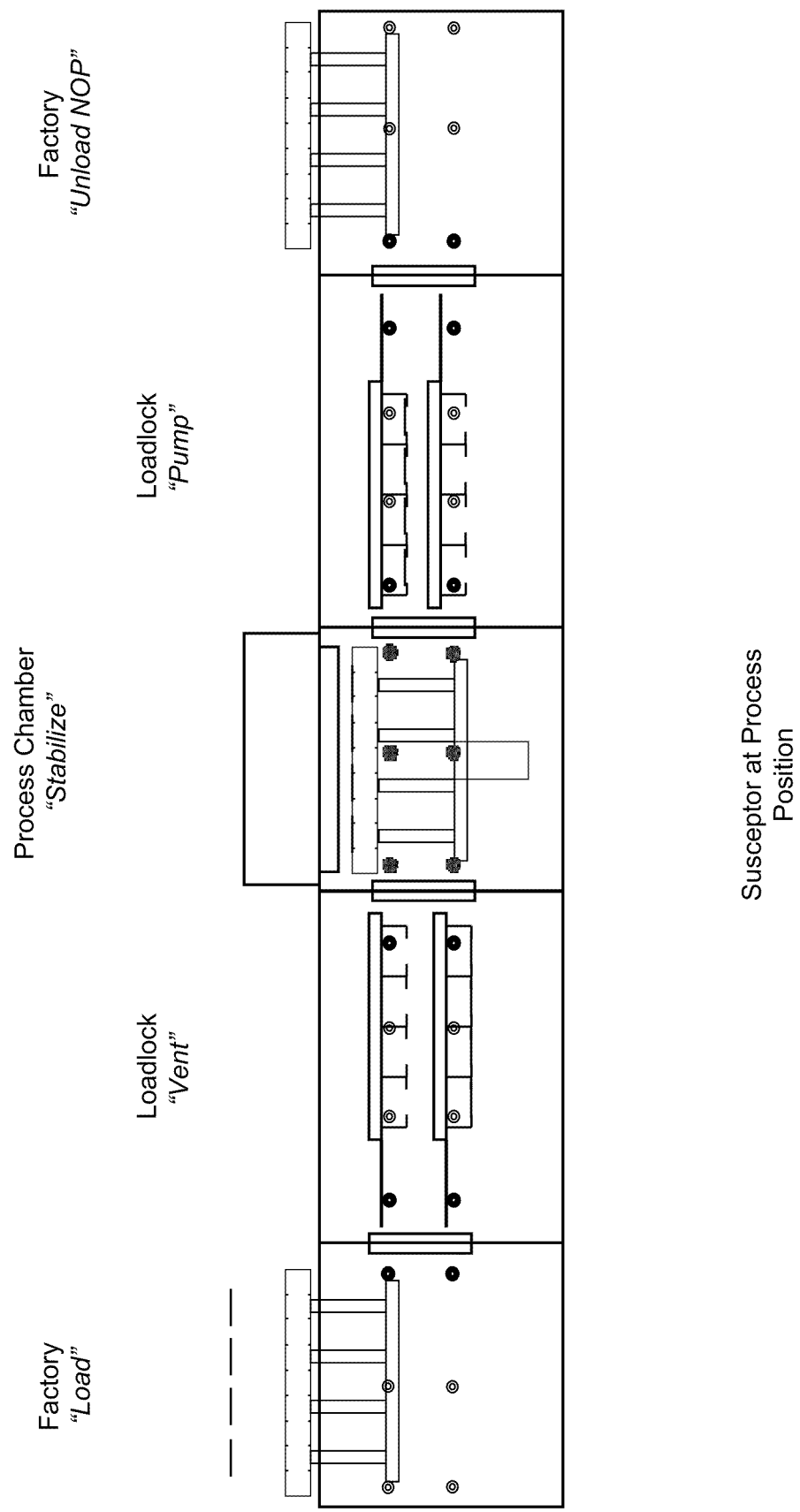
Figure 4.34

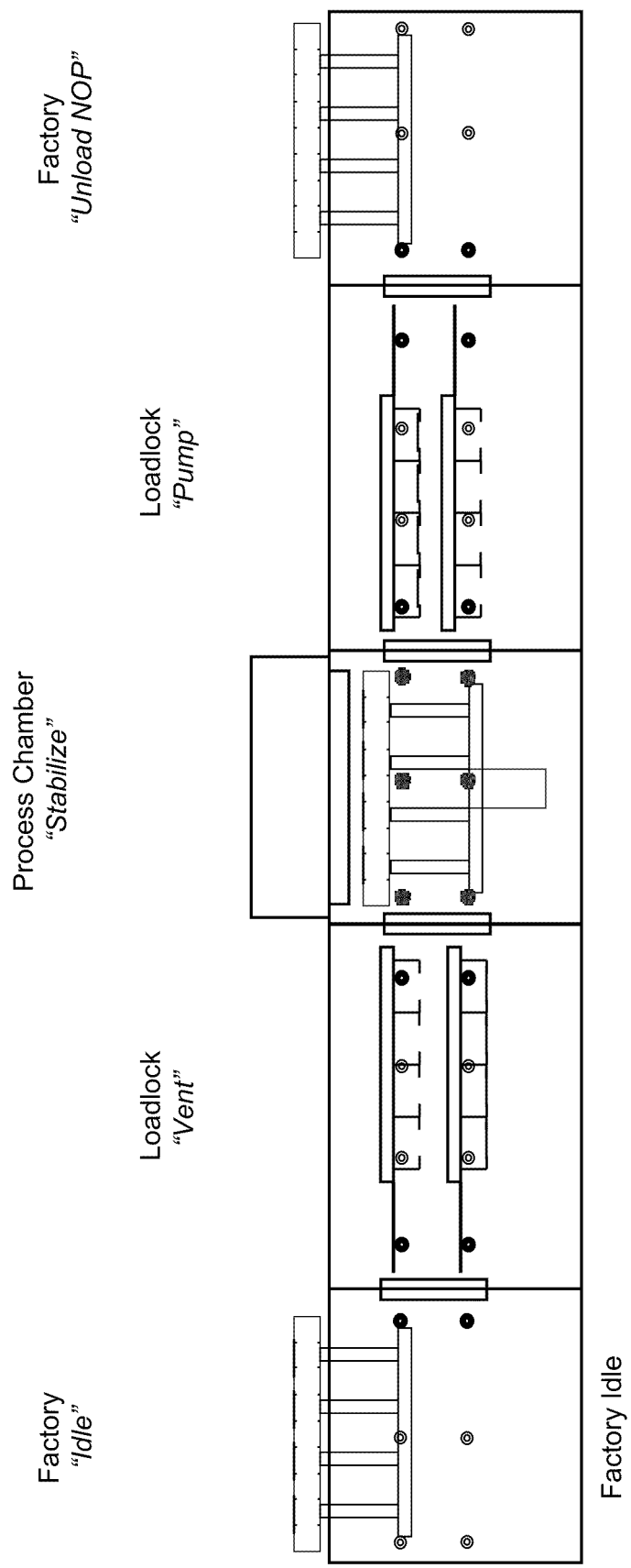
*Figure 4.35*

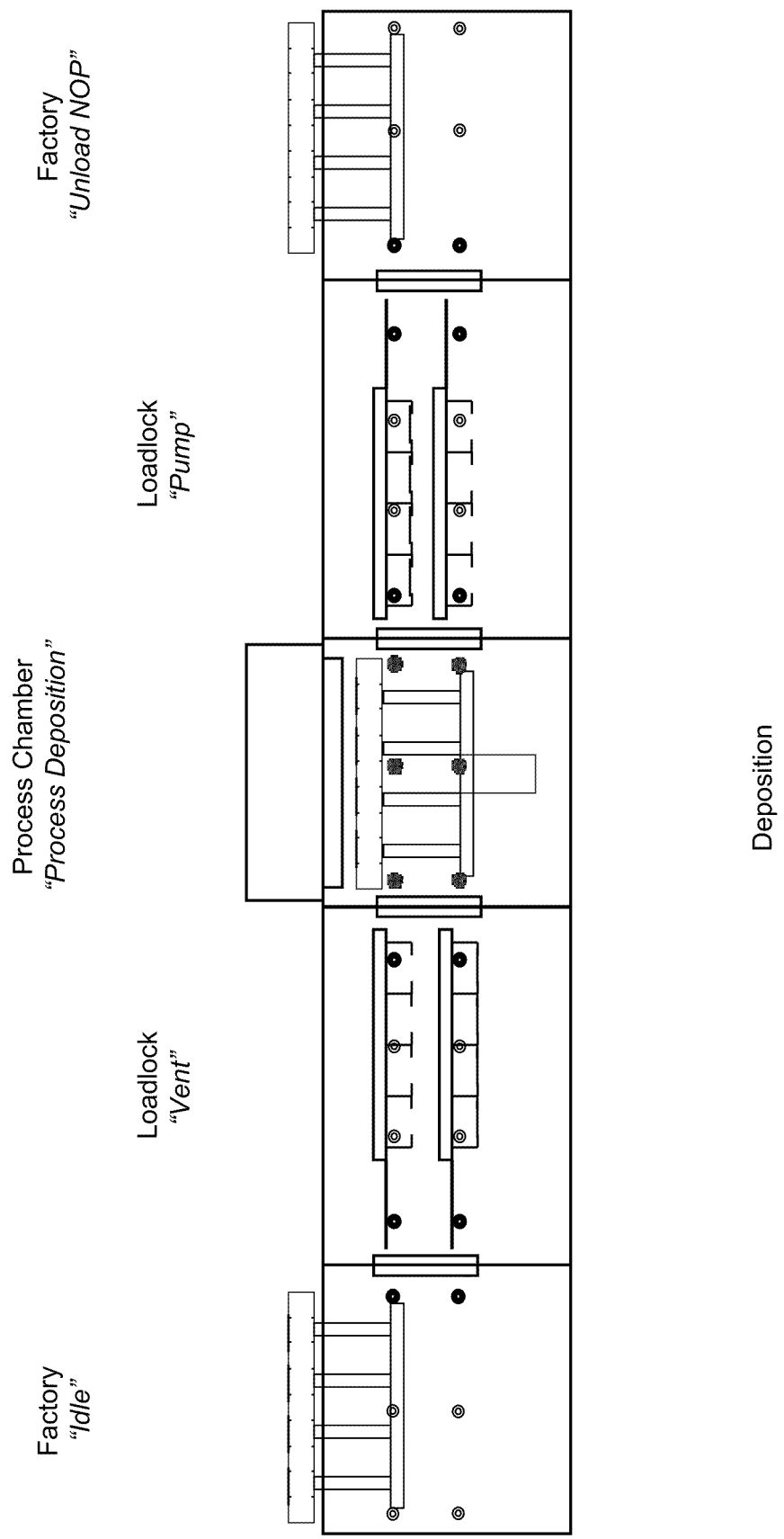
Figure 4.36

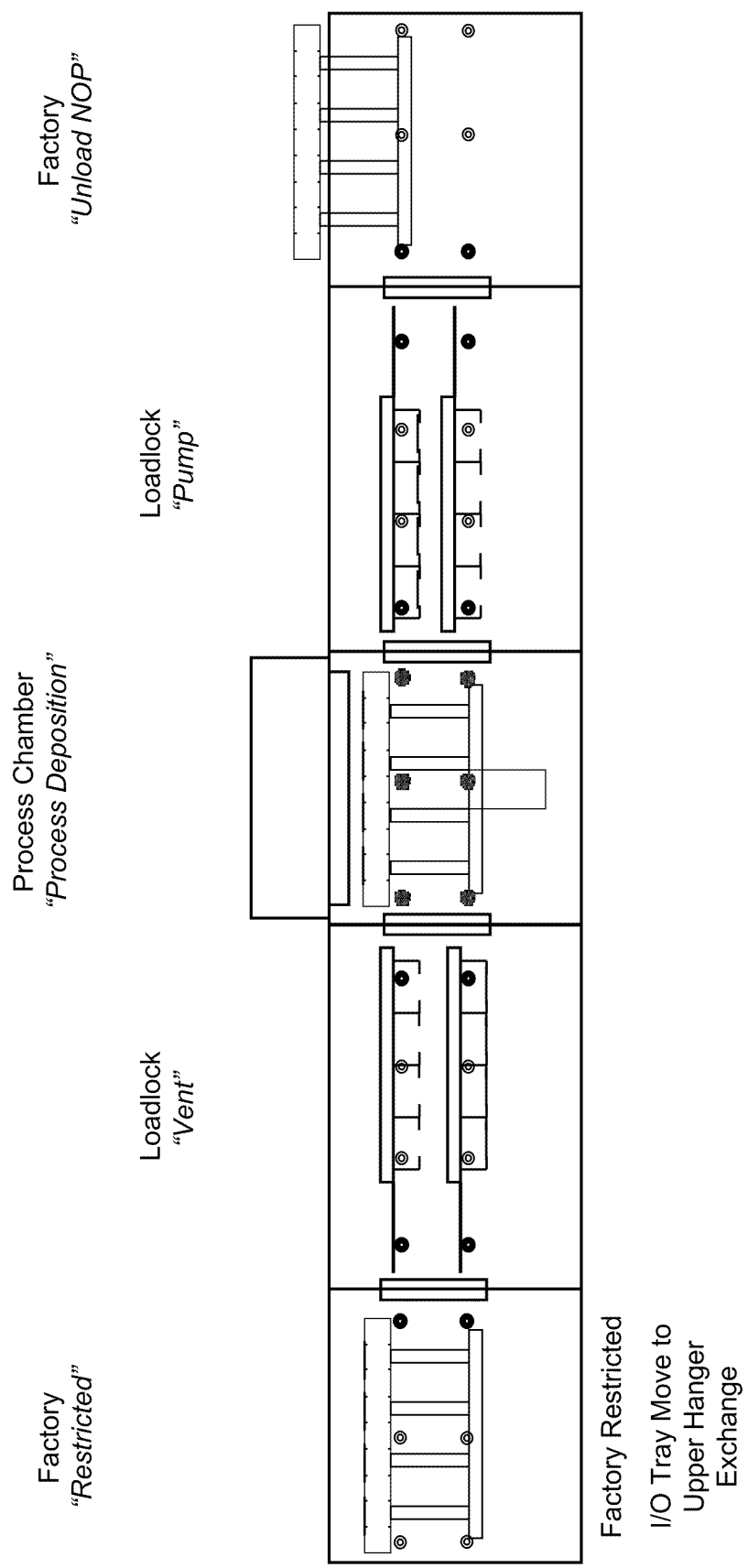
*Figure 4.37*

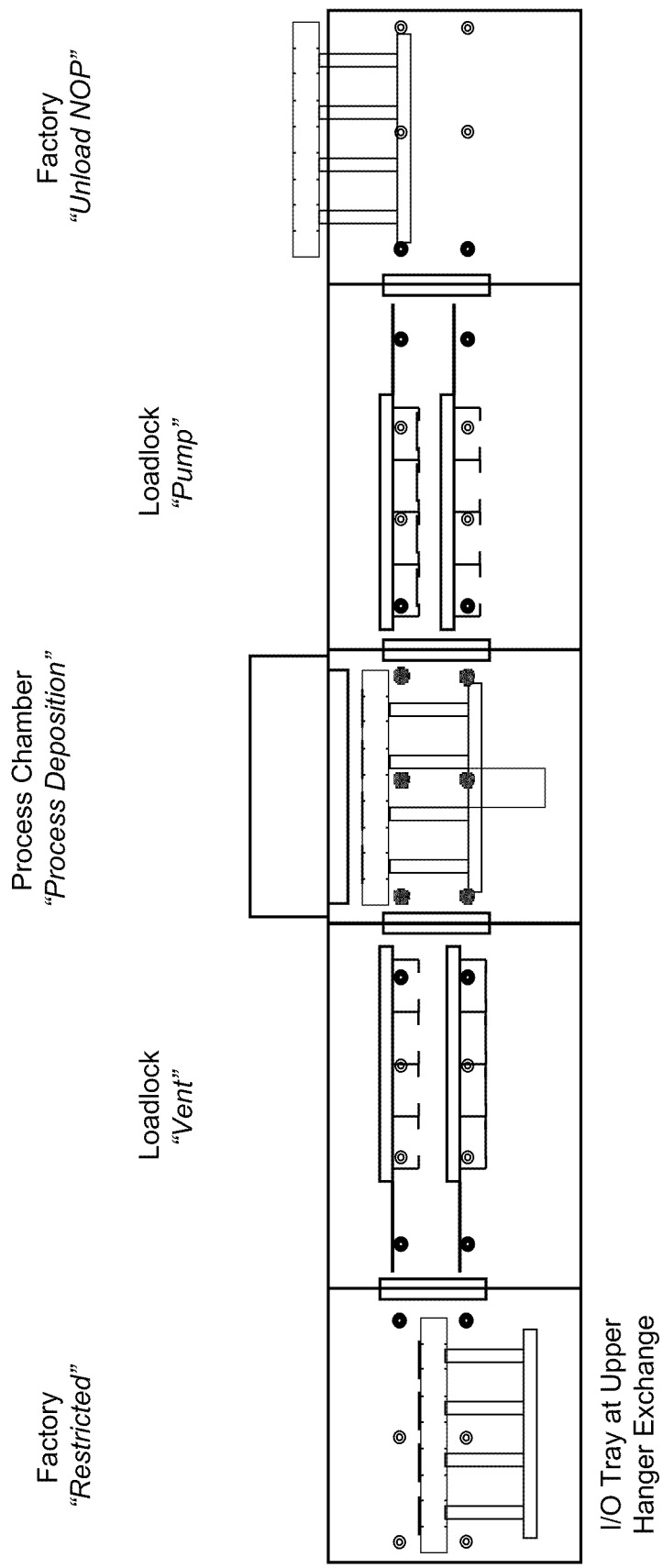
*Figure 4.38*

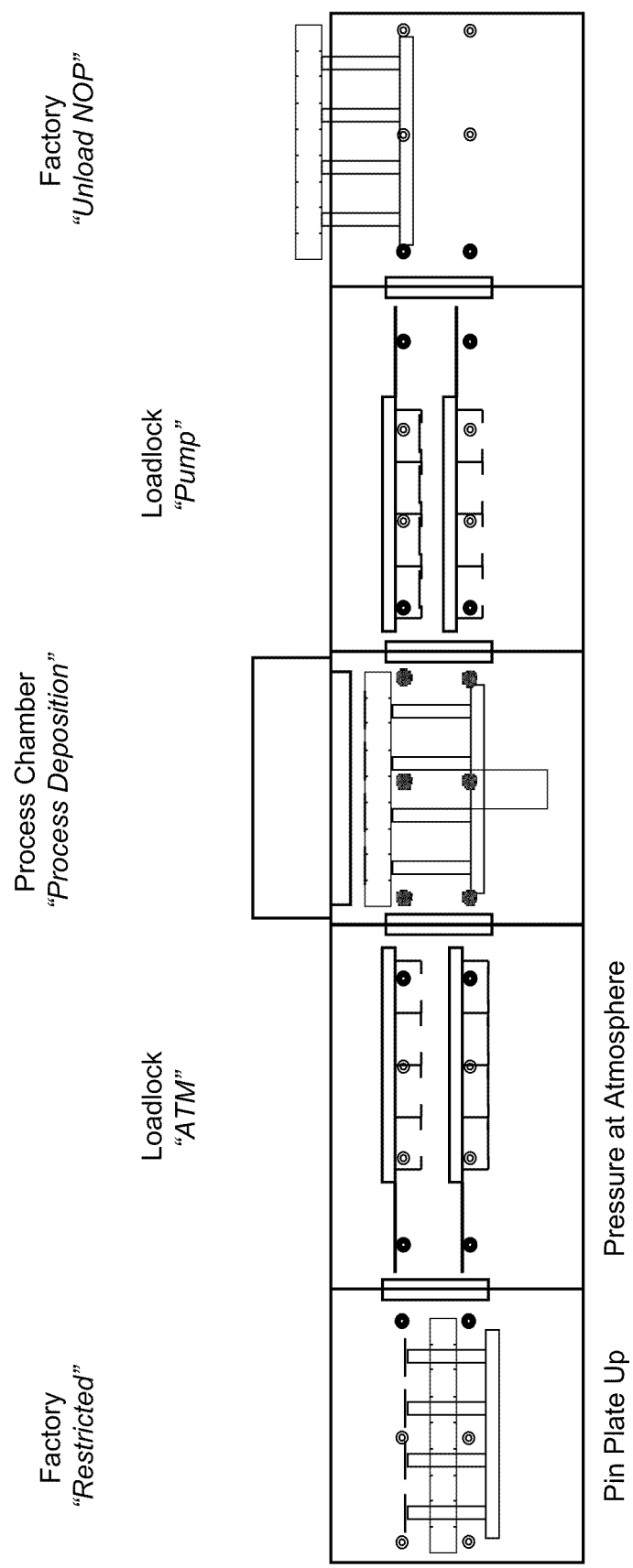
Figure 4.39

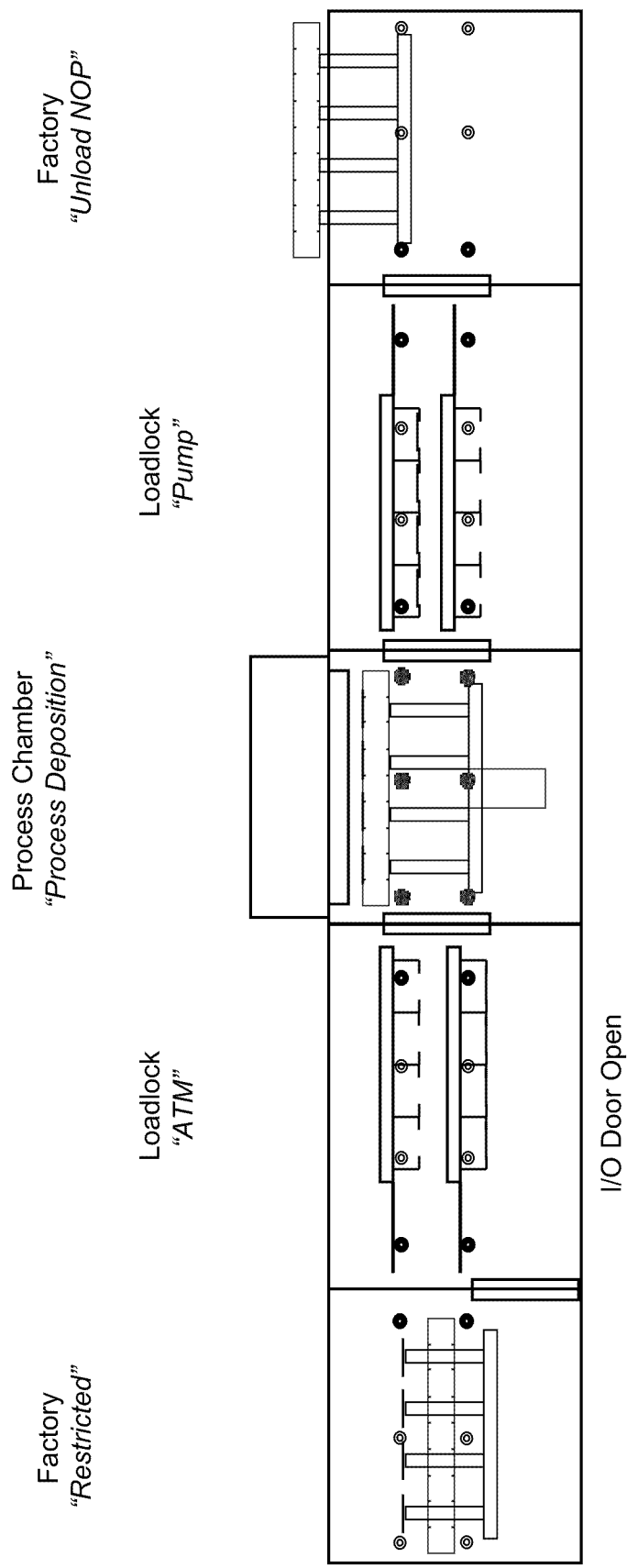
*Figure 4.40*

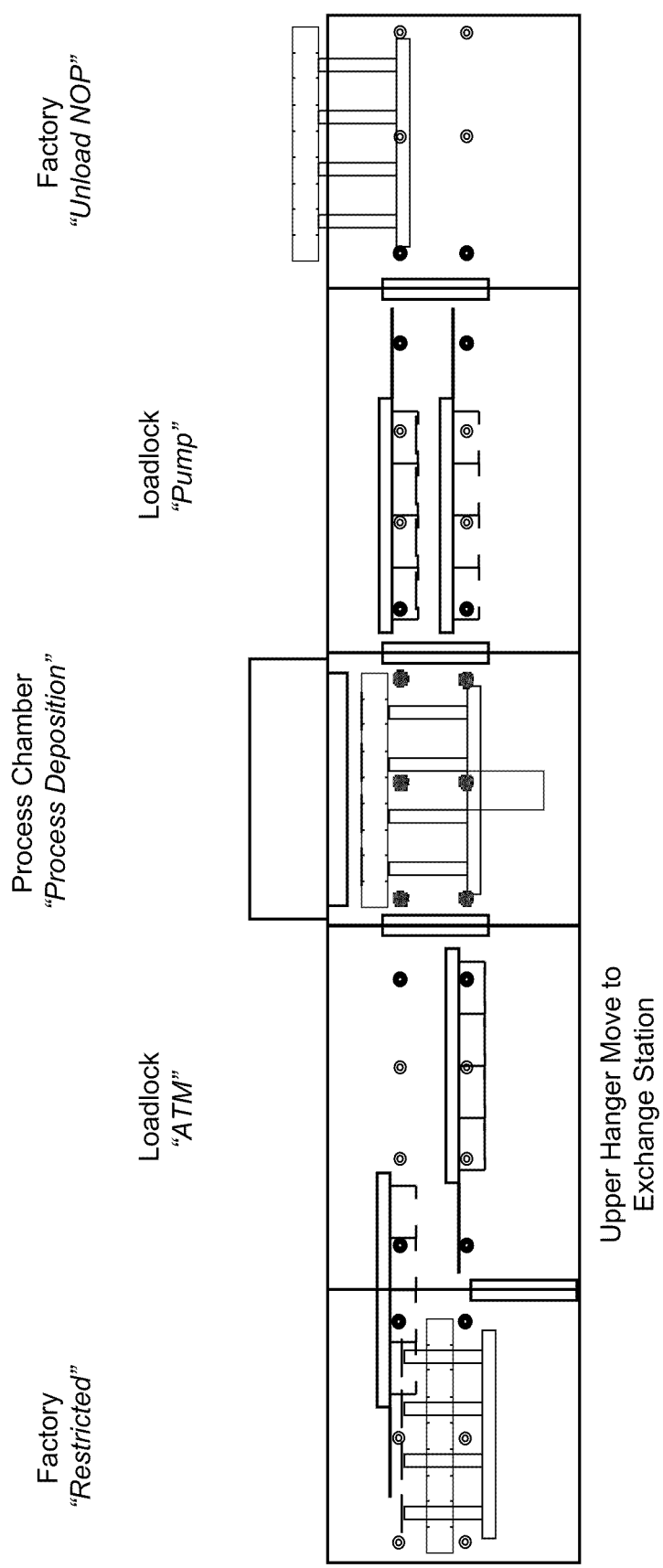
*Figure 4.41*

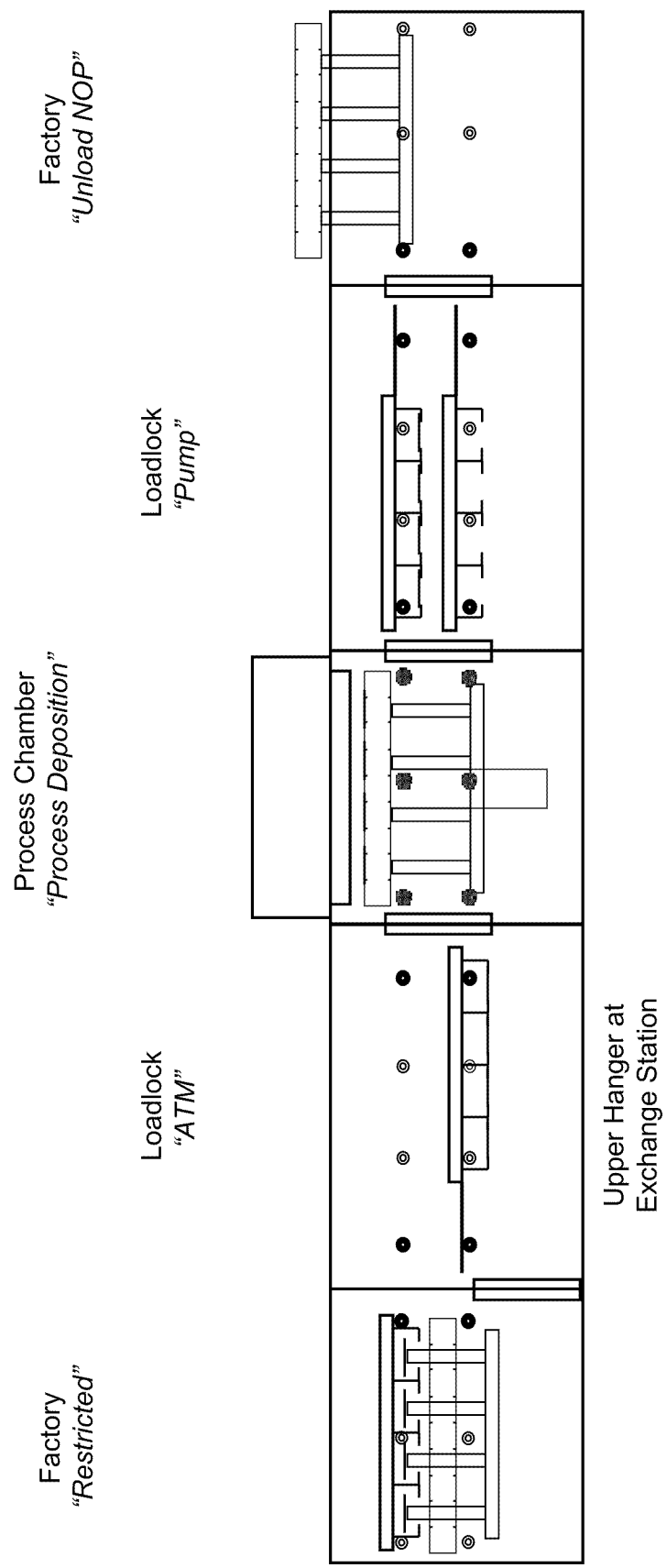
*Figure 4.42*

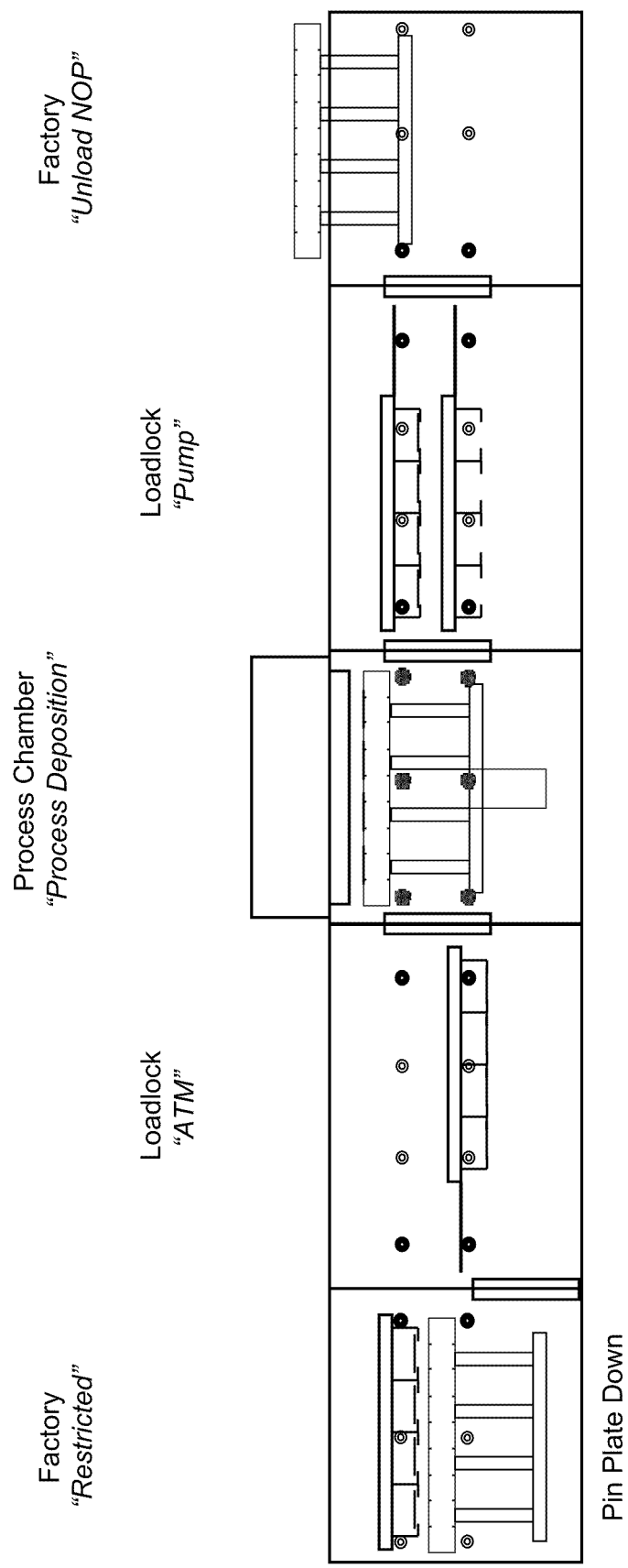
Figure 4.43

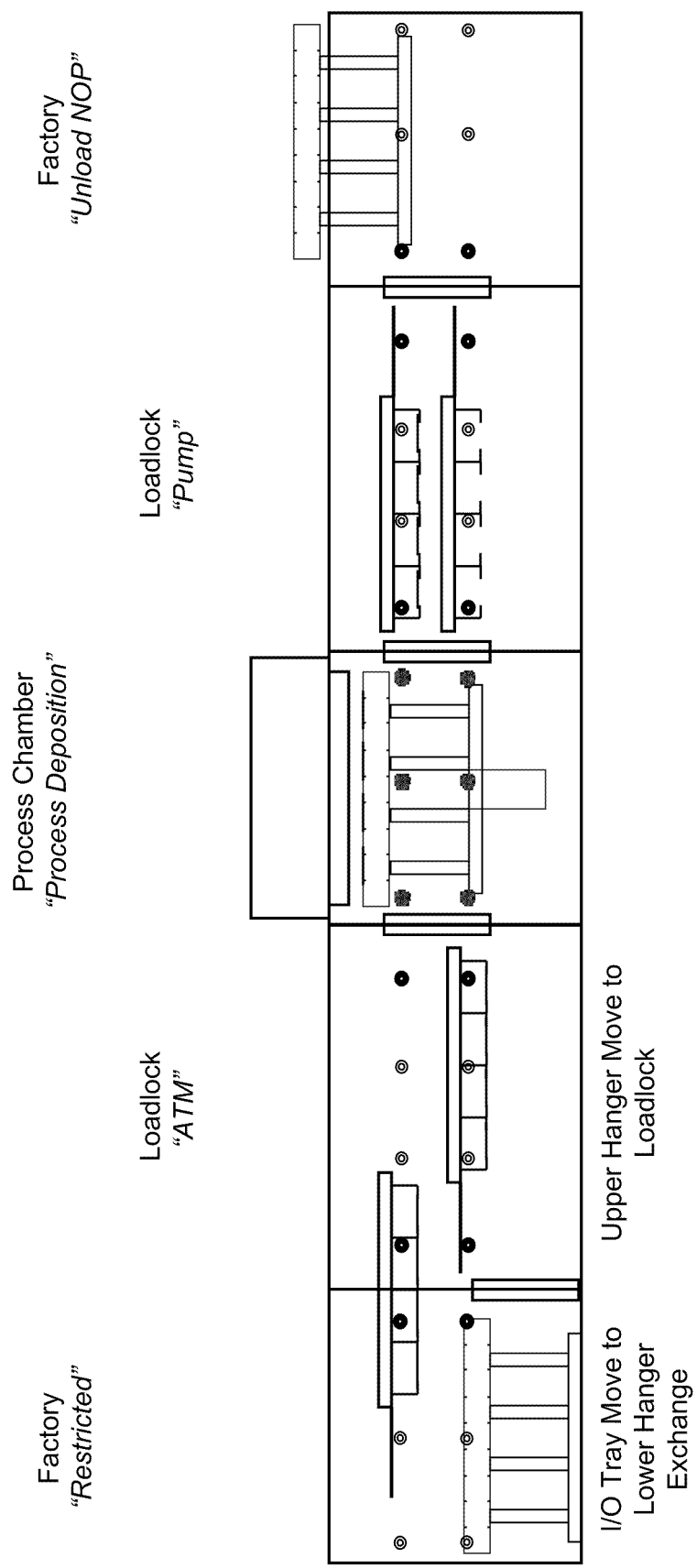
Figure 4.44

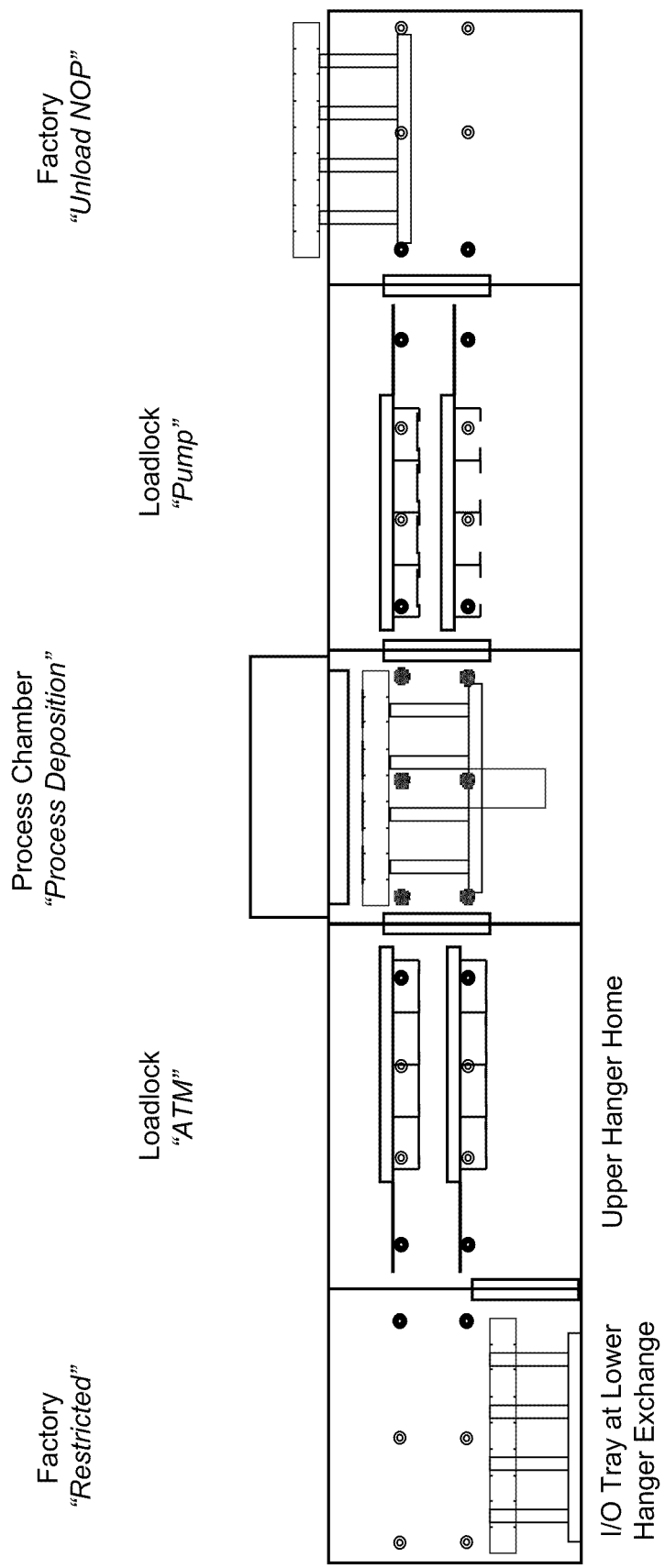
Figure 4.45

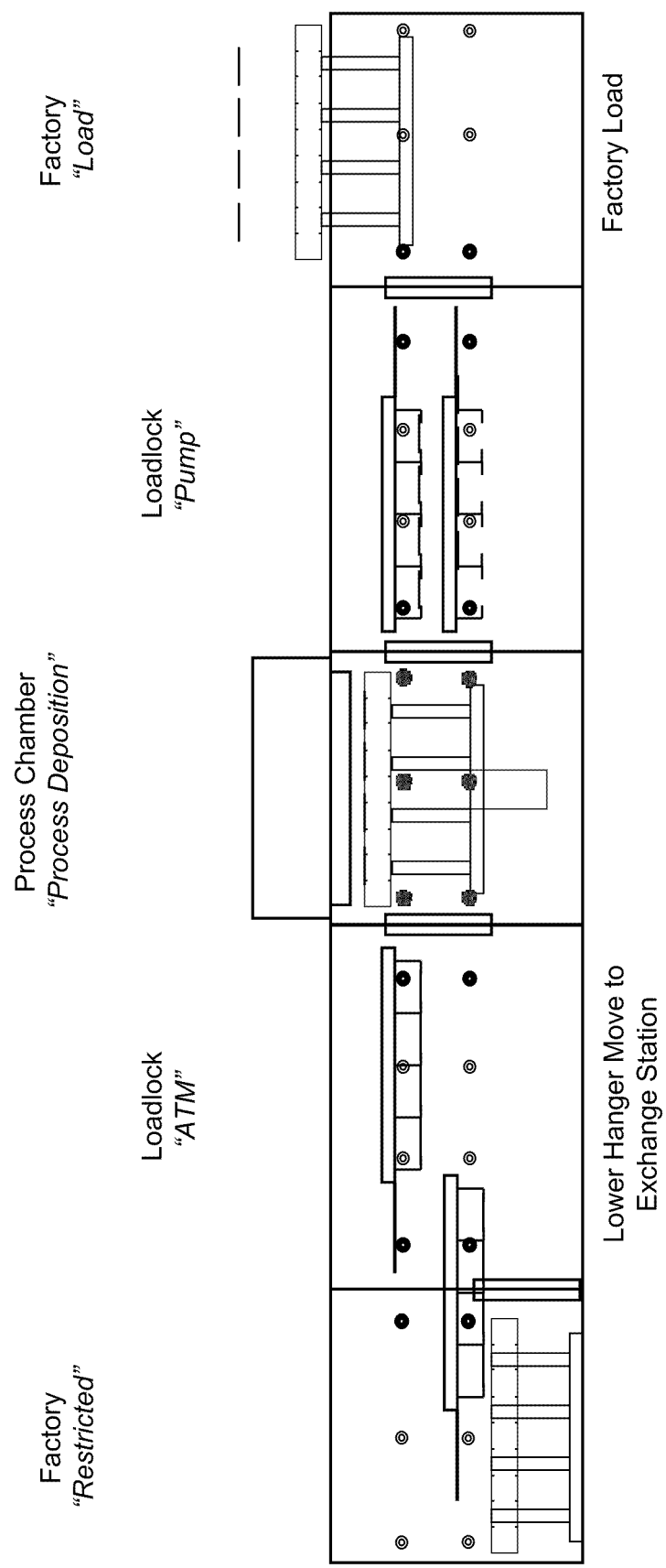
*Figure 4.46*

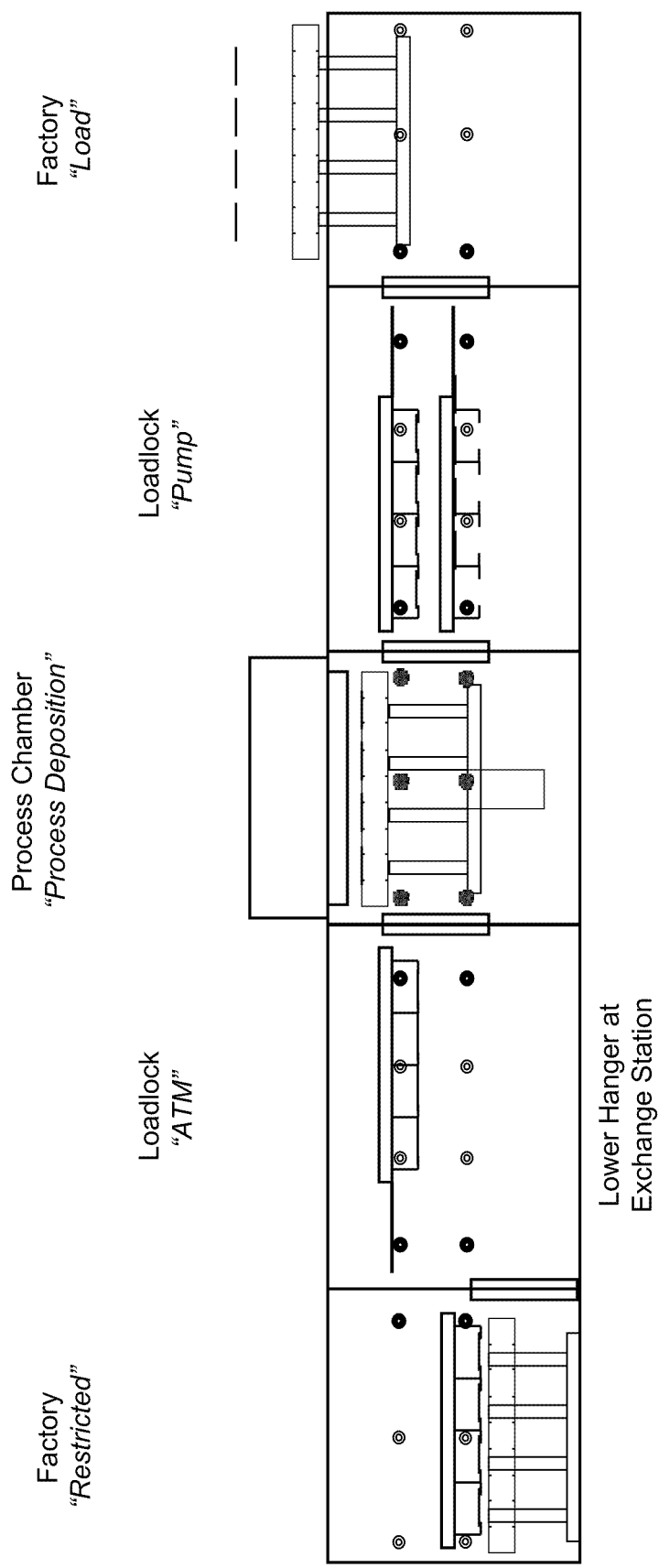
*Figure 4.47*

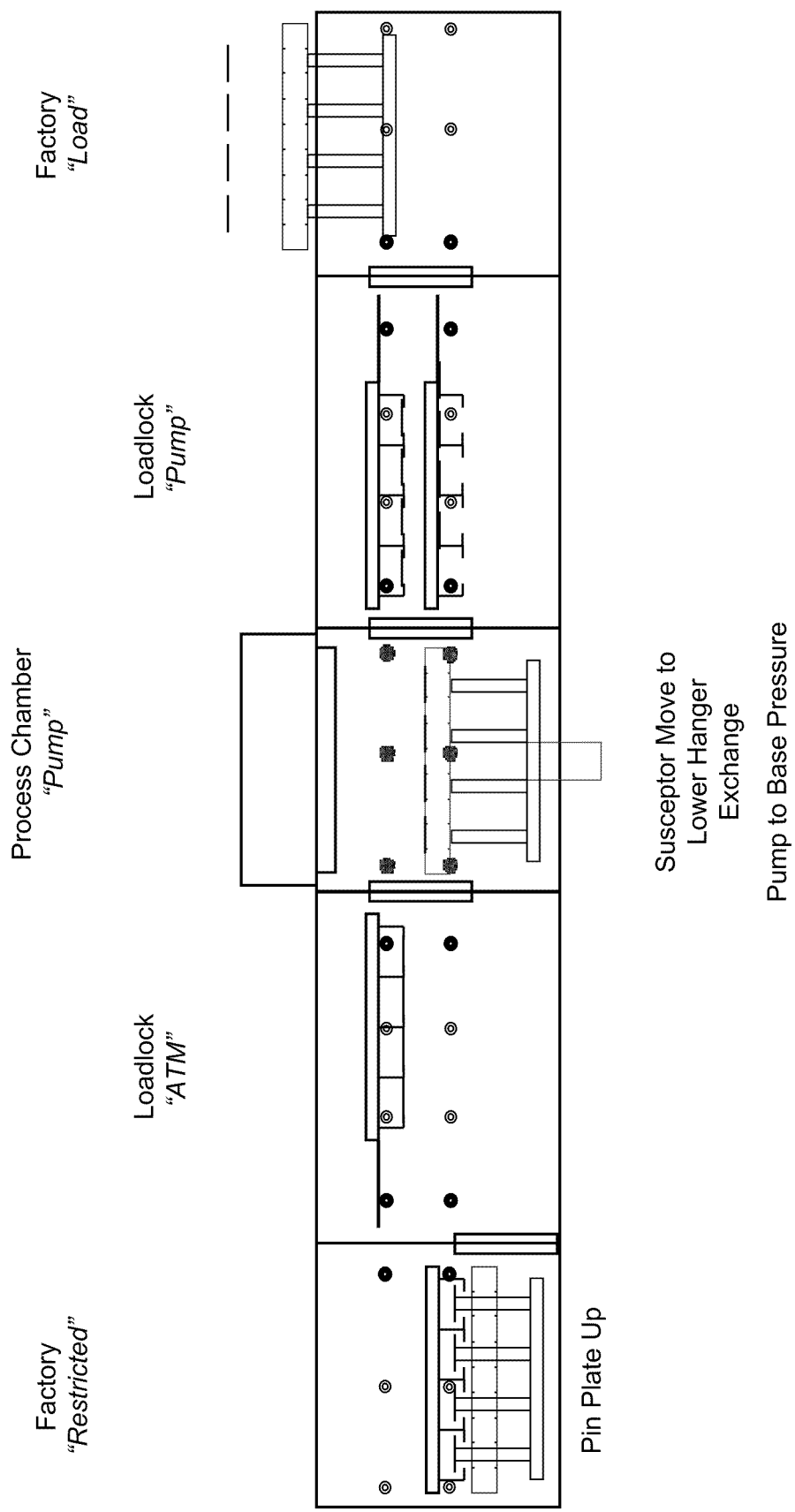
Figure 4.48

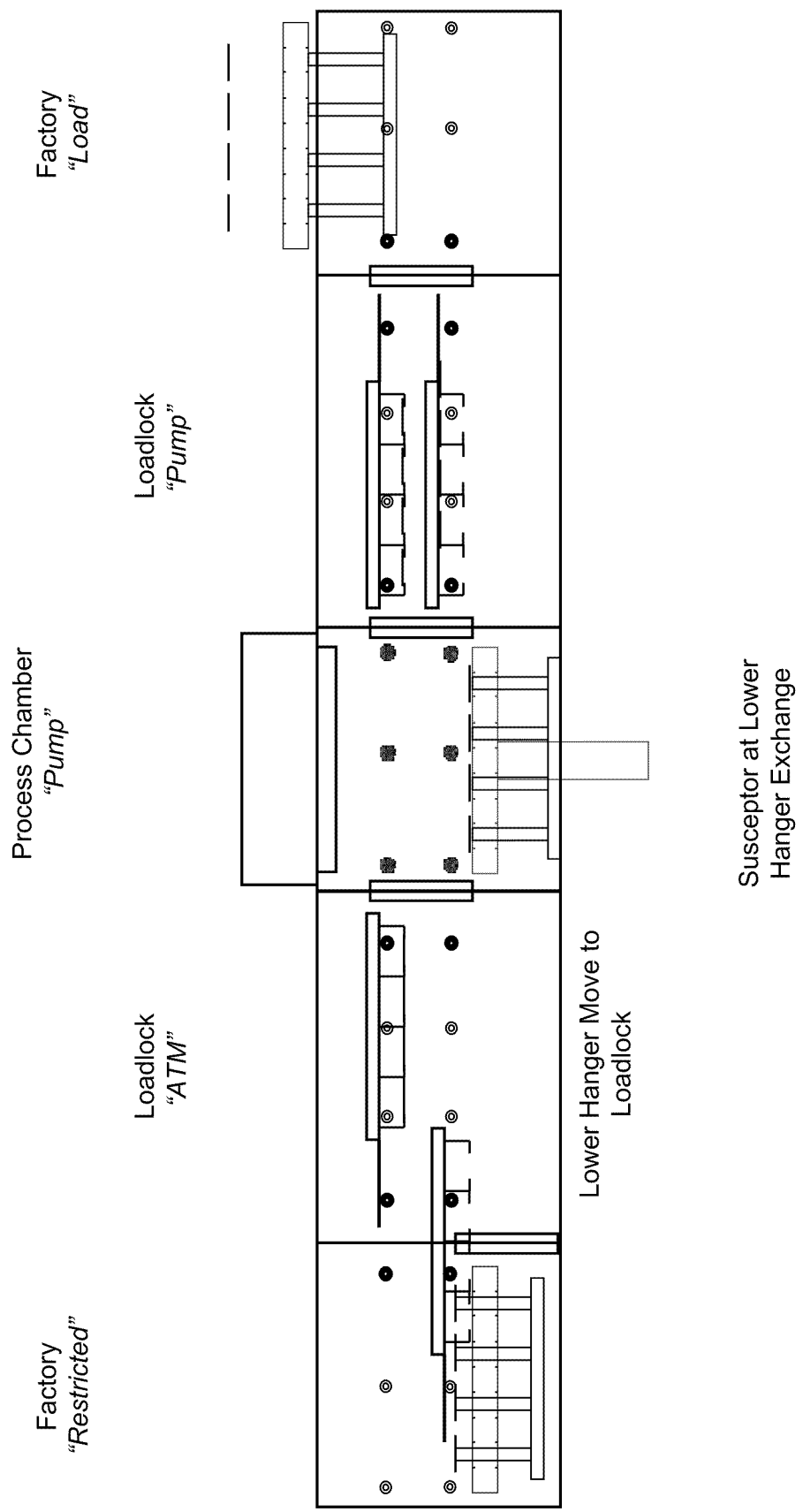
Figure 4.49

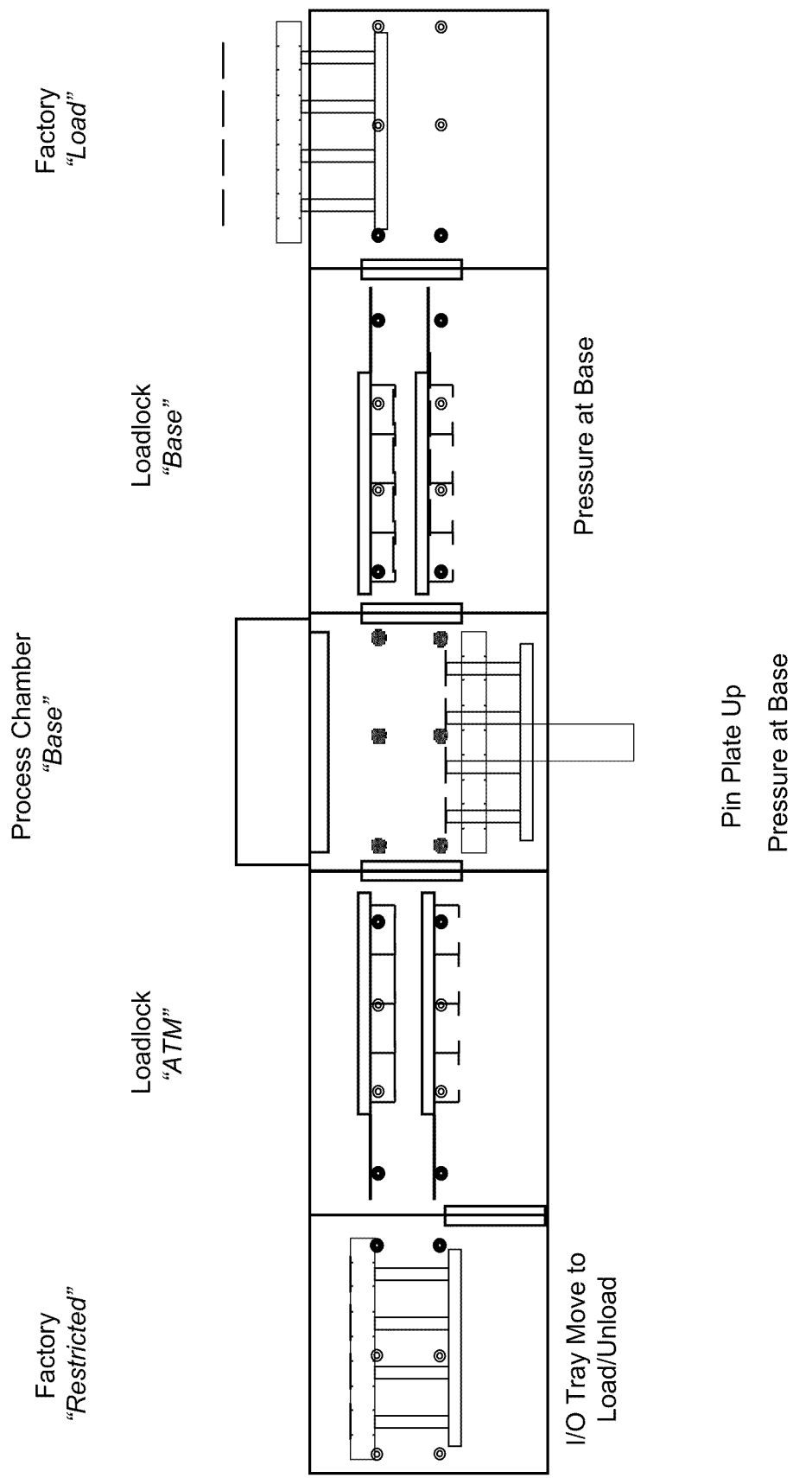
Figure 4.50

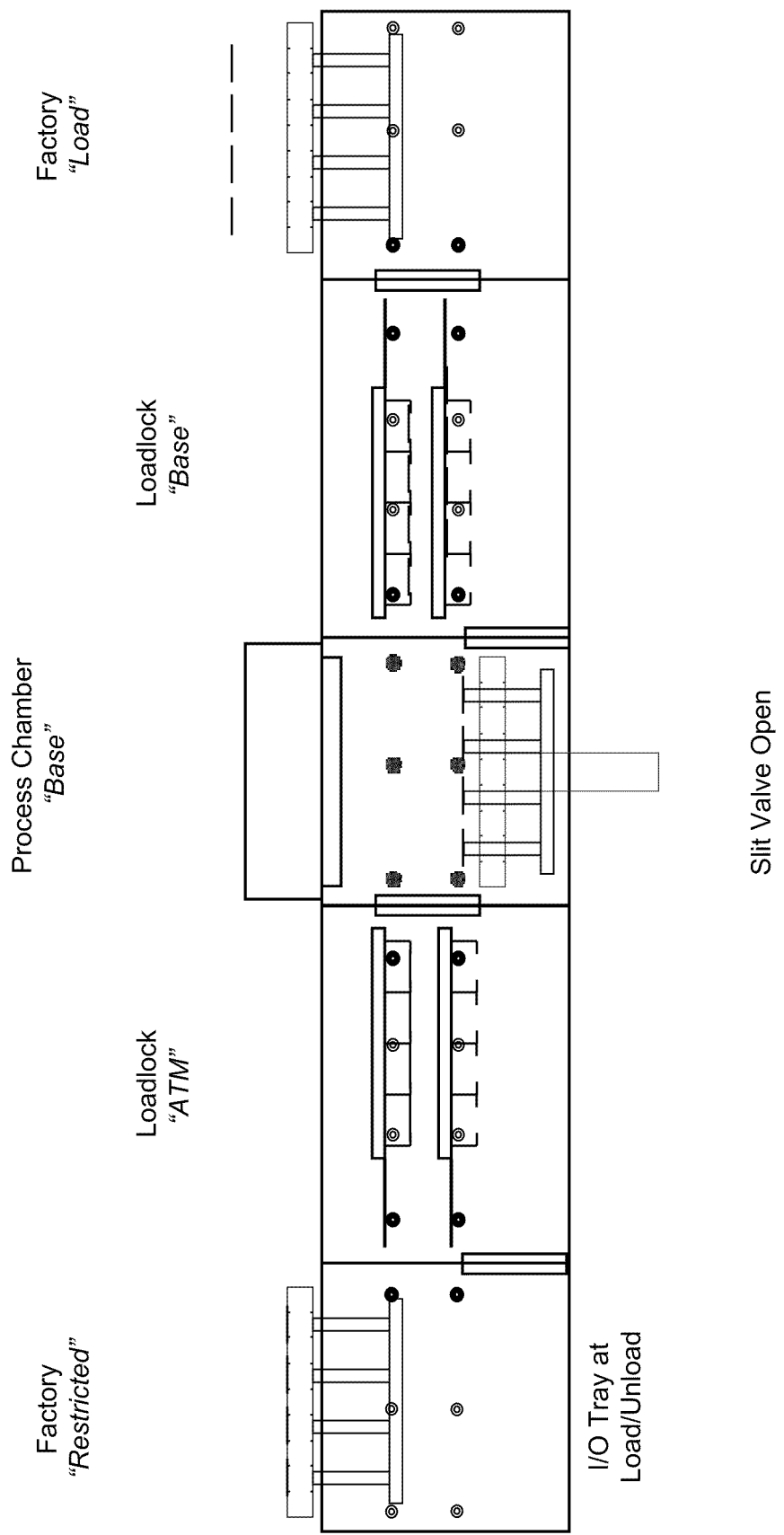
Figure 4.51

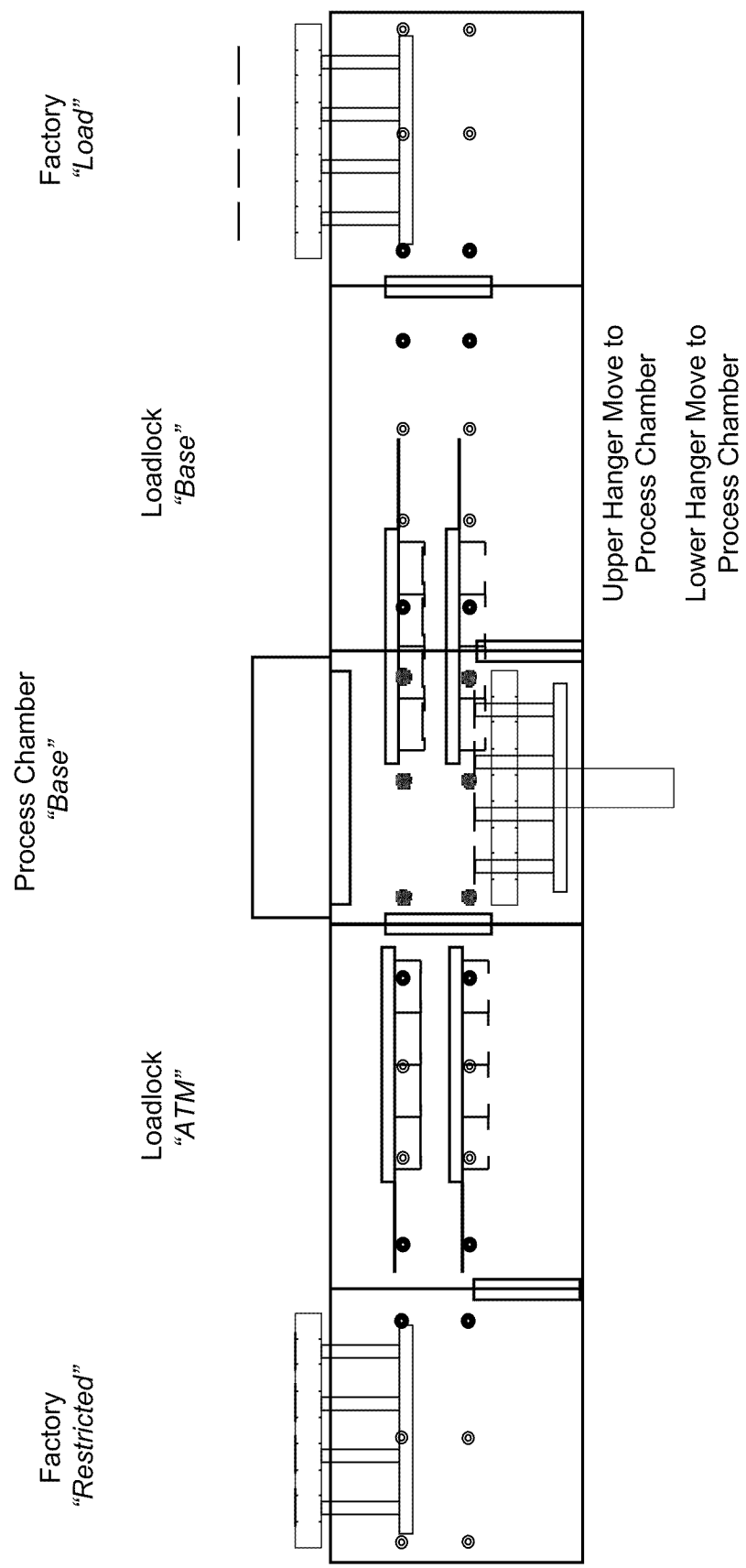
Figure 4.52

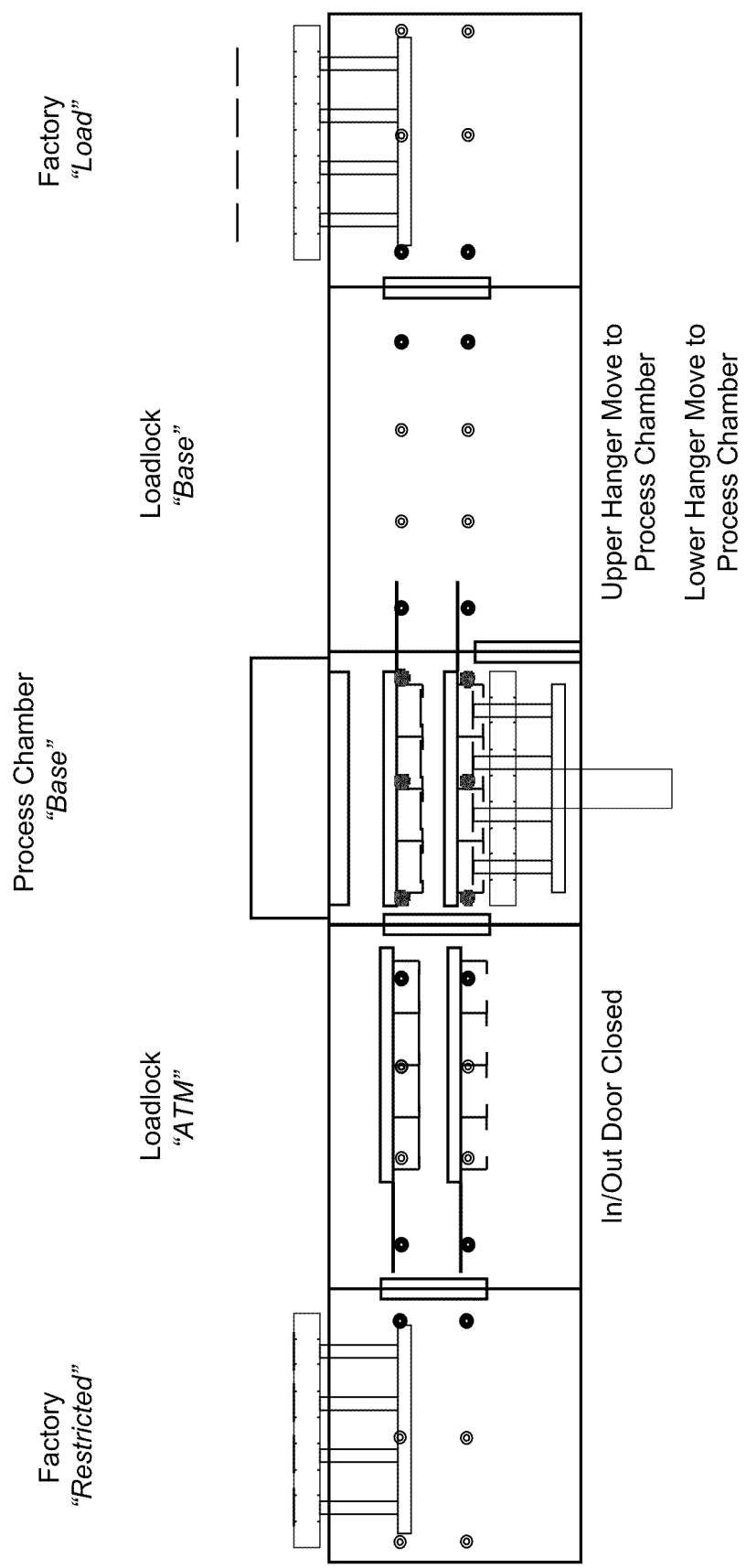
Figure 4.53

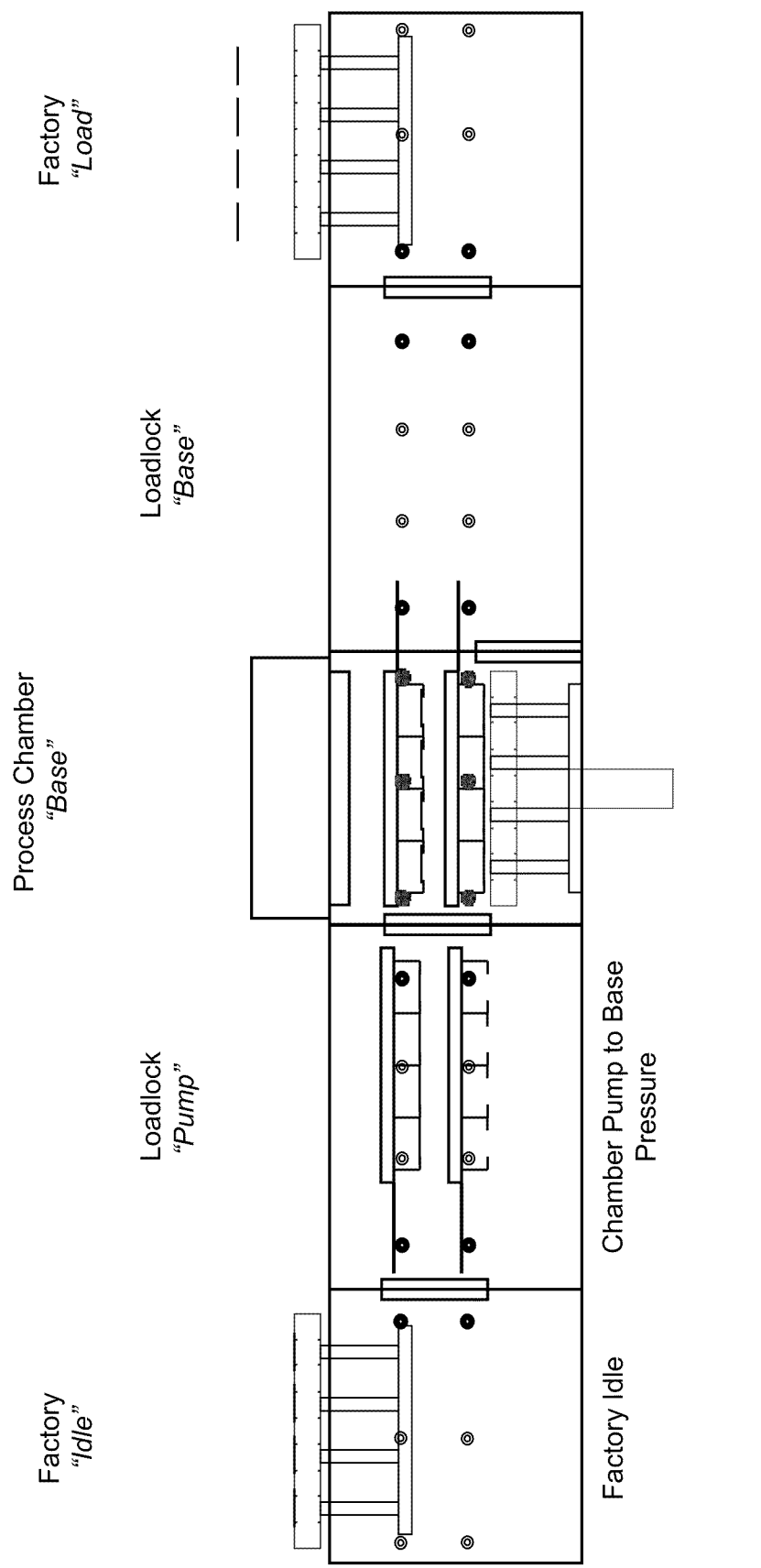
Figure 4.54

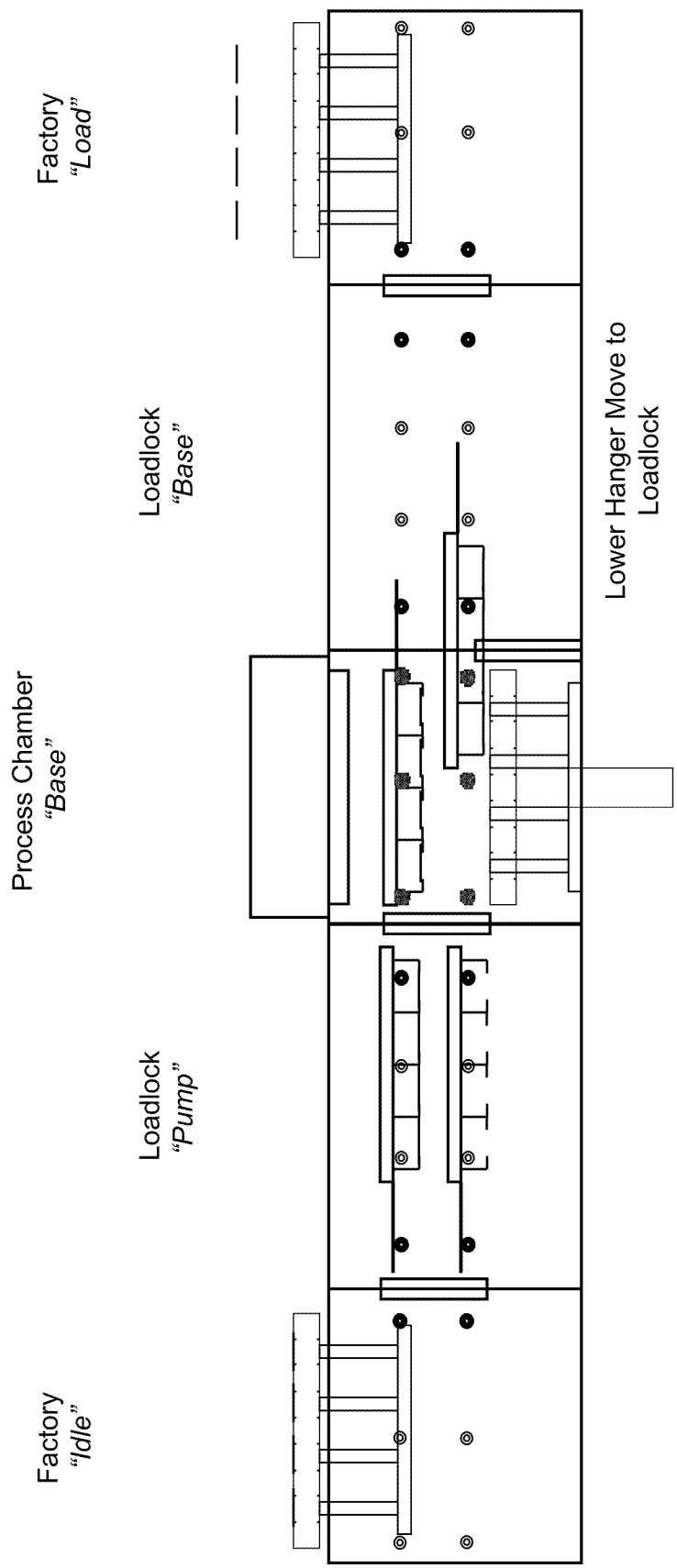
Figure 4.55

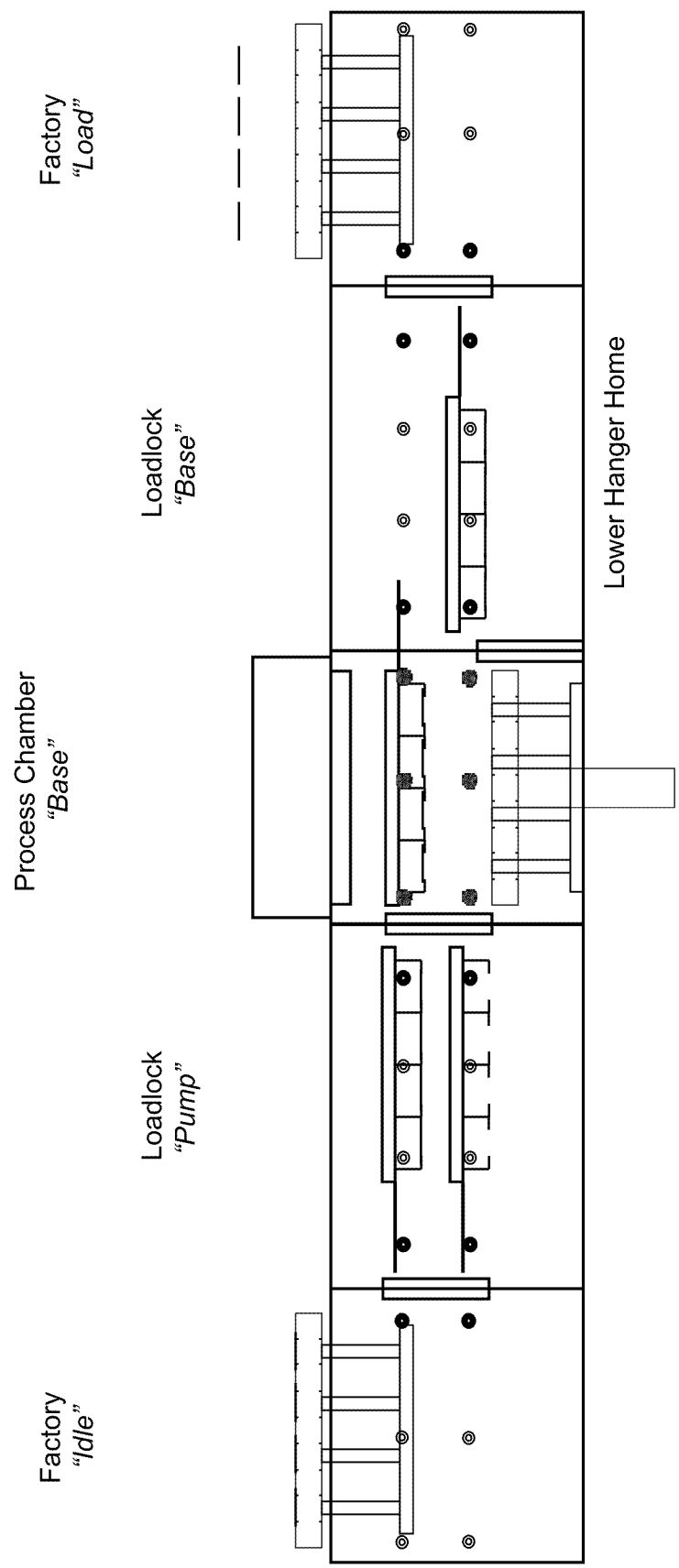
*Figure 4.56*

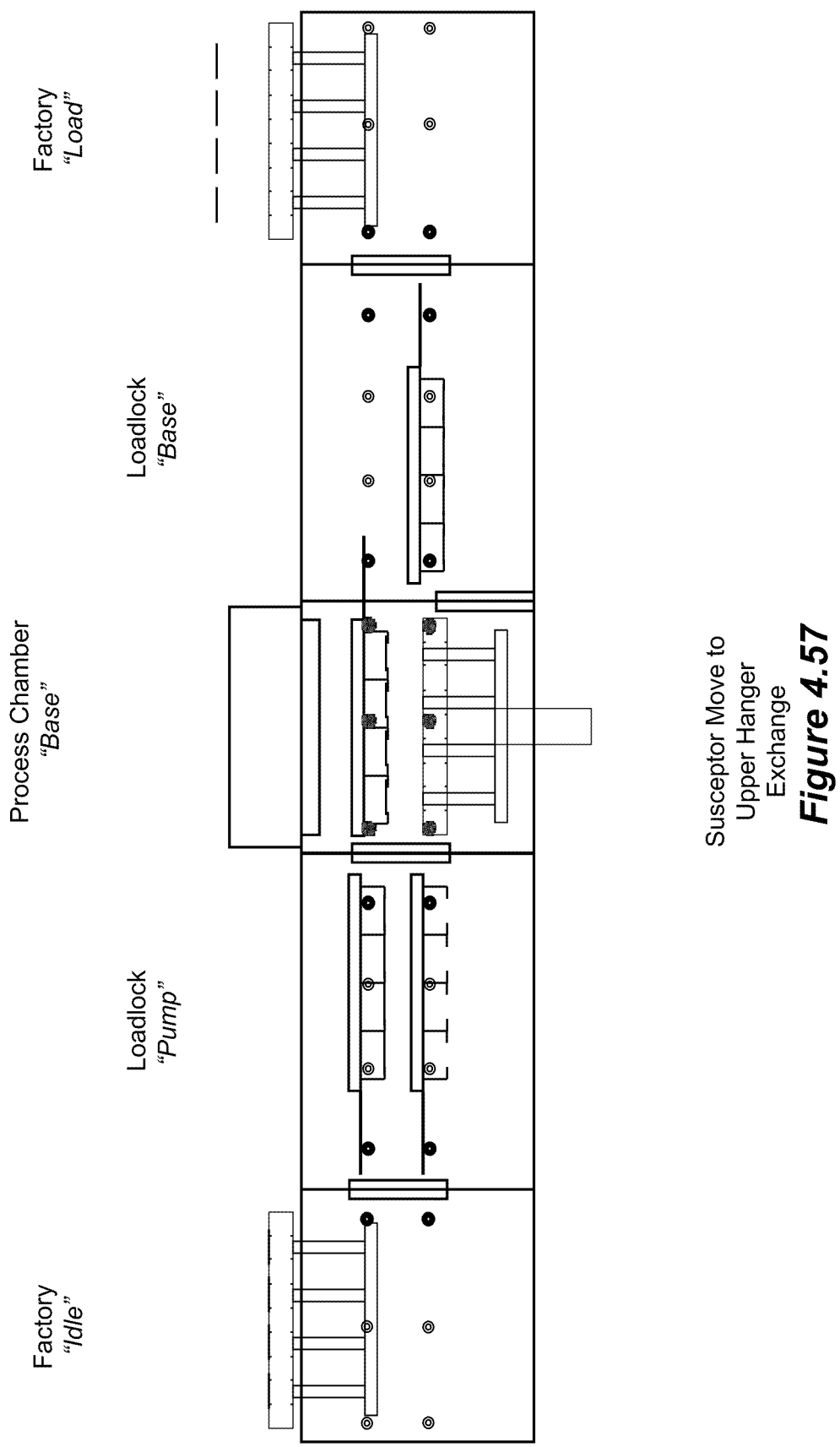
Figure 4.57

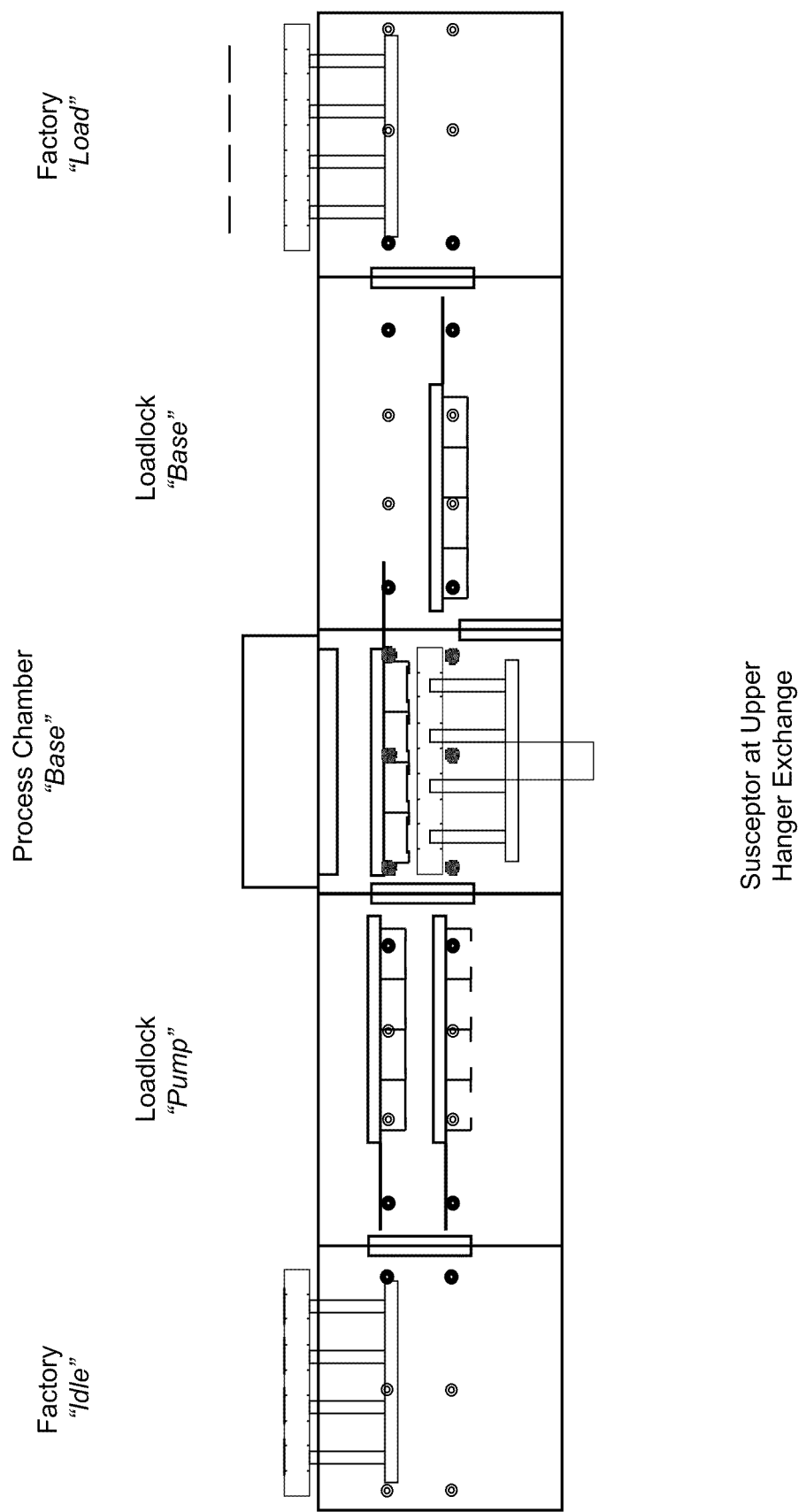
Figure 4.58

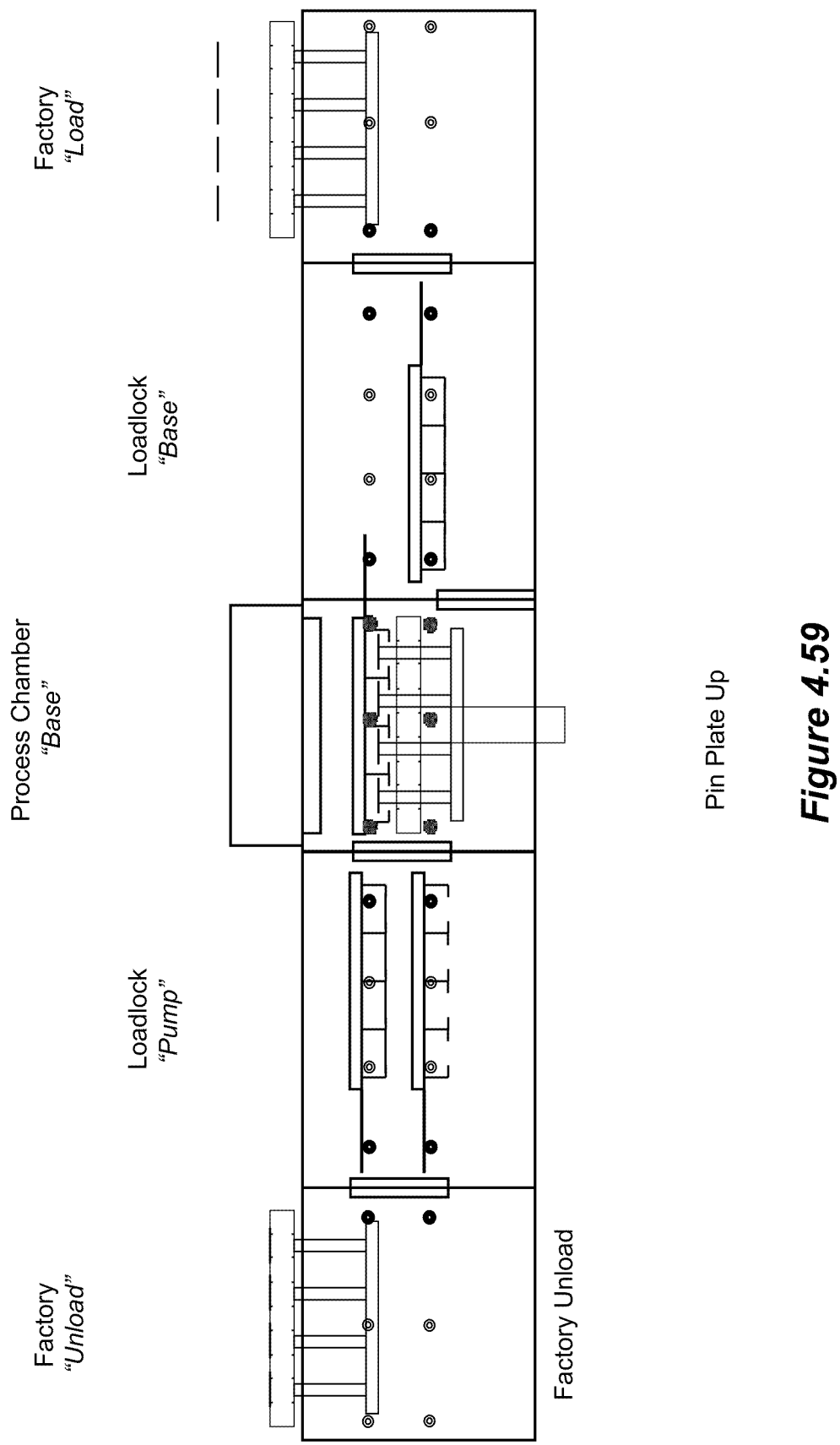
Figure 4.59

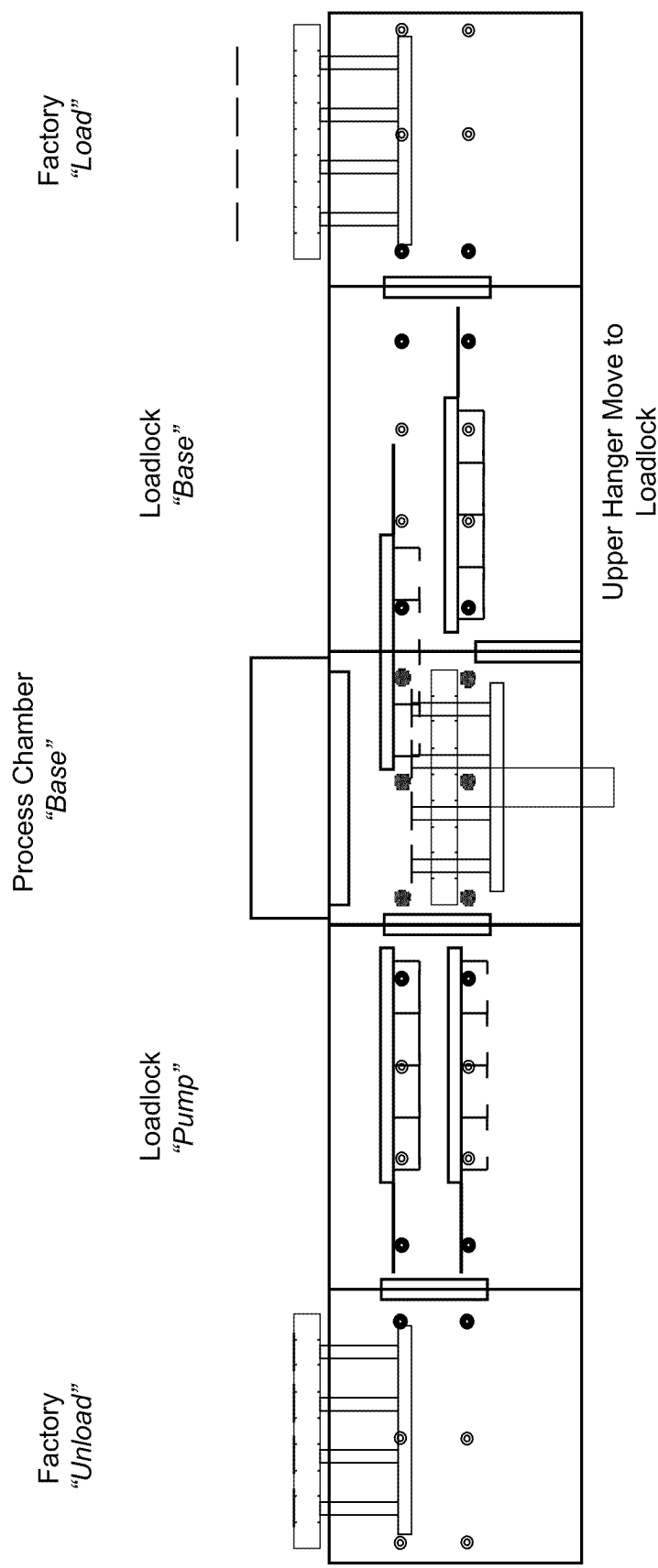
*Figure 4.60*

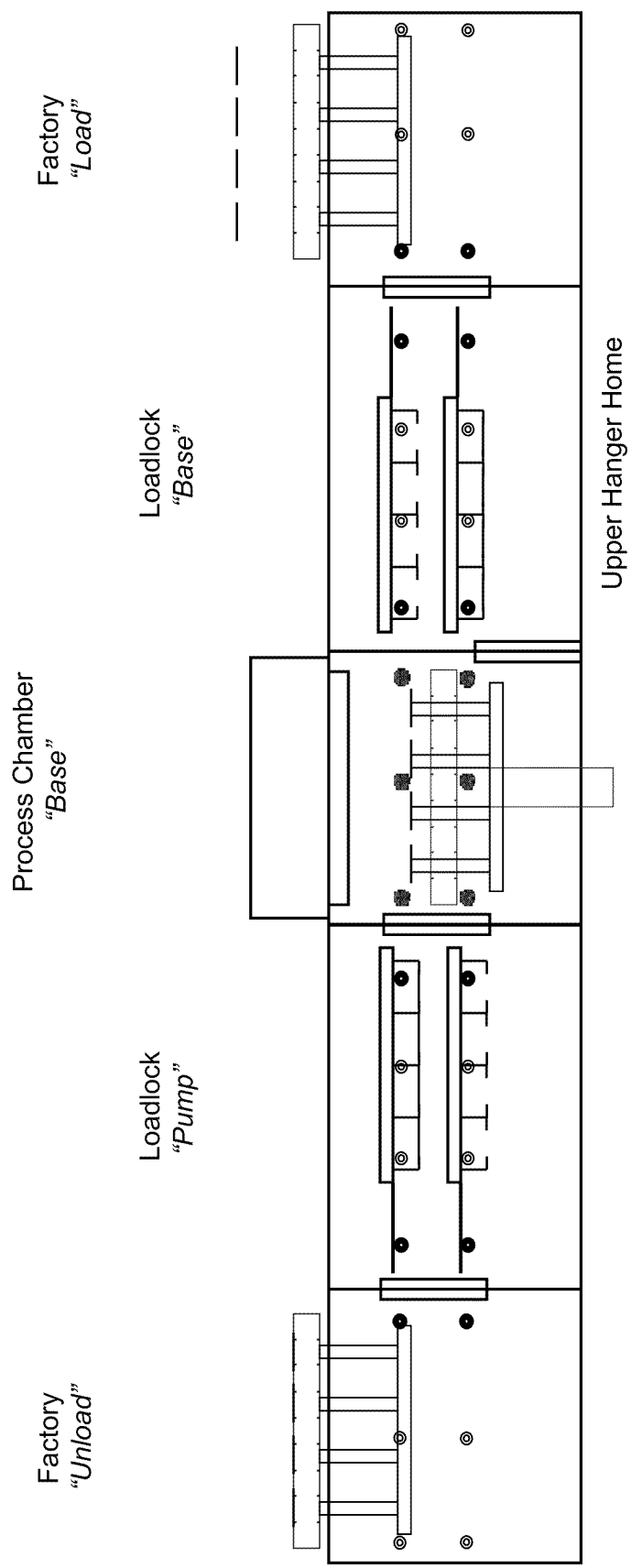
*Figure 4.61*

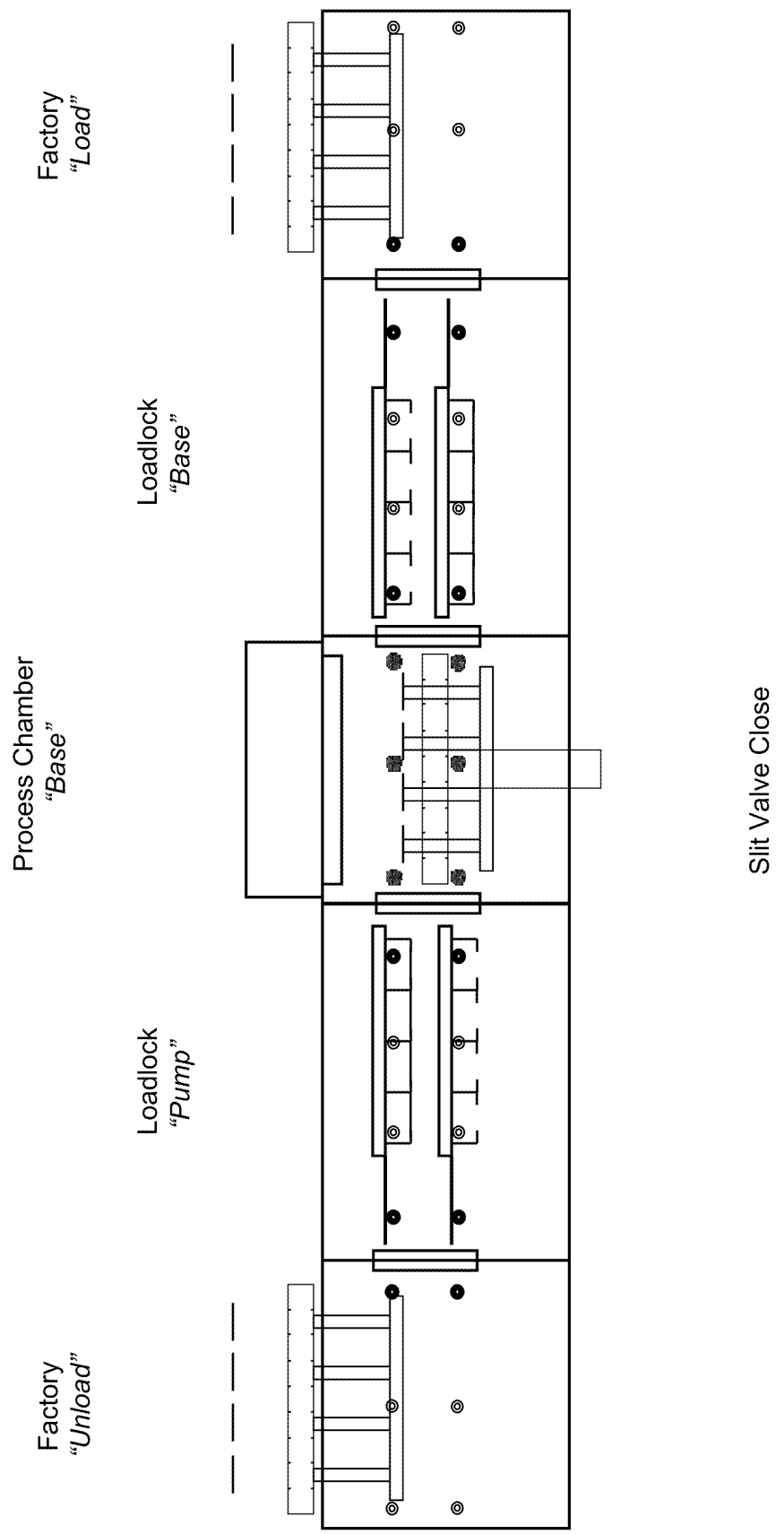
Figure 4.62

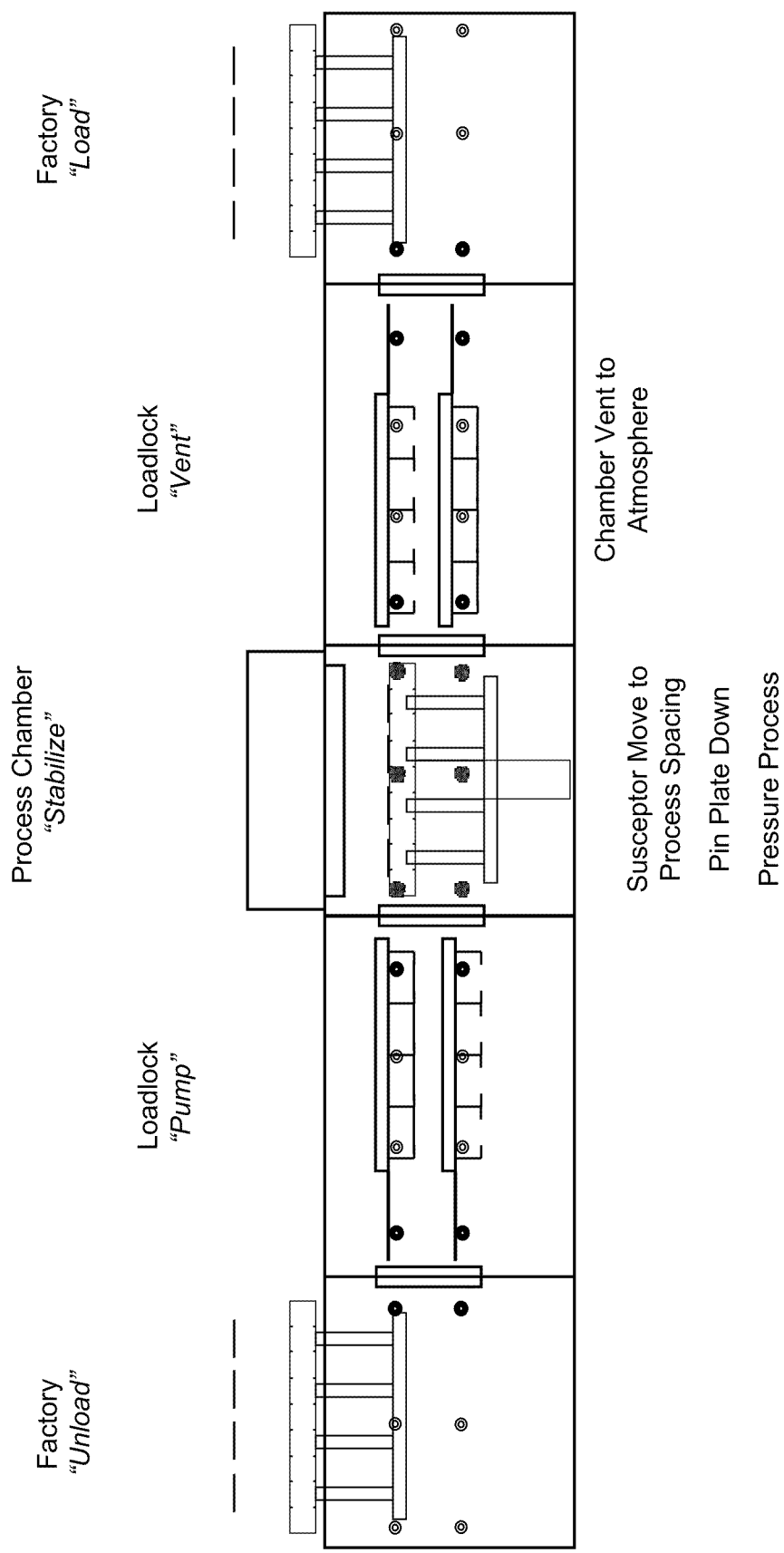
Figure 4.63

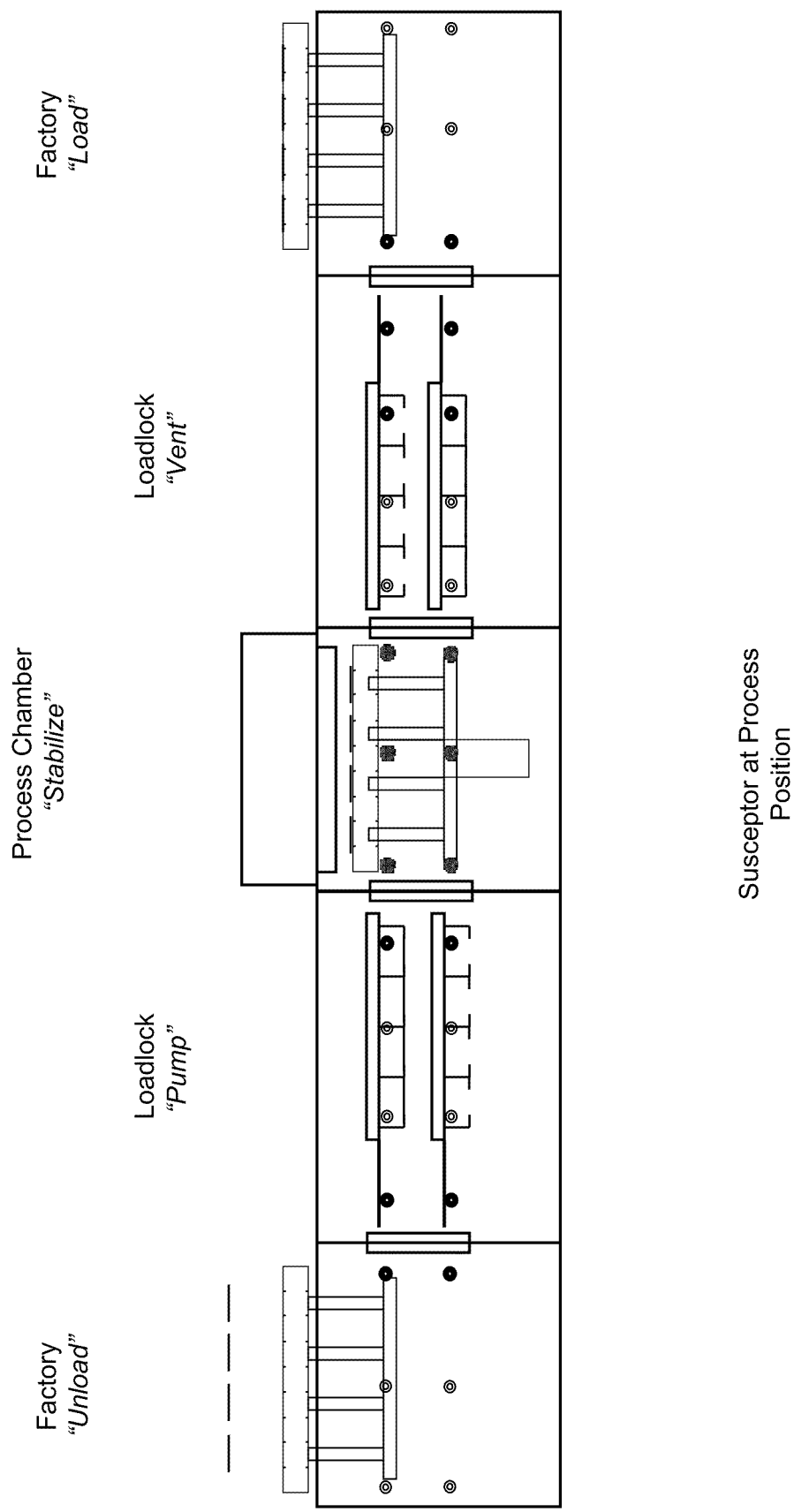
Figure 4.64

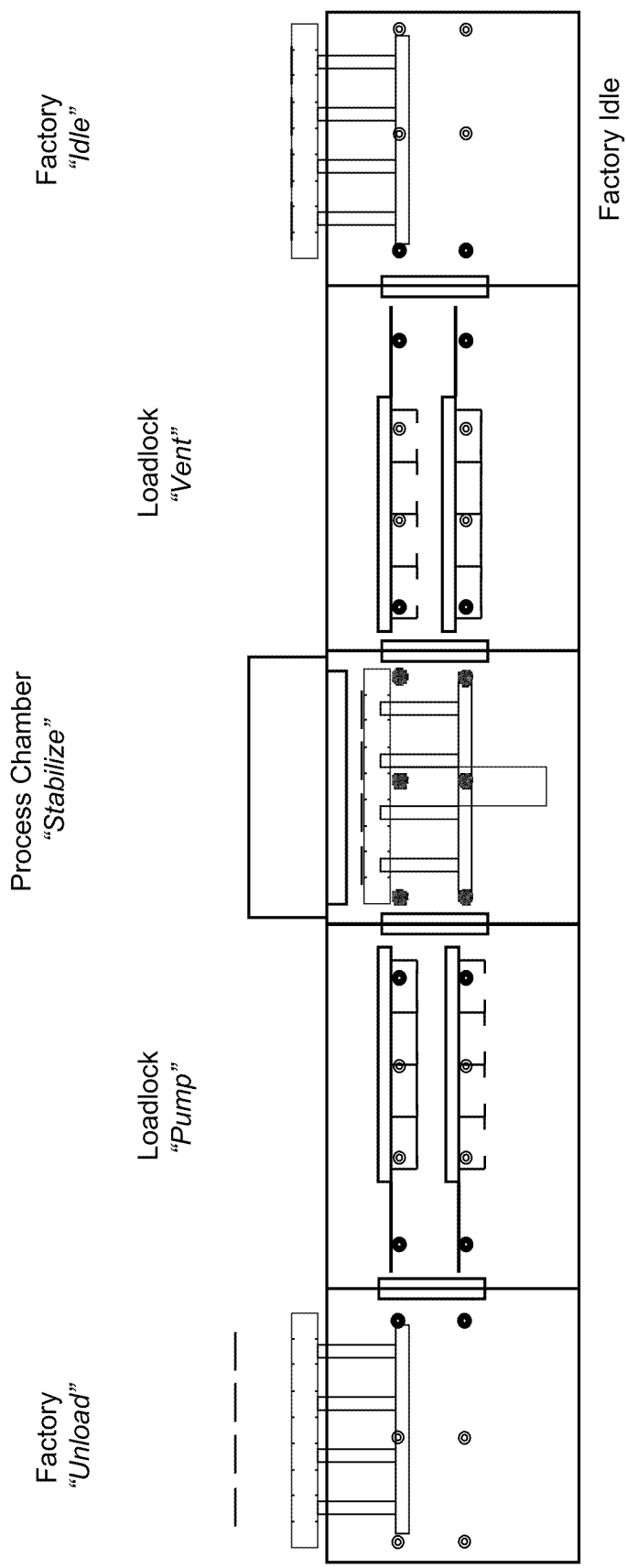
Figure 4.65

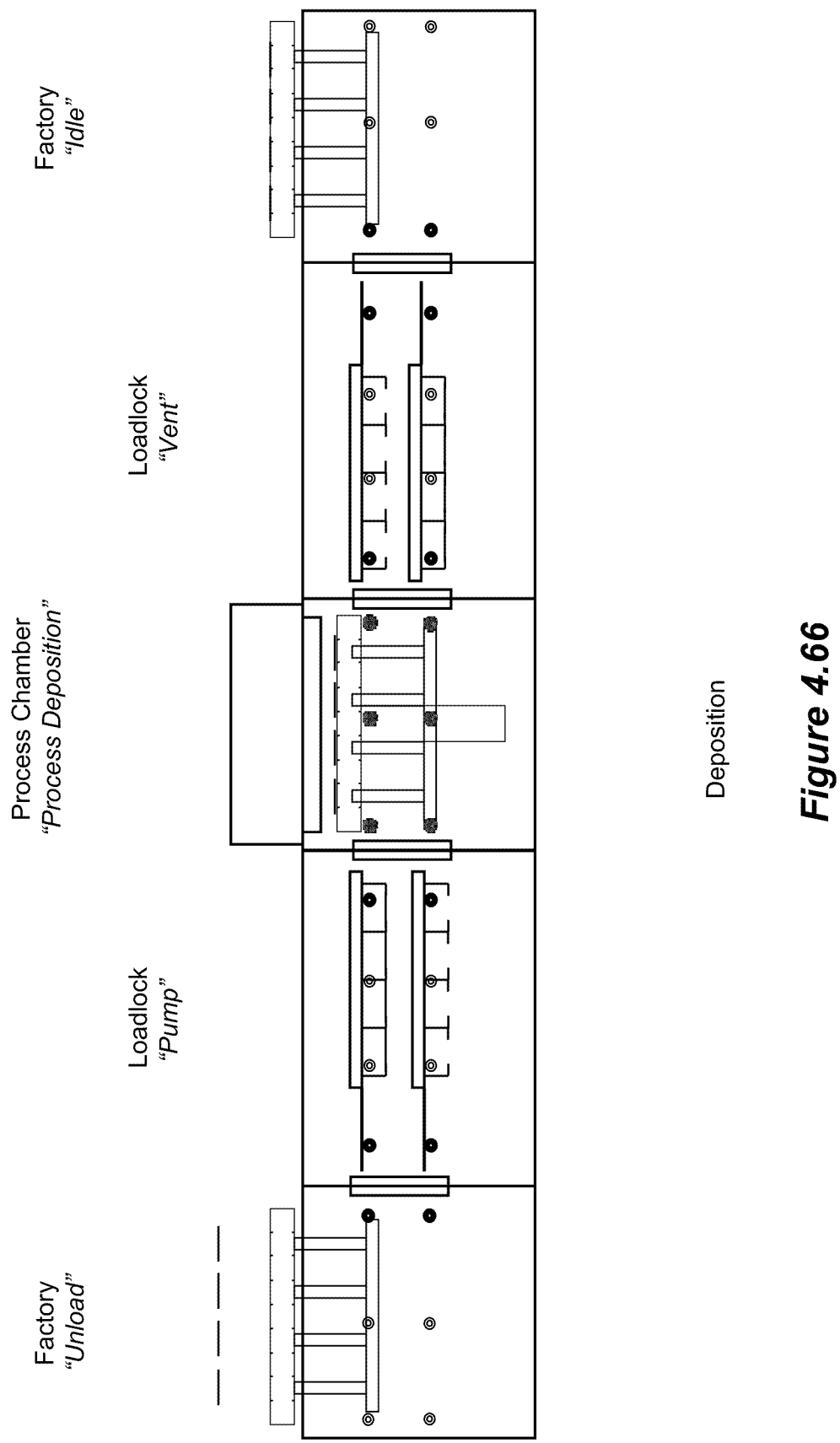
Figure 4.66

US 8,444,364 B2

AUTO-SEQUENCING MULTI-DIRECTIONAL INLINE PROCESSING APPARATUS

RELATED APPLICATIONS

This application is a continuation of and claims priority from U.S. Provisional Application Ser. No. 61/285,505, filed on Dec. 10, 2009, the entire content of which is incorporated herein by reference.

BACKGROUND

1. Field of the Invention

The present invention relates to system architecture, apparatus, and method for processing substrates in a clean environment, such as silicon wafers for semiconductor, solar cells, and other applications. The clean environment may be in vacuum or atmospheric pressure. The system can also be used with other substrates, such as glass for LCD and solar applications, stainless steel for thin film solar applications, etc.

2. Description of the Related Art

The photovoltaic (PV) solar cell industry can be roughly divided into two segments: thin film-based and silicon-wafer based PV cells. With the recent surge in demand for solar panels, various systems are currently being developed to enable high output manufacturing of various types of solar cells, both in silicon wafer and thin film manifestations.

State of the art systems for fabrication of semiconductor wafers generally utilize a mainframe about which several processing chambers are mounted. The mainframe is maintained in vacuum and houses a robotic arm. The arm moves individual wafers in and out of each processing chamber and out of the mainframe via a loadlock. The same architecture has been employed for fabrication of panels for flat panel display, albeit the mainframe and processing chambers are much larger for flat panel display substrates. Recently, such flat panel fabrication systems have been modified for fabrication of thin film solar cells, albeit with limited success. Another system being developed for thin film is a roll-to-roll system, wherein flexible substrate is provided from one roll, passed through the fabrication system, and collected on the other side into a spooling roll.

Another format for system architecture is the linear transport system. For thin film, these systems generally move large glass substrates on rollers in a linear fashion, entering the system from one end as clear glass and exiting the system on the other end as a fabricated solar cell. On the other hand, for silicon based fabrication, the linear system moves trays, upon which multiple silicon wafers are placed. The tray moves from chamber to chamber in a linear fashion, such that in each chamber many silicon wafers are processes concurrently on a single tray e.g., 64 substrates of 125 mm by 125 mm each. The trays enter from one side of the system and exit on the other side, and then need to be brought back to the entry side, e.g., using a transport system positioned under the series of fabrication chambers.

One of the advantages of the mainframe architecture is that if one chamber malfunctions or needs to be shut down, the system can continue to operate using the remaining chambers. Additionally, the system is modular, such that the user may run the system with any number of processing chambers according to its throughput requirements or other considerations. Conversely, in a linear architecture when one of the chambers is down, the entire system is shut down and cannot be used. Also, linear system is not modular, in that the number of processing chambers cannot be easily changed once the system is set up.

One of the advantages of a linear system is that it can process substrates at high throughput. That is, substrates move directly from one processing chamber to the next, without handling overhead of the mainframe robot between processing. Conversely, in a mainframe architecture, every time a process is completed in one chamber, the substrate must be picked up by the robotic arm and moved to another chamber, which adds transport overhead and reduces throughput. Also, for systems that move wafers without a tray, breakage of a wafer can cause a shut down of the entire system for clean up and recovery. Systems that use trays may avoid this issue if the tray can hold the fragmented wafer and carry the fragments out of the system.

As the demand for solar cell fabrication system continues to increase, there is a need for an architecture which can take advantage of the throughput of linear system, but also provide the flexibility of mainframe architecture.

SUMMARY

Various embodiments of the present invention provide a unique linear system architecture which can process silicon wafers of various sizes and can have high throughput. Various embodiments of the system provide apparatus and method for concurrent processing of several substrates at high accuracy and throughput, while enabling detection and recovery of broken substrates. The system employs a novel architecture which, while being linear, may autonomously sequence processing and move substrates in different directions as necessary. The system moves several substrates concurrently; however, unlike the prior art it does not utilize trays. Moreover, the system can also be used for processing individual large substrates of various materials.

According to various embodiments of the subject invention, a linear system is provided which may be used to process wafers on one or both sides. The system is capable of processing the wafers on one side, flipping the wafers, and then process the other side using similar or different process recipes for each respective side of the wafer.

According to various embodiments of the subject invention, a linear architecture is provided, which may be fed wafers from both or either side of the system. The system sequences its processing and wafer transport autonomously, such that it continues to operate and process wafers regardless of whether wafers are fed from either or both sides.

According to embodiments of the invention, a computerized method is provided, which is implemented in a controller for auto-sequencing operation of a dual-load processing system, wherein the vacuum processing system comprises a vacuum processing chamber that has two loading ports, and two loadlock chambers, each loadlock chamber coupled to one of the two ports via a vacuum valve, wherein the method proceeds as follows: when a new workpiece is introduced into one of the loadlock chambers, initiating vacuum at that loadlock chamber; when a desired vacuum level is achieved at one of the loadlock chambers, sending a ready signal to the controller, indicating that loadlock chamber is ready for workpiece exchange; when processing is completed in the vacuum processing chamber, causing the controller to determine which loadlock chamber as sent a ready signal and initiating workpiece exchange with that loadlock chamber. In this respect, a workpiece may mean one large substrate, such as a glass substrate for fabricating flat panel displays or solar panels, a tray holding a plurality of substrates, such as silicon wafers, or a hanger holding a plurality of substrates, such as silicon wafers.

Other aspects and features of the invention will become apparent from the description of various embodiments described herein, and which come within the scope and spirit of the invention as claimed in the appended claims.

BRIEF DESCRIPTION OF THE DRAWINGS

FIG. 1 is a general schematic depicting major components of a system architecture according to an embodiment of the invention, showing two-directional substrate flow.

FIG. 2 is a general schematic depicting major components of a system architecture according to an embodiment of the invention, showing return-path substrate flow.

FIG. 3 is a general schematic depicting major components of a system architecture according to an embodiment of the invention, showing return path substrate flow with substrate flip function.

FIGS. 4.1-4.66 are diagrams illustrating process sequencing according to embodiments of the invention.

Figure 25:
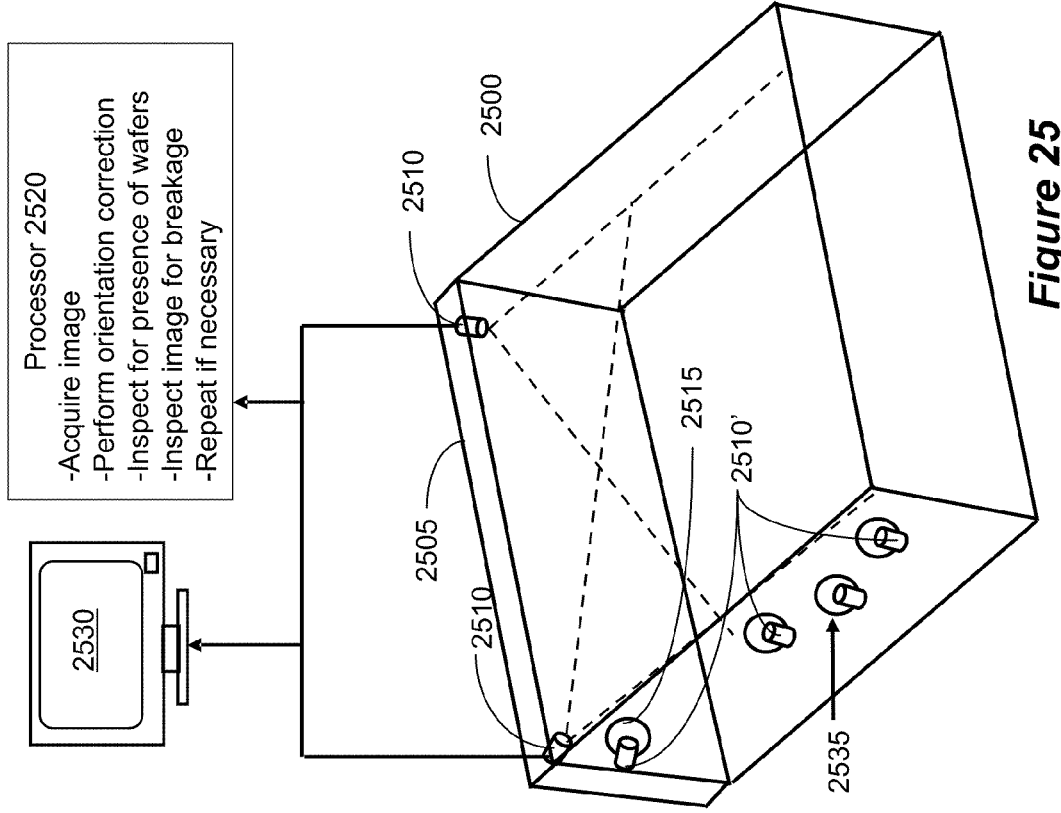
FIG. 25 illustrates another feature of the invention which enables detection of wafer breakage inside the processing chamber.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Various embodiments of the present invention provide apparatus and method for fabrication of substrates such as, e.g., for semiconductor integrated circuits, solar cells, flat panel displays, LED's and other applications. The system architecture is particularly beneficial for silicon-substrate solar cell fabrication and, therefore, for illustrative purpose will be described with reference to such application. The system sequences its transport of substrates and their fabrication autonomously, providing flexibility in feeding the system. This feature will be explained first in general terms with reference to FIGS. 1-3. More detailed explanation will follow further below.

In FIG. 1, a single processing chamber 100 is situated at the center of the linear system. In this embodiment, the processing chamber is a plasma processing chamber such as, for example, a PECVD processing chamber. One vacuum valve, 102, 104, is provided on each side of the chamber 100. A loadlock chamber 110 is provided on one side of chamber 100, and a similar loadlock chamber 115, is provided on the other side of chamber 100. Vacuum valve 112 is provided at the entry of loadlock 110 and similar valve 114 is provided at the entry side of loadlock chamber 115. A loading chamber 120 is provided at the entry side of loadlock chamber 110 and a loading chamber 125 is provided at the entry side of loadlock chamber 115. The arrow labeled L indicates the flow of wafers fed from the left side of the system, while the arrow labeled R indicates the flow of wafers fed from the right side of the system.

The flow of wafers illustrated in FIG. 1 will now be described in further details, starting with wafers loaded on the right side of the system. A tray with substrates is loaded into load chamber 120. The tray may carry, for example, 64 substrates arranged in a two-dimensional array. In load chamber 120 the wafers are removed from the tray and loaded onto a wafer hanger (which is not shown in FIG. 1, but will be described later). The hanger is moved into loadlock chamber 110 and the valve 112 is then closed. A vacuum is then drawn in loadlock chamber 110. Once the proper vacuum level is reached, valve 102 is opened and the wafer hanger moves into processing chamber 100, wherein the wafers are removed from the wafer hanger and placed onto a susceptor. The wafer hanger is then removed from the processing chamber 100, back to the loadlock chamber 110, and the valve 102 is closed. The processing chamber is then energized to process the substrates that are in the chamber.

Meanwhile, concurrent with the above processing, a wafer hanger full of new substrates, loaded onto a hanger as described above is delivered from the load chamber 125 to loadlock 115 and vacuum is drawn in loadlock 115. Loadlock 115 also has an additional wafer hanger which is empty (as does loadlock 110) located on a separate horizontal plane, defining an upper and lower wafer hanger. When processing in chamber 100 is completed, valve 104 is opened and both wafer hangers are moved from loadlock 115 into chamber 100. The lower hanger is moved from loadlock 115 into chamber 100 so as to collect the processed substrates, and the upper hanger is moved from loadlock chamber 115 into chamber 100, so as to deposit its new substrates for processing in chamber 100. When both hangers have been removed back into loadlock 115, the valve 104 is closed, and chamber 100 is energized for processing of the new wafers, and the loadlock 115 is vented to atmospheric pressure. Valve 114 is then opened, the upper hanger is moved into load chamber 125, to load new substrates onto the upper hanger, and then the lower hanger is move to the load chamber 125 to unload the processed substrates. It should be noted that the upper and lower hanger functions can be alternated, the lower hanger used for new substrates and the upper hanger for processed substrates, however the narrated configuration provides superior system through-put.

As can be appreciated, the substrates that were loaded into the system from the right side, were removed from the system at its left side, thereby operating in a linear fashion. Conversely, substrates that were loaded from the left side will be removed from its right side, thereby also operating in a linear fashion for these substrates. Therefore, the disclosed system is in effect a bi-directional linear system. This architecture allows for full utilization of the processing chambers, so that the mechanics of loading and unloading the wafers is not a limiting factor, such as it is in mainframe systems. Also, as will be described below, during every motion of the upper and lower hangers, sensors are provided to identify presence or absence of substrate at each substrate position, and to identify the travel and position of each hanger, so that the operation of the system can be maintained autonomously.

While FIG. 1 illustrates the operation of the system being fed from both sides, the system can also operate while being fed from only one side. For example, the system can be purchased without loadlock 110, valve 112, and load chamber 120. Conversely, it may be that either of loadlock 110, valve 112, and load chamber 120, needs service, or that the right side of the system is put at idle for any reason. As can be explained later, the system automatically detects that no substrates are loaded into the right side and autonomously operates in the fashion illustrated in FIG. 2. That is, a tray carrying the substrates is loaded into load chamber 125. In load chamber 125 the wafers are removed from the tray and loaded onto an upper hanger. The hanger is moved into loadlock chamber 115 and the valve 114 is then closed. Then vacuum is drawn in loadlock chamber 115 and processing chamber 100. Valve 104 opens and the upper hanger then moves into processing chamber 100, wherein the wafers are removed from the upper hanger and placed onto a susceptor. The upper hanger is then removed from the processing chamber 100 and the valve 104 is closed. The processing chamber is then energized to process the substrates that are in the chamber. When processing is completed, valve 104. As will be explained later, loadlock 115 has the upper hanger already loaded with substrates to be processed. It also has a lower hanger which is empty. The lower hanger is moved from loadlock 115 into chamber 100 so as to collect the processed substrates, and the upper hanger is moved from loadlock chamber 115 into chamber 100 so as to deposit its substrates for processing in chamber 100. When both hangers have been moved back into loadlock 115, the valve 104 is closed, the chamber 100 is energized for processing, and loadlock 115 is vented to atmospheric pressure. Valve 114 is opened and both hangers are removed into load chamber 125, to remove the processed substrates from the lower hanger, and load new substrates onto the upper hanger. As can be appreciated, in this example the substrates that were loaded into the system from the left side, where also removed from the system at its left side, thereby operating in a linear return-path fashion.

As can be appreciated, in the examples shown in FIGS. 1 and 2, the substrates were processed on only one side. FIG. 3 illustrates an example where the system is utilized to process the substrates on both sides. The system of FIG. 3 is similar to that of FIGS. 1 and 2, except that one of the load chambers, here load chamber 120, is fitted with a wafer flipping mechanism to form a flipping chamber 130, which can be atmospheric or vacuum based. In this system, a tray carrying the substrates is loaded into load chamber 125. In load chamber 125 the wafers are removed from the tray and loaded onto an upper hanger. The upper hanger is moved into loadlock chamber 115 and the valve 114 is then closed. Then vacuum is drawn in loadlock chamber 115 and processing chamber 100. Valve 104 opens and the upper hanger then moves into processing chamber 100, wherein the wafers are removed from the upper hanger and placed onto a susceptor. The upper hanger is then removed from the processing chamber 100 and the valve 104 is closed. The processing chamber is then energized to process the substrates that are in the chamber. When processing is completed, valve 102 is opened. As will be explained later, loadlock 110 has previously been pumped to vacuum, and already has the upper hanger loaded with flipped substrates to be processed. It also has a lower hanger which is empty. The lower hanger is moved from loadlock 110 into chamber 100 so as to collect the processed substrates, and the upper hanger is moved from loadlock chamber 110 into chamber 100 so as to deposit its flipped substrates for processing in chamber 100. When both hangers have been moved back into loadlock 110, the valve 102 is closed, the chamber 100 is energized for processing, and the loadlock 110 is vented to atmospheric pressure. Valve 112 is opened and both hangers are removed into flipping chamber 120, to remove the processed substrates from the lower hanger, flip them, and load them back (but flipped) onto the upper hanger. In the next cycle, the upper hanger will be moved into the processing chamber 100, so that the other side of the substrates will be processed. The substrates will then be removed from the system from the left side, at load chamber 125. As can be appreciated, in this example the substrates that were loaded into the system from the left side, were also removed from the system at its left side, thereby operating in a linear return-path fashion One beneficial feature of the embodiments of FIGS. 1-3 and other embodiments described herein, is that the system auto-sequences its operations. This feature can be understood from the following description. With reference to FIG. 1, a controller 140 communicates with and operates various elements of the system. However, unlike conventional system controllers, controller 140 need not have the sequence of the processing system programmed therein so as to direct the entire process flow. Rather, according to features of the invention, each stage performs its functions and communicates completion of a task to the controller. The controller then sends commands to perform the next task. For example, when load chamber 120 communicates to the controller that it is ready to send substrates for processing, controller 140 opens valve 112 and direct the motion mechanism to move the upper hanger from the load chamber 120 into loadlock 110. This can be done independently of the status of and any other operations performed by any other part of the system. When the hanger is inside loadlock 110 the controller closes valve 112 and pumps the loadlock 110 to vacuum pressure. Then, when chamber 110 indicates to controller 140 that it's ready to transfer new substrates to chamber 100 and remove processed substrates, the controller 140 the controller opens valve 102 to enable exchange of substrates.

Referring to the embodiment of FIG. 1, if new substrates are loaded into both load chambers 120 and 125, which substrates will be processed first depends on which loadlock chamber 110 or 115 sends a message to the controller first, indicating that it is at atmospheric pressure and ready to exchange processed substrates for new ones. The controller 140 is oblivious to which load chamber is being operated and loaded with substrates. All the controller needs to know is which loadlock is ready to exchange substrates. Therefore, with respect to FIG. 2, if the right side was loaded too slow and loadlock chamber 115 is ready first, the exchange of substrates will be done with loadlock 115, regardless of where the processed substrates came from. Moreover, if the right-hand side is down for maintenance or is even removed from the system, the controller 140 can be totally oblivious to that. The controller 140 will simply get ready signals only from loadlock 115, and will therefore automatically sequence for processing only substrates coming from the left side.

Figure 3A:
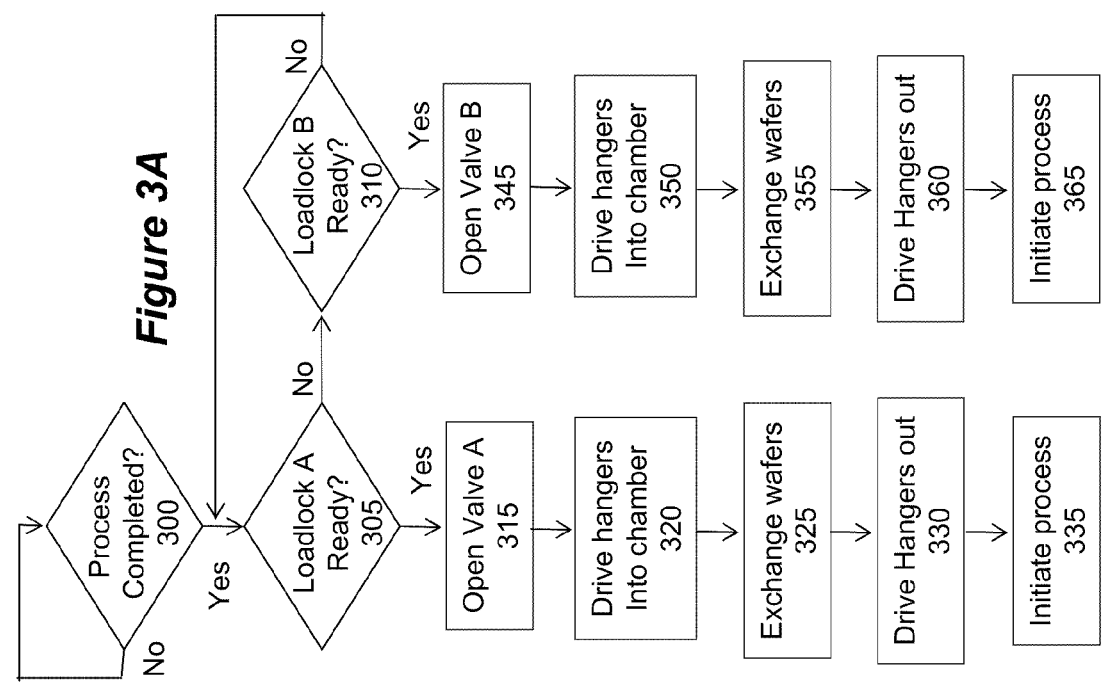
FIG. 3A is a flow chart illustrating a simplistic process flow to demonstrate the auto-sequencing feature of the invention.

A somewhat simplistic process flow is illustrated in FIG. 3A, to illustrate the auto sequencing feature of the invention. However, a more detailed process example is provided below. Step 300 is reiterated until the controller identifies that the chamber has completed processing of the wafers therein. At that point the controller checks to see which of loadlock A or loadlock B is ready, i.e., has been pumped down and ready to transfer fresh wafers. If loadlock A is ready, at step 315 the controller initiates opening of the vacuum valve separating the chamber from loadlock A. Then at step 320 the controller activates the drive mechanism to drive the upper and lower hangers from loadlock A into the chamber. At step 325 the system performs wafer exchange and at step 330 the processor drives the hangers out of the chamber. According to one embodiment, wafer exchange and driving hangers out of the chamber is performed in the following manner. First the processed wafers are unloaded from the susceptor and placed on the lower hanger, and then the lower hanger is driven out of the chamber back to the loadlock. Fresh wafers are then unloaded from the upper hanger and placed on the susceptor and then the controller again activates the drive mechanism to drive the upper hanger out of the chamber. At step 335 the controller initiates processing of the wafers in the processing chamber. The exact same process would have been followed had in step 310 loadlock B was ready before loadlock A. Consequently, the controller need not have a preprogrammed sequence of processing. After wafers that were loaded from loadlock A have been processed, if loadlock A is ready, they will be unloaded to loadlock A, i.e., from where they originally were loaded. On the other hand, if loadlock B is ready, they will be unloaded via loadlock B, i.e., to the opposite direction from where they were loaded.

The following provides further explanation of the auto-sequencing feature of embodiments of the invention, with further description of various features of system. It should be appreciated that while the following description is provided with respect to both sides of the system fully operational, the same process can be implemented with only one side operating.

In FIG. 4.1, the processing chamber 400 is again shown in the center, with left and right hand side loading chambers and loadlocks. Wafers are being placed onto trays in the load chambers 420, 425, while the upper hangers 416, 418, and lower hangers 417 and 419, are "parked" in the loadlocks 410 and 415. This is the status of the system at initiation, as once the system has been operated, there will always be wafers within the system and being processed inside the processing chamber, as will become clear from the description of the processing sequence that follows below. This ensures that the processing chamber is utilized to its maximum processing capacity and is not idling while wafers are being loaded, as is the case with mainframe architecture.

One feature of this embodiment is illustrated by the shading of the rollers which move and/or guide the hangers 416-419. In FIG. 4.1, rollers shown in solid shading are motorized rollers, i.e., rollers coupled to a motor such as, direct drive, chain, belt, etc. According to one embodiment, all motorized rollers in one level are energized synchronously. For example, this can be achieved by using a single motor to drive all of the motorized rollers in one level via links, belt, chain, etc. In such a configuration, the entire system is motorized using only two motors (see, e.g., FIG. 9). On the other hand, roller that are shown as two concentric circles, are idle rollers and have no connection to a motor. As can be seen, no motorized rollers are provided within the processing chamber 400. This is done in order to avoid any potential for contamination inside the plasma chamber 400 as well as mechanism damage that may be caused in an aggressive and high temperature location. As can be further elaborated below, this feature is enabled by the provision of extensions 413 on each of the hangers.

Another feature is shown in FIG. 4.1 as cameras 442 and 444. In this embodiment linear camera arrays 442 and 444 are provided on each of the loadlock chambers to verify the presence and status of wafers in each wafer location on the hangers. Although discussed here as camera, thru beam sensors can also be used. As will be described later, the hangers have triggers that activate the camera when the hangers are at specific position, such that an image is taken each time the hanger positioned to expose one line of wafers to the linear camera array. While a two-dimensional camera array may be used to image the entire hanger, it will require more elements and optics. Therefore, in this embodiment a linear array is used so as to image only one line of wafers at a time, according to trigger activation from the hanger. The images are processed to verify the presence and condition of each wafer on the hanger, as will be explained further below.

The processing chamber 400 is fitted with a lift mechanism 406 and a heated process susceptor 408 which is designed for supporting the substrates during processing. The lift mechanism 406 is designed to load/unload wafers from the hangers and the susceptor 408. A lifting mechanism 426 is provided in load chamber 425 to lift and lower the tray 422, so as to load/unload wafers from the tray. A similar arrangement is provided for load chamber 420. In the particular situation depicted in FIG. 4.1, vacuum doors 414 and 412 are shown open, so as to equalize the atmosphere of the load chambers and the loadlocks and facilitate wafer transfer. On the other hand, vacuum doors 402 and 404, are closed so that the processing chamber 400 is isolated from the atmosphere.

In FIG. 4.2, after the wafers were placed onto the trays, the lifting mechanisms lowered the trays into the load chamber in a position referred to as upper exchange. In FIG. 4.3 the lift mechanism lifts the substrates from the trays and in FIG. 4.4 the upper hangers are moved into the load chamber, and in FIG. 4.5 the lifting mechanism is lowered so as to deposit the substrates on the hangers. In FIG. 4.6 the upper hangers move back into the loadlocks, and in FIG. 4.7 the valves between the load chamber and the loadlock are closed. The lifting mechanism can then lift the trays to receive more substrates, as shown in FIG. 4.8.

As can be seen, unlike conventional linear systems which move trays throughout the processing system, in this embodiment the substrates are removed from the trays and placed onto hangers for transport into the processing chambers. The trays are only used to introduce substrates into the load chambers, but never travel with the substrates into the system. In this manner, the trays can be re-used without worry of contamination and damage caused in the processing chamber. Also, in system utilizing trays for carrying the substrates there is the problem of heating and cooling of the tray. That is, for processing requiring heating of the substrates, the tray also needs to be heated, which requires much energy due to its mass. Then, after processing, the tray needs to be cooled, sometimes requiring special cooling stations or chambers. Here, since the substrates are processed without the tray, this issue is eliminated. Most importantly, in conventional linear systems moving trays into the process chamber, the condition, manufacture and previous depositions all can change the processing performance, therefore in this embodiment eliminating the use of trays in the process chamber provides a more stable and repeatable process performance and product yield The first loadlock to indicate to the controller that it is ready for pump-down operation, is being pumped to vacuum condition. In this embodiment, a single pump is used and the controller operates valves in a duct system to control which loadlock is being pumped. In FIG. 4.9, the right-side loadlock was first and is being pumped. At the same time, new substrates may be loaded onto the trays in both sides. When the vacuum level is achieved in the right-side loadlock, the gate or vacuum door 402 to the chamber is opened as shown in FIG. 4.10. Also, the loadlock on the left side can now be pumped. Note, however, that if two pumps were used, then both loadlocks could have been pumped simultaneously. The bidirectional architecture in this embodiment allows the full output of the tool to be realized using only 1 vacuum pump to service both loadlocks.

In FIG. 4.11 the upper hanger is moved into the process chamber and in FIG. 4.12 the susceptor 408 inside the chamber is lifted by lift 406 to its upper loading position, shown in FIG. 4.13. This is another beneficial feature of the invention, wherein the susceptor 408 can be lifted from its base (not shown). The base holds the heating elements and susceptor grounding hardware, and as needed the susceptor can be moved, by the hanger, out of the process chamber for service. In FIG. 4.14 lift pins 409 are lifted to remove the substrates from the hanger 418, and at FIG. 4.15 the upper hanger 418 is removed back to the loadlock 410. In FIG. 4.16 the upper hanger 418 is inside the loadlock 410 and the vacuum valve 402 is closed. As will be appreciated from the following description, while the substrates were fed into the chamber 400 from the right hand side loadlock 410 via hanger 418, the hanger 418 returns to loadlock 410, but the substrates will be removed from the chamber 400 via left-side loadlock 415.

In FIG. 4.17 the loadlock 410 is being vented, while the processing chamber 400 is conditioned for processing pressure. Also, the lift pins 409 are lowered so as to deposit the substrates onto the susceptor 408. In FIG. 4.18 the susceptor 408 has been further lifted to its processing position. In FIG. 4.19 processing is performed in the process chamber 400, while the tray in the right-hand load chamber is lowered into the load chamber. The process for introducing new substrates to the upper hanger and into the loadlock can now proceed, as shown in FIG. 4.20.

Meanwhile, once processing is completed, the susceptor is moved to its unloading position and the chamber is pumped to its base pressure, as shown in FIGS. 4.21 and 4.22. In FIG. 4.23, the left side loadlock is pumped down, and the lift pins in the chamber are raised to remove the substrates from the susceptor. In FIG. 4.24 the valve on the left side of the chamber is open, and in FIGS. 4.25 and 4.26 both upper and lower hangers move into the process chamber. In FIG. 4.27 the lift pins are lowered to deposit the processed substrates onto the lower hanger and in FIG. 4.28 the lower hanger is removed from the chamber back into the loadlock. As can be understood, in this example the processed substrates that were removed into the left side of the system, where actually loaded into the system from its right side.

The susceptor is then moved to its loading position and the lift pins are utilized to remove the new substrates from the upper tray and place them onto the susceptor, FIGS. 4.29-4.31. The sequence can then continue to process the newly loaded substrates, remove the processed substrates from the system, and load new substrates onto the upper hanger of the left side of the system, FIGS. 4.32-4.47. When processing is completed, the sequence proceeds to unload the processed substrates, this time to the right side of the system (recall that these substrates were loaded from the left side of the system), see FIGS. 4.48-4.66.

We now turn to the description of various elements and features of the system that enhance its benefits and versatility.

Figure 5:
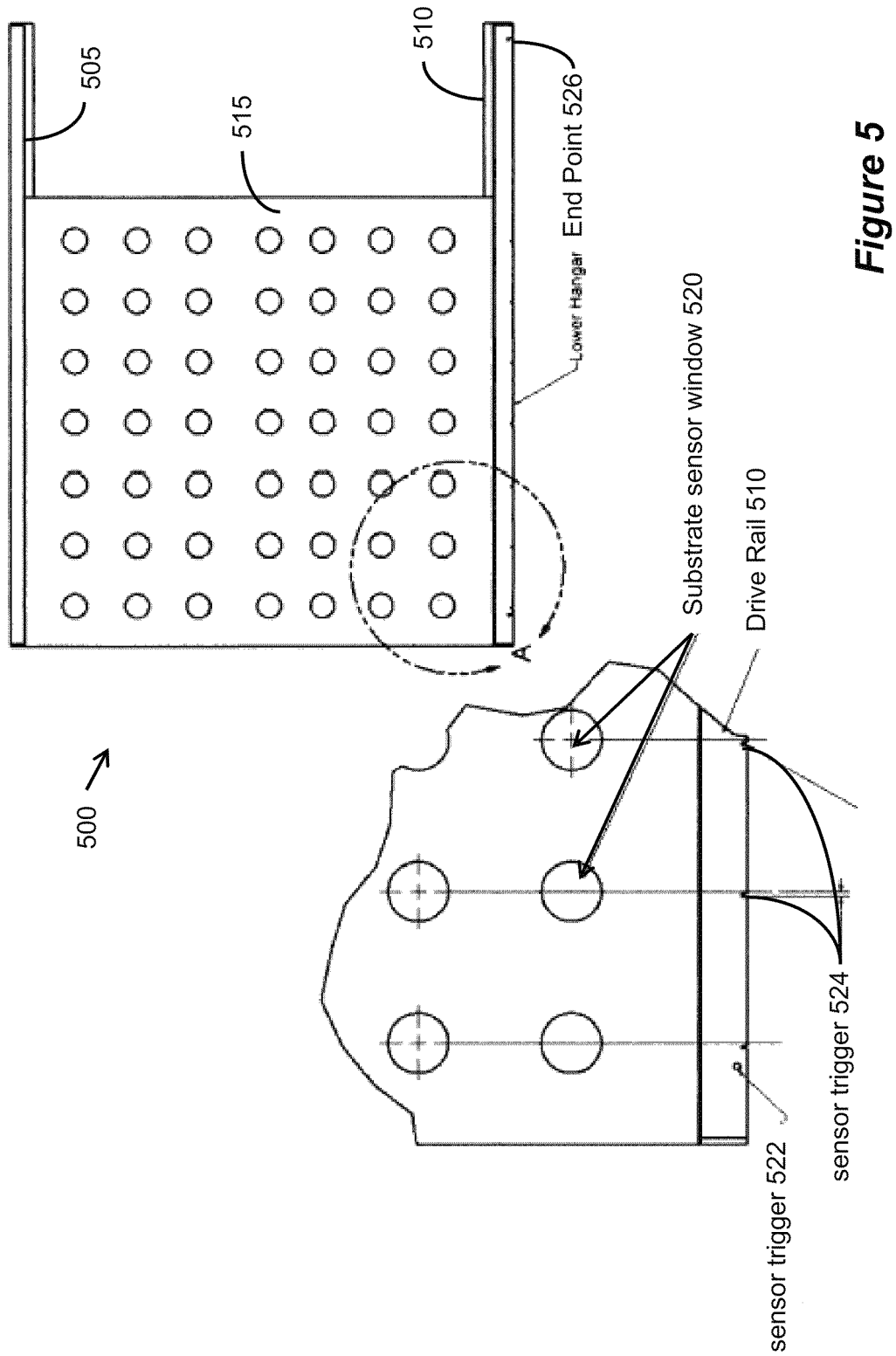
FIG. 5 illustrates a top view of the lower hanger according to embodiments of the invention.

FIG. 5 illustrates a top view of the lower hanger 500 according to embodiments of the invention. In this respect, it should be appreciated that the lower and upper hangers are described here as one specific embodiment, but their role may be reversed and the system can be designed to load new wafers from the lower hangers and remove processed wafers with the upper hangers. The hanger generally comprises drive rails 505 and 510, and a plate/structure 515 for holding the substrates.

As shown in FIG. 5, holes or windows 520 are positioned on plate/structure 515 of the lower hanger 500, one window 520 for each substrate position. This is done in order to enable an optical system to determine whether a substrate is situated in each position and to identify missing or broken substrates. Also, in the enlarged callout the sensor window is shown, together with the drive rail and triggers for sensor timing. The triggers enable determination of the location of the hanger within the system. Trigger 522 is for the drive control and is in the form of hole drilled in the rail 510. One trigger 524 is provided on rail 510 for each row of substrates, to enable the system to time the location of each row of substrates. For example, whenever the system detects a signal from one of triggers 524, it operates the optical substrate detection system to verify that all locations in that row have wafers (see, FIG. 4.1). Additionally, an end point trigger 526 is provided to indicate the location of the end of the hanger rail. The system's controller takes temperature measurements of the system to calculate its thermal expansion, which can be 5 mm and more. Using this calculation and the end point trigger, the controller decide how much to move the tray at each position.

Figure 6:
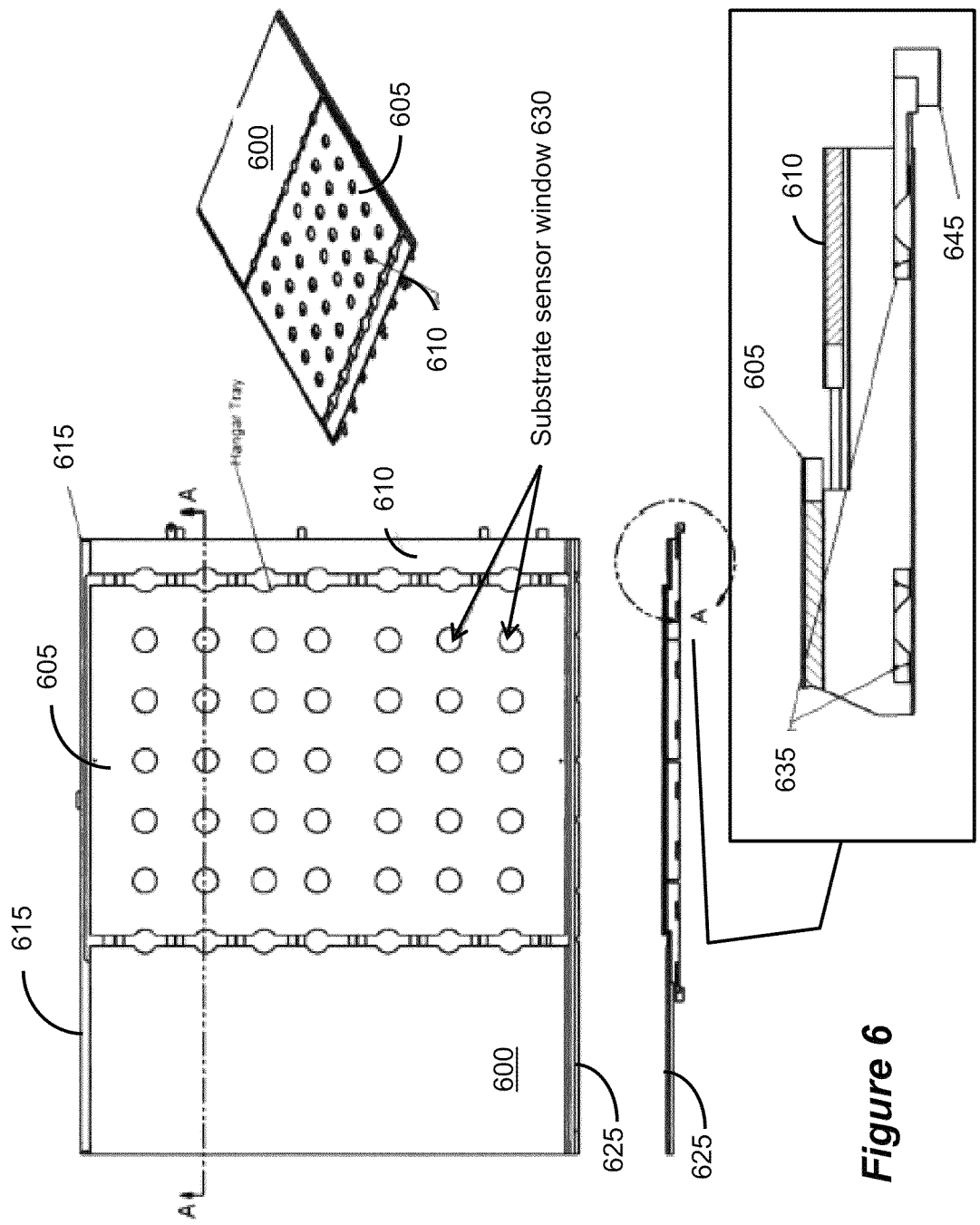
FIG. 6 illustrates the upper hanger according to an embodiment of the invention.

FIG. 6 illustrates the upper hanger, also referred to as upper transport carrier assembly. The upper hanger is different from the lower hanger, as the upper hanger includes provisions to ensure alignment of the substrates to the susceptor. As shown in FIG. 6, the upper hanger includes two stationary parts, 600 and 610, and one "floating" tray/structure 605, positioned between rails 615 and 625. The upper hanger also includes windows 630 for the optical system to sense presence of substrates in each position. Illustrated in the callout is details of cross section, showing the floating tray 605 in a lifted position and the wafer nests 635. The wafer nests hold each wafer aligned in place, so that when the upper tray is aligned to the susceptor, each wafer is aligned to its place on the susceptor. The entire upper hanger is aligned in place using the hanger aligner 645.

Figure 7:
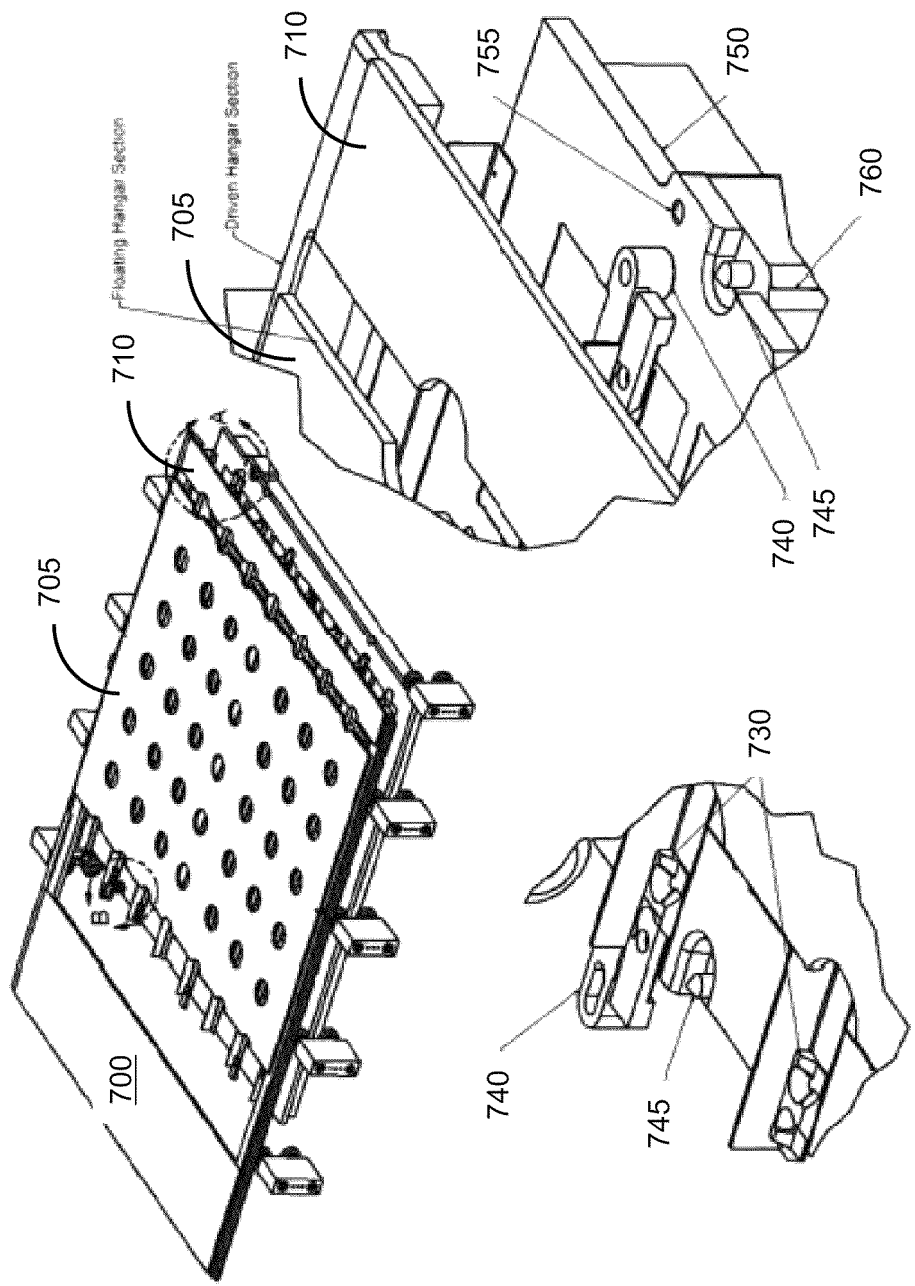
FIG. 7 illustrates details of the upper hanger according to an embodiment of the invention.

FIG. 7 illustrates the details of the upper hanger to show the features used for alignment. In FIG. 7, a hanger alignment orifice 740 mates with a hanger alignment pin 745, so as to align the floating tray 705 of the upper hanger to the susceptor 750. This allows for reduced tolerance in the tray transport mechanism. The transport mechanism only needs to bring the tray so that the orifice 740 is within reach of the alignment pin, such that when the susceptor is raised, the pin catches the orifice and centers the orifice such that the floating tray 705 is aligned to the susceptor. Also, substrate nest 730 are provided so as to precisely seat each substrate within the floating part of the upper hanger. Also shown in FIG. 7 is a susceptor alignment pin 755 that is used to align the susceptor 750 to the heater 760. In this manner, all three parts, the heater, the susceptor, and the tray are "auto-aligned" with respect to each other. Consequently, when the wafers are removed from the tray and placed on the susceptor, they are all aligned to their proper position.

Figure 8:
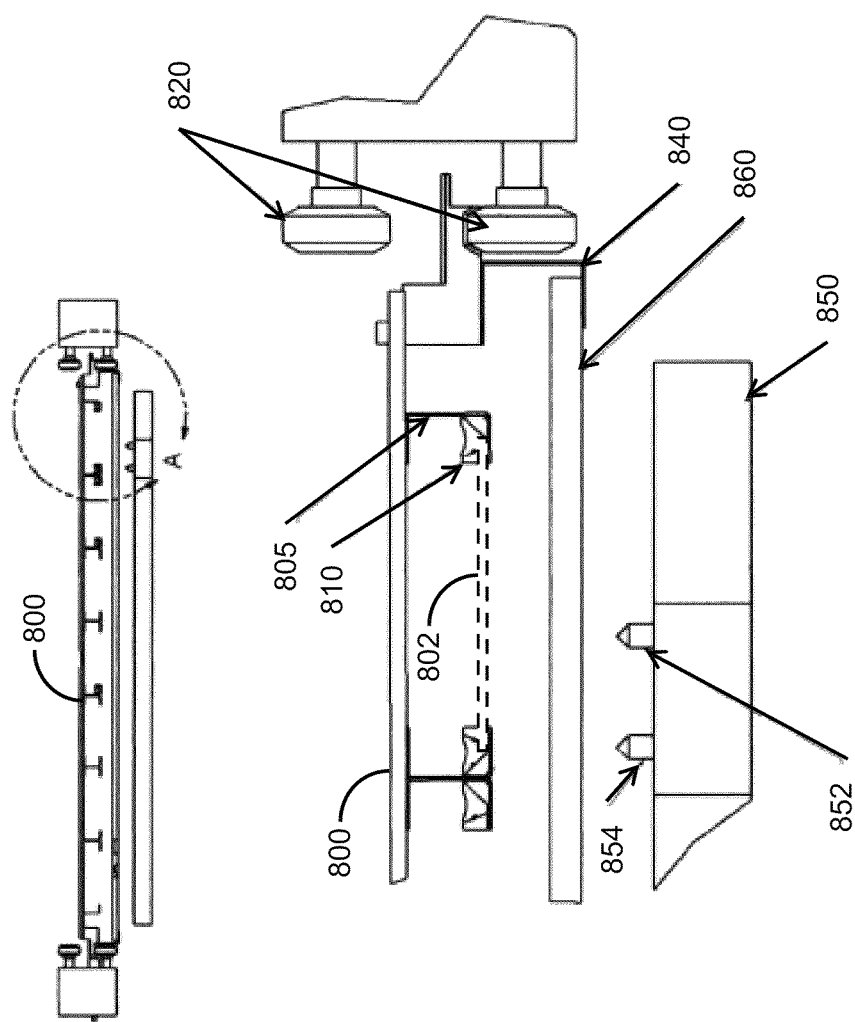
FIG. 8 illustrates susceptor removal feature according to an embodiment of the present invention.

FIG. 8 illustrates another feature of the invention for removal and replacement of the susceptor from within the processing chamber. Notably, in the prior art there are no provisions for removing the susceptor from the chamber other than by opening the lid of the chamber and manually removing the susceptor. This requires the system to be taken offline, cooled to room temperature and opened, "breaking vacuum" such that the chamber is exposed to the ambient and requires system reheating and stabilization as well pumping to vacuum pressure after the susceptor has been replaced. Conversely, according to a feature of the invention, the susceptor can be removed without cooling down the system and opening the chamber and exposing the chamber to the ambient.

As shown in FIG. 8, in this embodiment one of the hangers, in this example the lower hanger 800, includes provisions for removing the susceptor from the processing chamber and out to the load chamber. As explained above, hanger 800 includes a plurality of substrate hooks 805 having substrate "nests" or "seats" 810 that ensure the proper positioning of each substrate (one substrate 802 is shown in broken line for illustration). The hanger 800 rides on rollers 820, some of which may be energized and some idle, as explained with respect to FIG. 4.1 above. The heater 850 includes a susceptor alignment pin 852 and a hanger alignment pin 854 to align the susceptor and hanger as explained above with respect to FIG. 7. The hanger 800 includes a susceptor hook 840 for hooking and carrying susceptor 860. For this operation, the lower hanger 800 is introduced into the processing chamber, the heater 850 together with susceptor 860 are then moved to susceptor removal position, wherein the susceptor engages hooks 840 provided in the lower hanger 800. The heater 850 is then lowered leaving the susceptor 860 hanging on the hooks 840. The lower hanger 800 can then be transported back to the load chamber so that the susceptor can be removed for cleaning or replacement. The cleaned or new susceptor can be loaded onto the lower hanger, and the lower hanger can be transported back to the chamber to deposit the new susceptor onto the heater.

Figure 9:
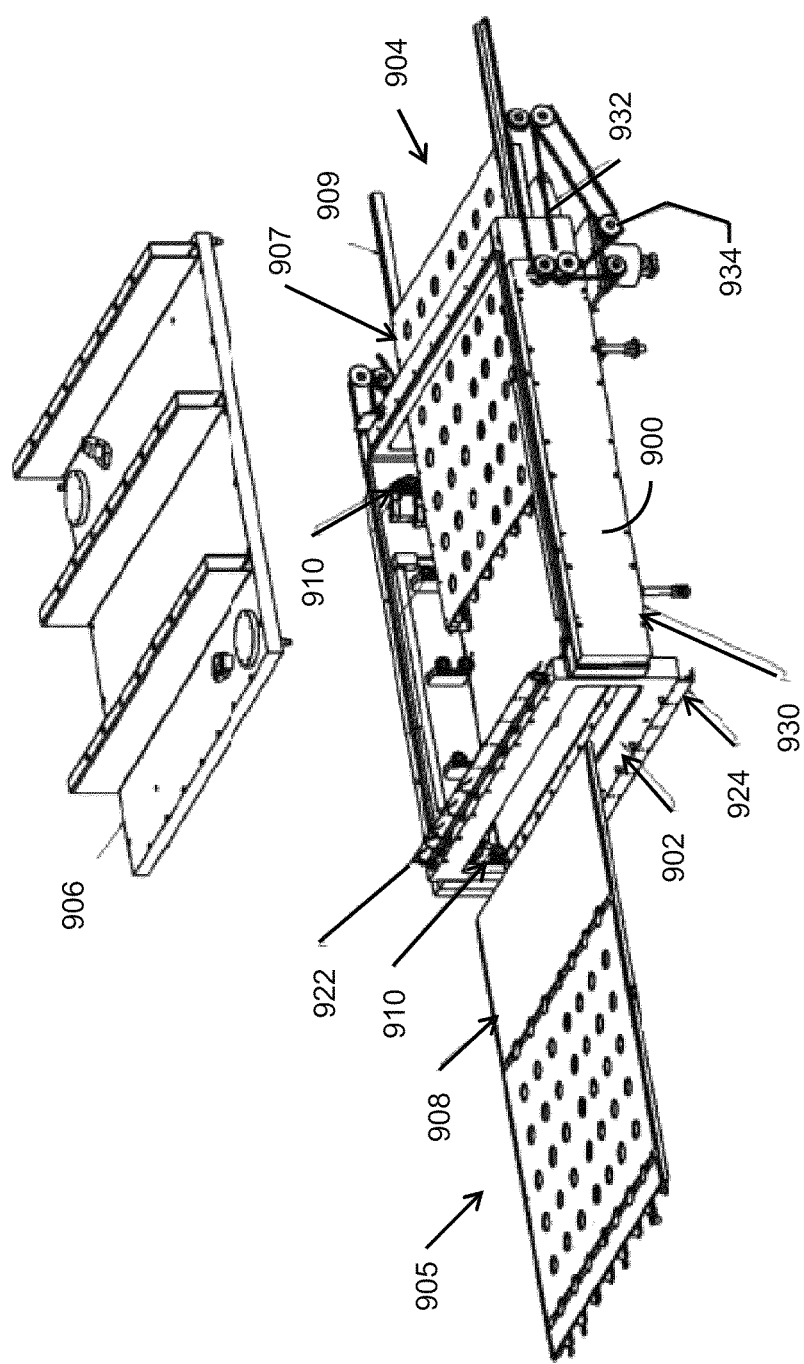
FIG. 9 is a diagram illustrating the loadlock assembly with the upper and lower hangers, according to an embodiment of the invention.

FIG. 9 is a diagram illustrating the loadlock assembly with the upper and lower hangers, 905 and 907, according to an embodiment of the invention. The loadlock assembly comprises a loadlock body 900 having an opening 902, structured to connect to the processing chamber, and opening 904, structured to connect to the load chamber. A vacuum door (not shown) is separates the opening 902 from the chamber, and door 932 separates the opening 904 from the load chamber and is operated by drive 934. The lid 906 is shown removed from the body 900, so as to enable view of the internal parts of the loadlock assembly. Lower hanger 907 has rail extensions 909, while similar extensions of upper hanger 905 are obscured from view by the stationary tray 908. The drive extensions enable driving the hangers in and out of the processing chamber without having to provide active drives within the processing chambers so as to avoid contamination. That is, the drive motion is provided from the loadlock chamber by having drive rollers 910 (driven by drive assembly 930) engage the extensions. In order to synchronize the motion of the hangers, a single motor is used, which drives the various drive rollers using chains and/or direct drive.

FIG. 9 also illustrates the upper sensor array 922 and lower sensor array 924, which is used to detect the presence or absence of substrate in each substrate location on either upper or lower hangers. In this embodiment a linear sensor array is provided, which is activated to detect wafers each time the sensor trigger is detected, as explained with respect to FIG. 5.

Figure 10:
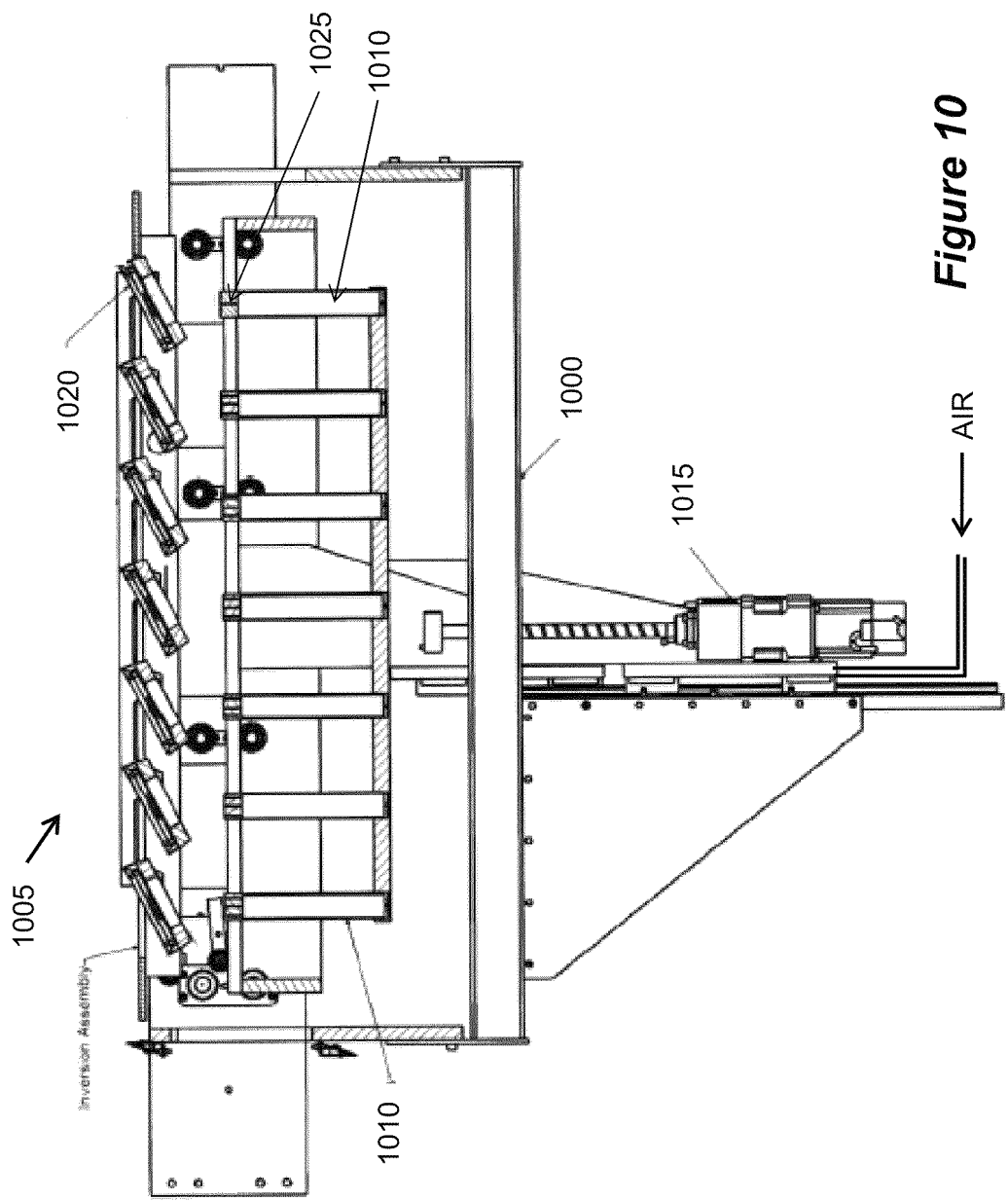
FIGS. 10-12 illustrate embodiments of the substrate flipping or inverting assembly according to an embodiment of the invention.
Figure 11:
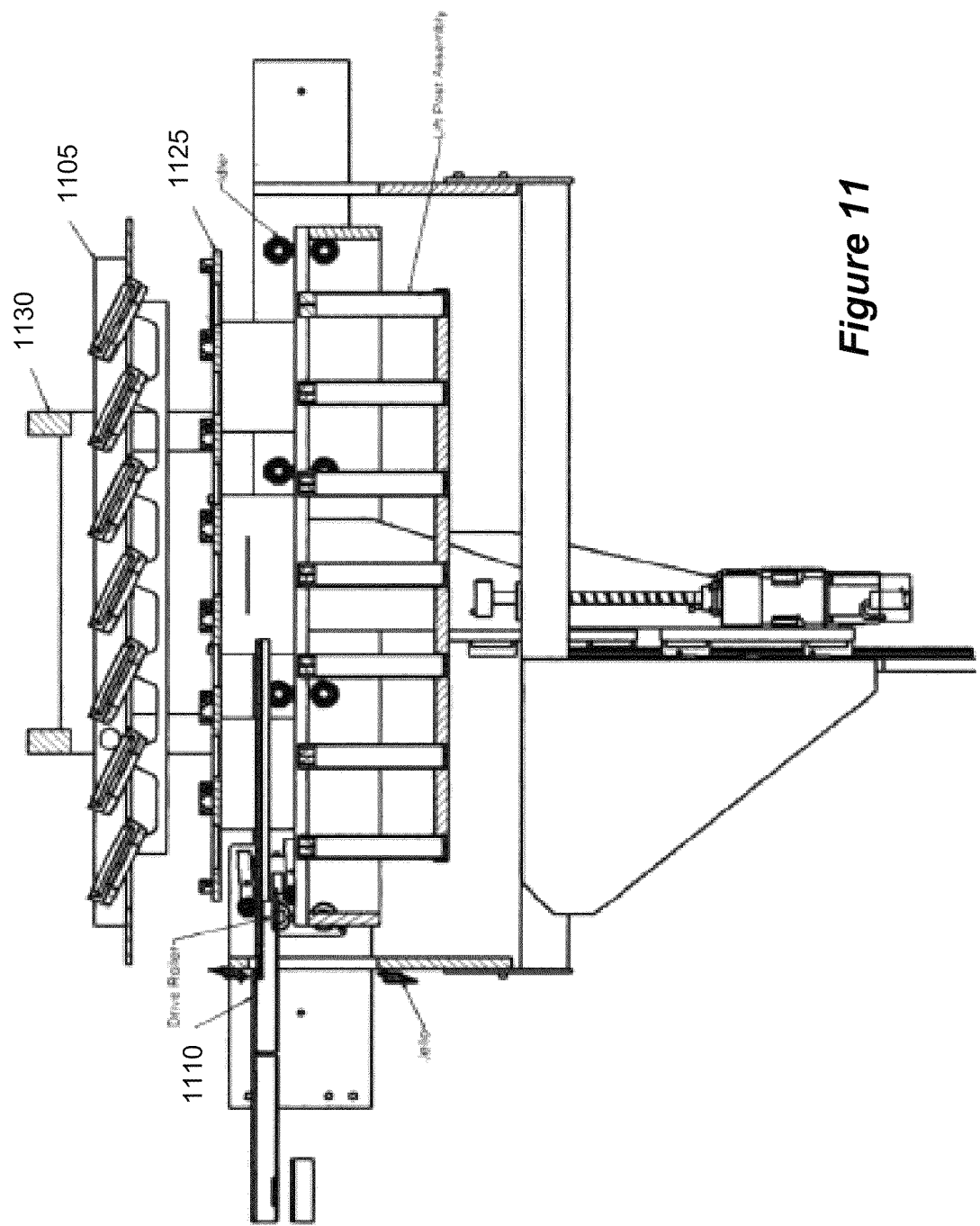
Figure 12:
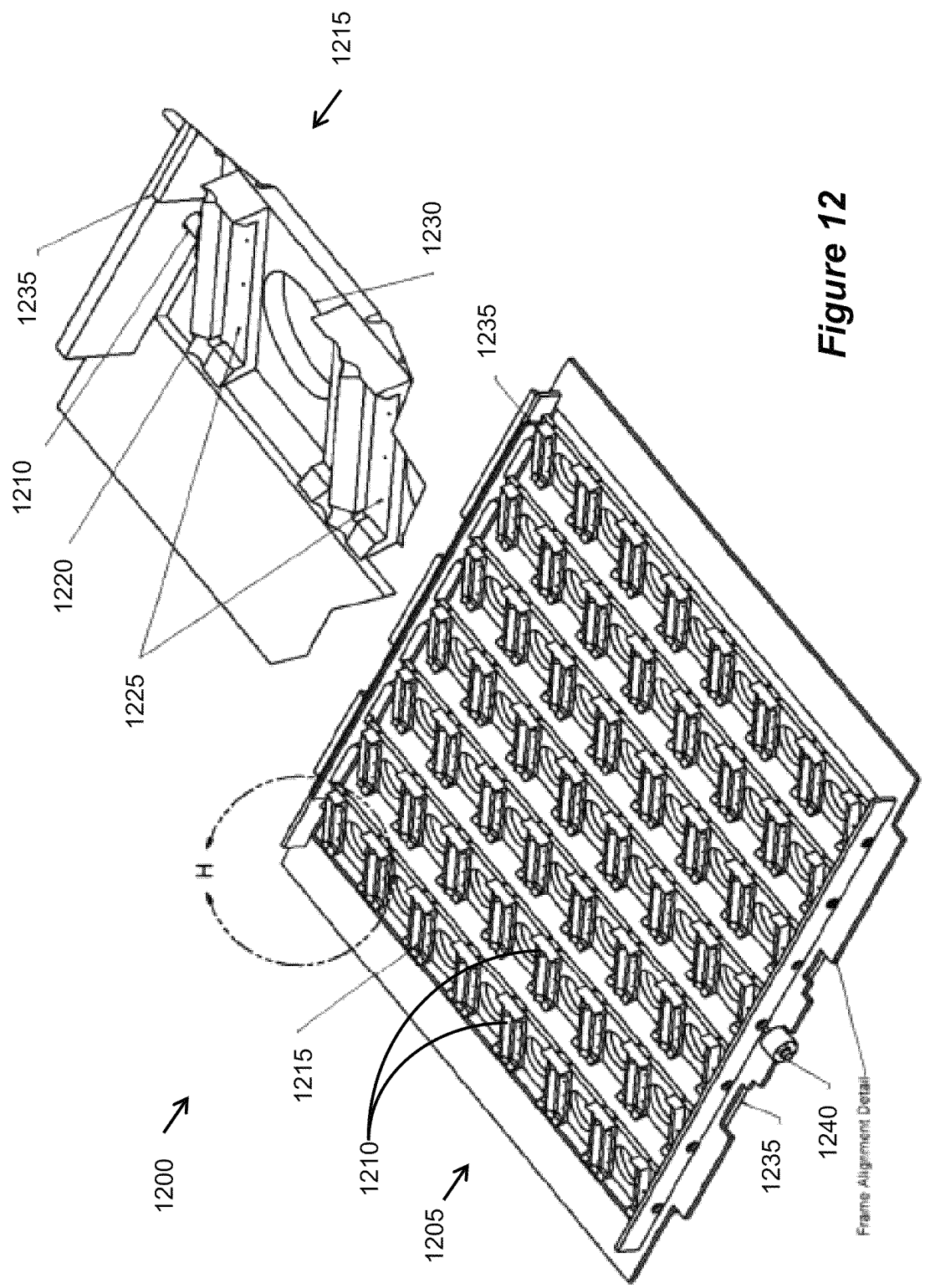

FIGS. 10-12 illustrate embodiments of the substrate flipping or inverting assembly that can be provided independently of the system disclosed herein. In the embodiment shown in FIGS. 10-12 the flipping assembly 1005 is provided over one of the loading chambers 1000. In FIG. 10 the flipping assembly 1005 is illustrated without a hanger, while FIG. 11 illustrates the system with the hanger 1110. Also, FIG. 11 illustrates a loading tray 1125 for embodiments where wafers are also loaded/unloaded from the loading chamber having the flipper. In this case, the flipping mechanism 1105 is coupled to a z-drive assembly 1130, which lifts the flipping mechanism 1105 when a loading tray 1125 needs to be introduced, and lowers the flipping mechanism 1105 for a flipping operation. The z-drive assembly can also be provided in the embodiment of FIG. 10 and used as a "crush avoidance" mechanism, i.e., if the sequence somehow strays and the posts 1010 are raised before the flipping is completed, the z drive can raise the flipping mechanism to avoid collision between the posts and the flipping mechanism or the wafers.

Returning to FIG. 10, lift posts 1010 are used to lift wafers from the hanger and deposit them onto the flipping mechanism and conversely remove wafers from the flipping mechanism and deposit them onto the hanger. The lift posts are actuated by lifting mechanism 1015. The flipping assembly 1005 includes a plurality of individual wafer holders 1020, each holding one wafer using vacuum, although other means can be provided for holding the wafers, such as mechanical clamping. As shown in FIG. 10, air pressure is supplied into a manifold delivering the air to each post 1010. Each of the posts 1010 has an orifice 1025 through which air blows to form a cushion for the wafer when the wafer is released from the vacuum of its flipping holder 1020. In this way, the release of the wafer onto the post can be done very delicately so as to avoid breakage. This can be sequenced so that after the wafers have been flipped, the posts are raised and the air cushion is activated. The vacuum is then terminated such that the wafers fall onto the cushion. The air pressure is then slowly reduced until it is off, so that the wafer seats securely on its post.

FIG. 12 illustrates the flipping assembly 1200 in more details. Flipping assembly 1200 comprises a frame 1205 to which several rows of flipping pivots 1210 are rotatably attached. All of the pivots are connected together to synchronous links 1235 so that they are all rotated together by rotation drive 1240. On each pivot 1210 several substrate holders 1215 are attached, each holder 1215 having seats 1220 for properly holding and aligning the wafers. The details in FIG. 12 illustrate the seats 1220 for each substrate, in this case square or rectangular substrates, with a nesting mechanism having vacuum holes 1225 that assists in alignment and holding of the substrates. Each substrate holder also has access port to provide access to the lift post to enable lifting of the substrate form the substrate holder.

Figure 13:
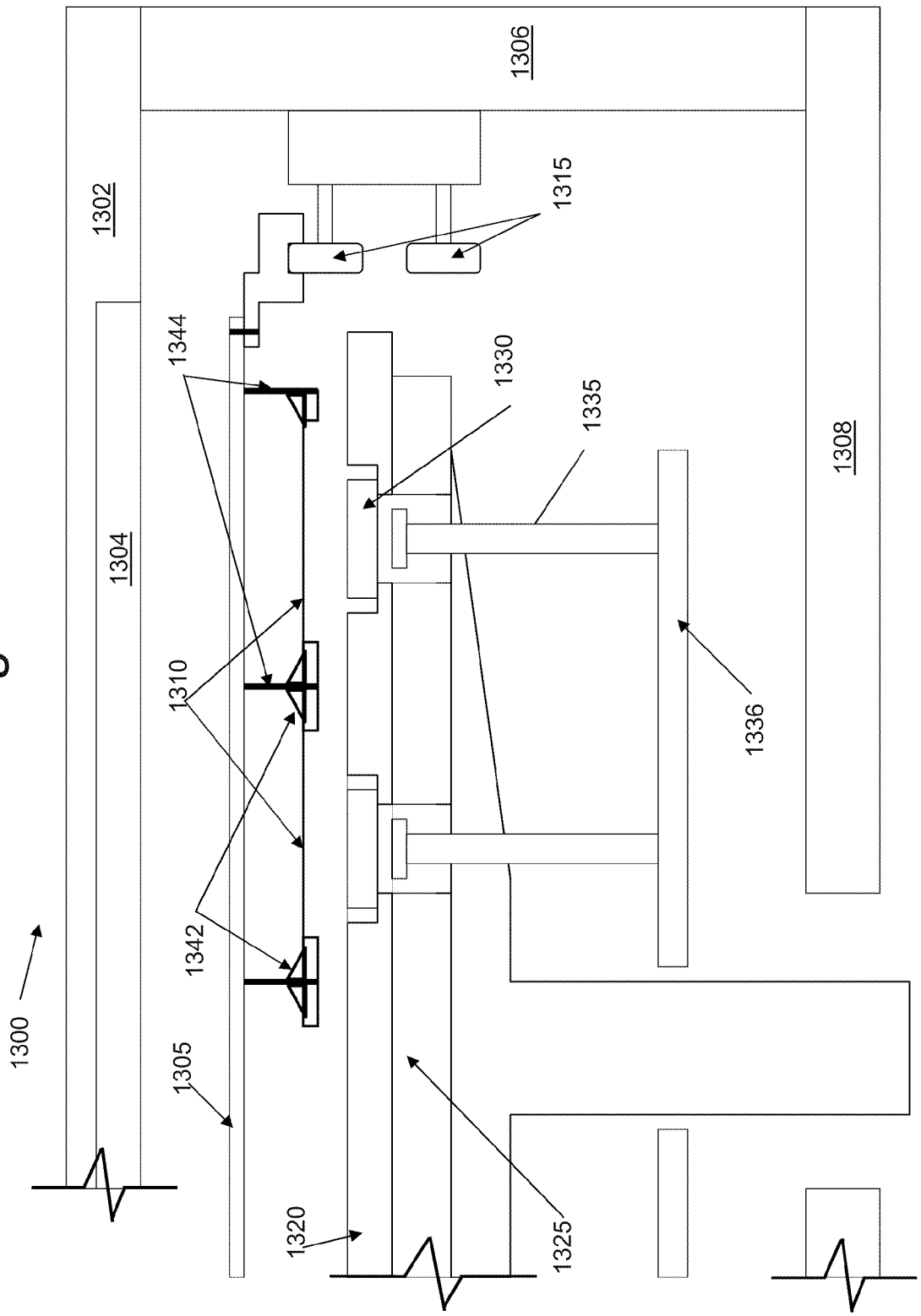
FIGS. 13-19 illustrate a cross-section of the processing chamber in various loading/unloading positions.

FIG. 13 illustrates a partial cross-section of the processing chamber 1300 according to an embodiment of the invention, showing the showerhead assembly 1302 with the showerhead plate 1304, the sidewall 1306, and floor 1308. An upper hanger 1305 with substrates 1310 is illustrated at its position inside the chamber. Note that for illustration purposes wafers 1310 are shown on only a couple of the positions available on the hanger 1305, but normally all of the available positions will be filled with wafers. The wafers are seated within alignment pockets 1342 that are provided on the hanging posts 1344 of each hanging position. This ensures that each wafer is properly aligned and seated within its position on the hanger. FIG. 13 illustrates the position when new wafers are just brought into the processing chamber, or the position where the processed wafers are just about to be taken out of the processing chamber. As mentioned above, the hanger 1305 rides on idler roller 1315 and is driven using extensions that engage drive rollers (not shown in FIG. 13). Susceptor 1320 is positioned on pedestal 1325, which in this embodiment also includes a heater which heats the susceptor and, thereby the substrates. The susceptor has ports, one at each wafer location, and pucks 1330, one positioned within each port. Also, as shown in FIG. 13, lift pins 1335 are positioned for lifting each substrate using the pucks 1330. That is, in this embodiment, the lift pins 1335 do not engage the substrates directly, but rather lift the pucks 1330 from the susceptor to engage the substrates. The lift pins 1335 are actuated together by the lift mechanism 1336. Note that in this and following illustration only a couple of lift pins 1335 are illustrated, but in reality each wafer position will have a lift pin.

Figure 14:
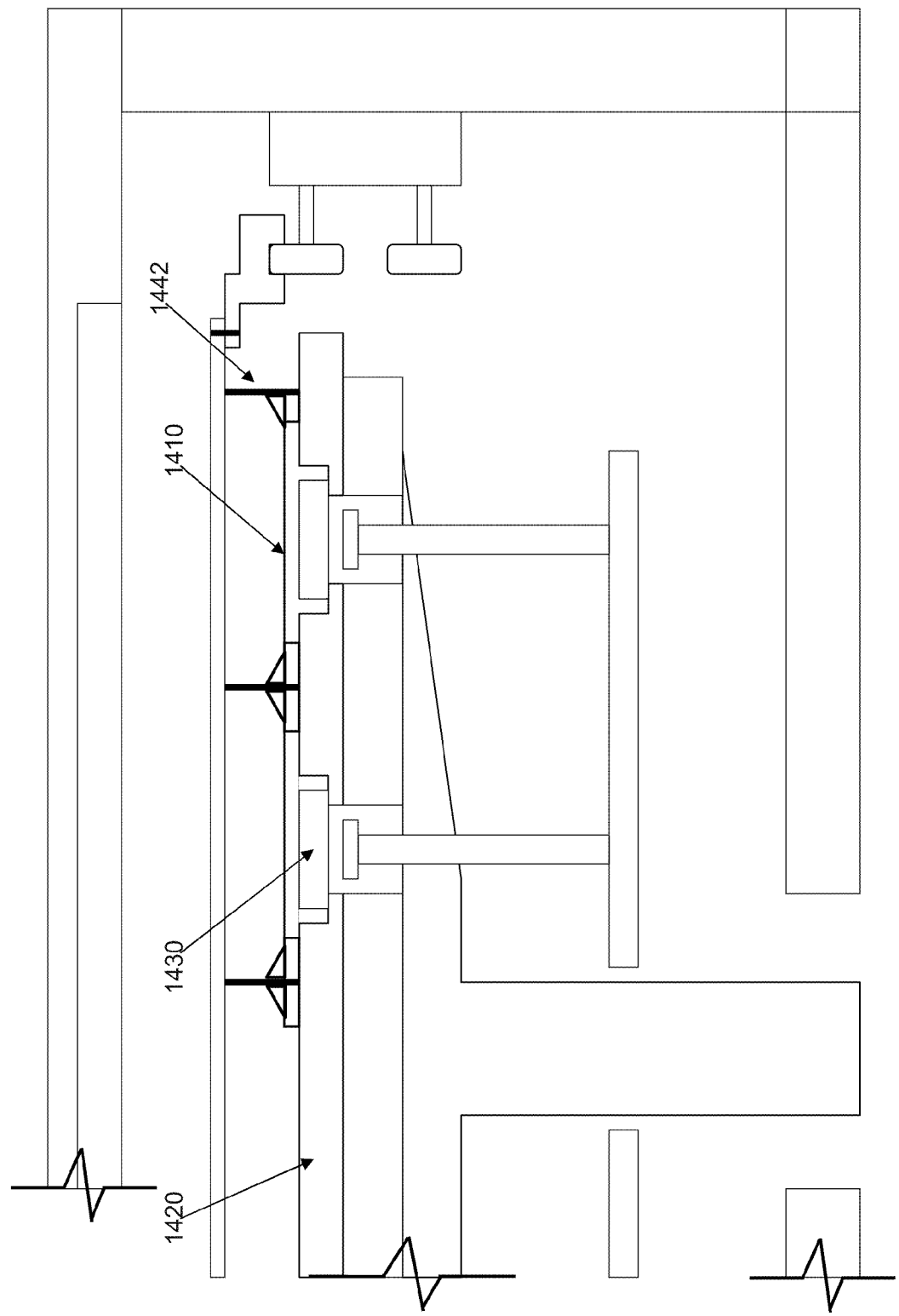

FIG. 14 illustrates a cross-section of the processing chamber showing the susceptor 1420 lifted so as to touch the hanging extensions 1442 of the upper hanger. This is the position when the new wafers are just about to be transferred from the hanger to the susceptor, or the position where the processed wafers were just transferred from the susceptor into the hanger. As shown, the pads or pucks 1430 are just under the wafers 1410.

Figure 15:
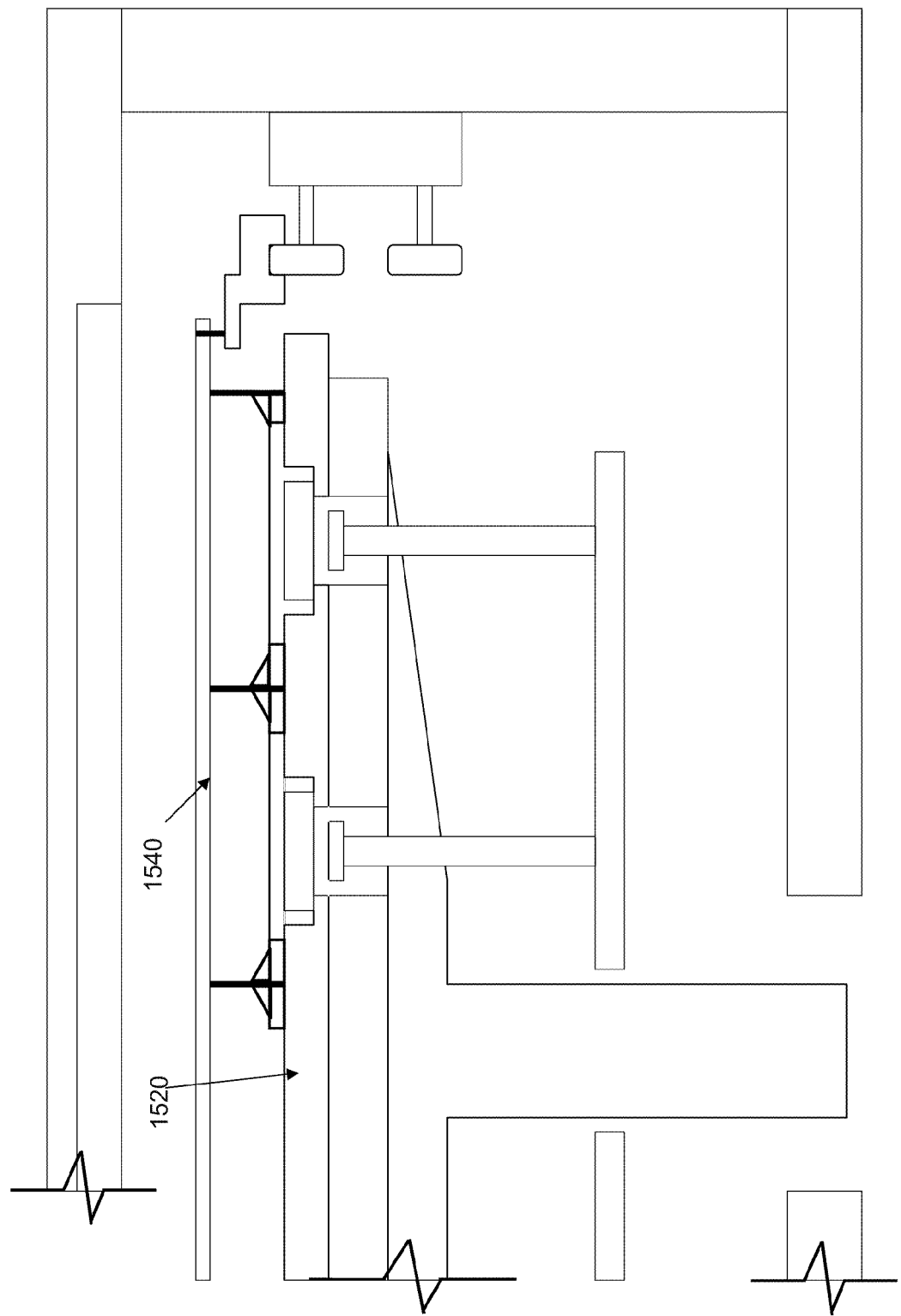
Figure 16:
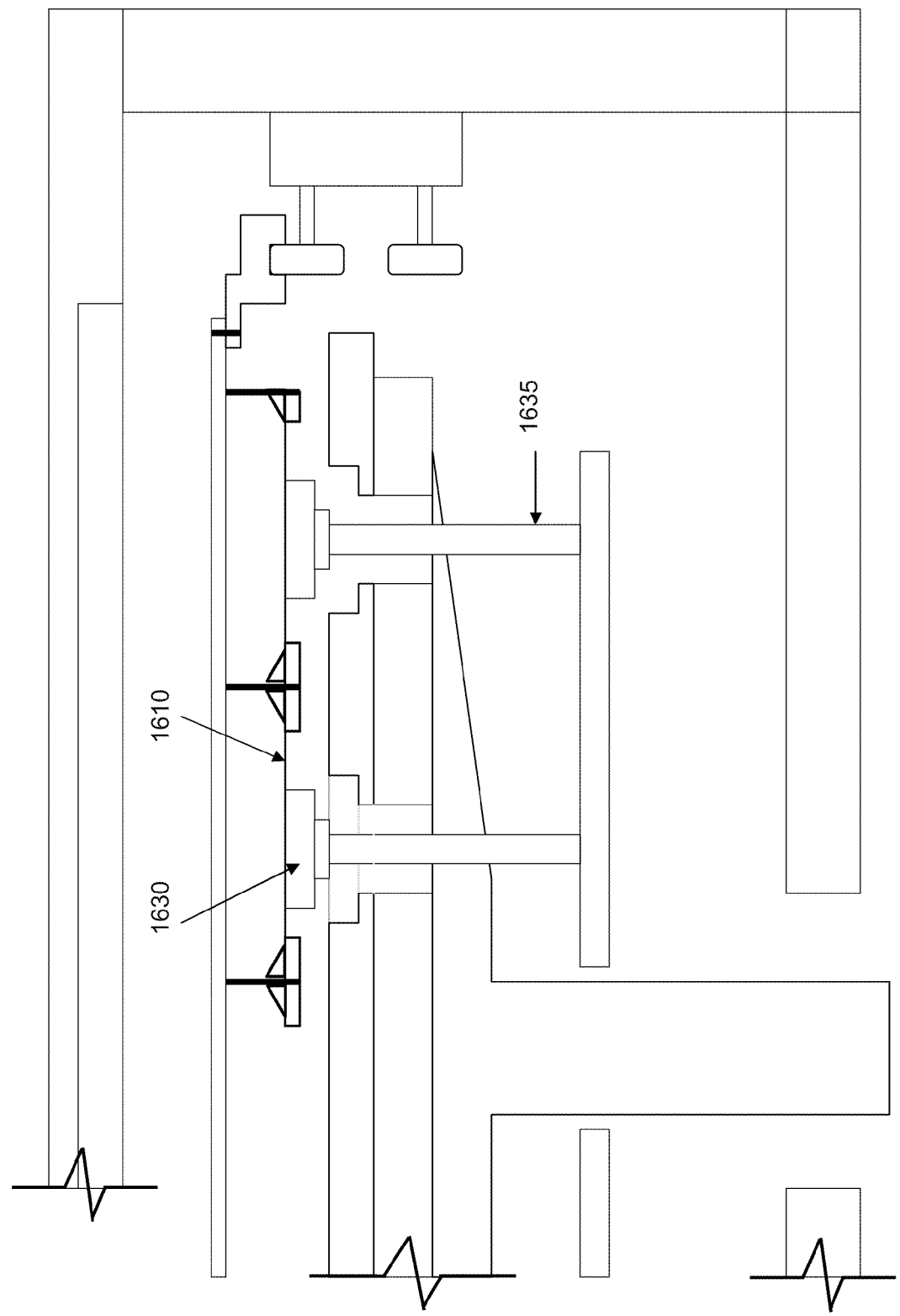
Figure 17:
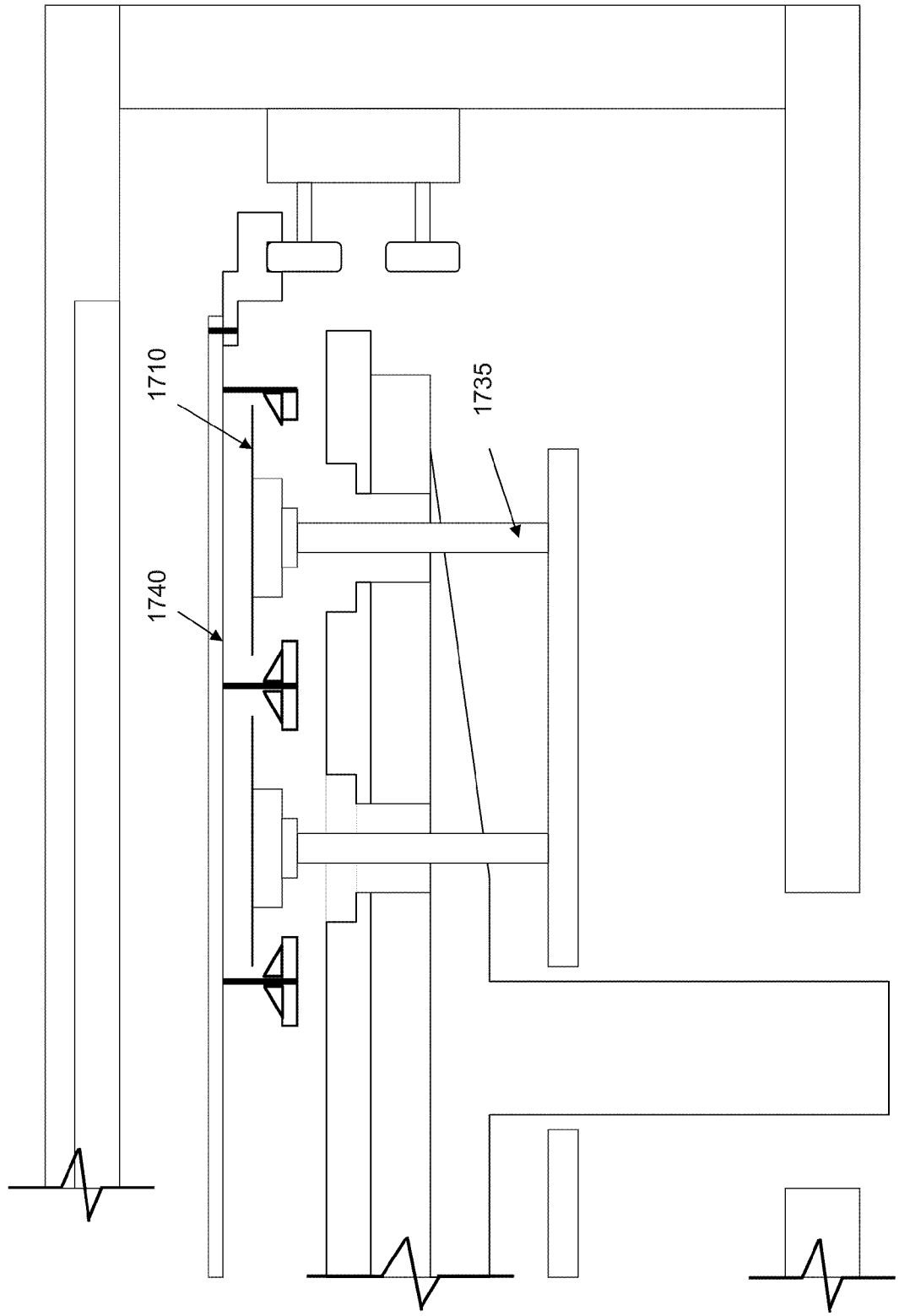
Figure 18:
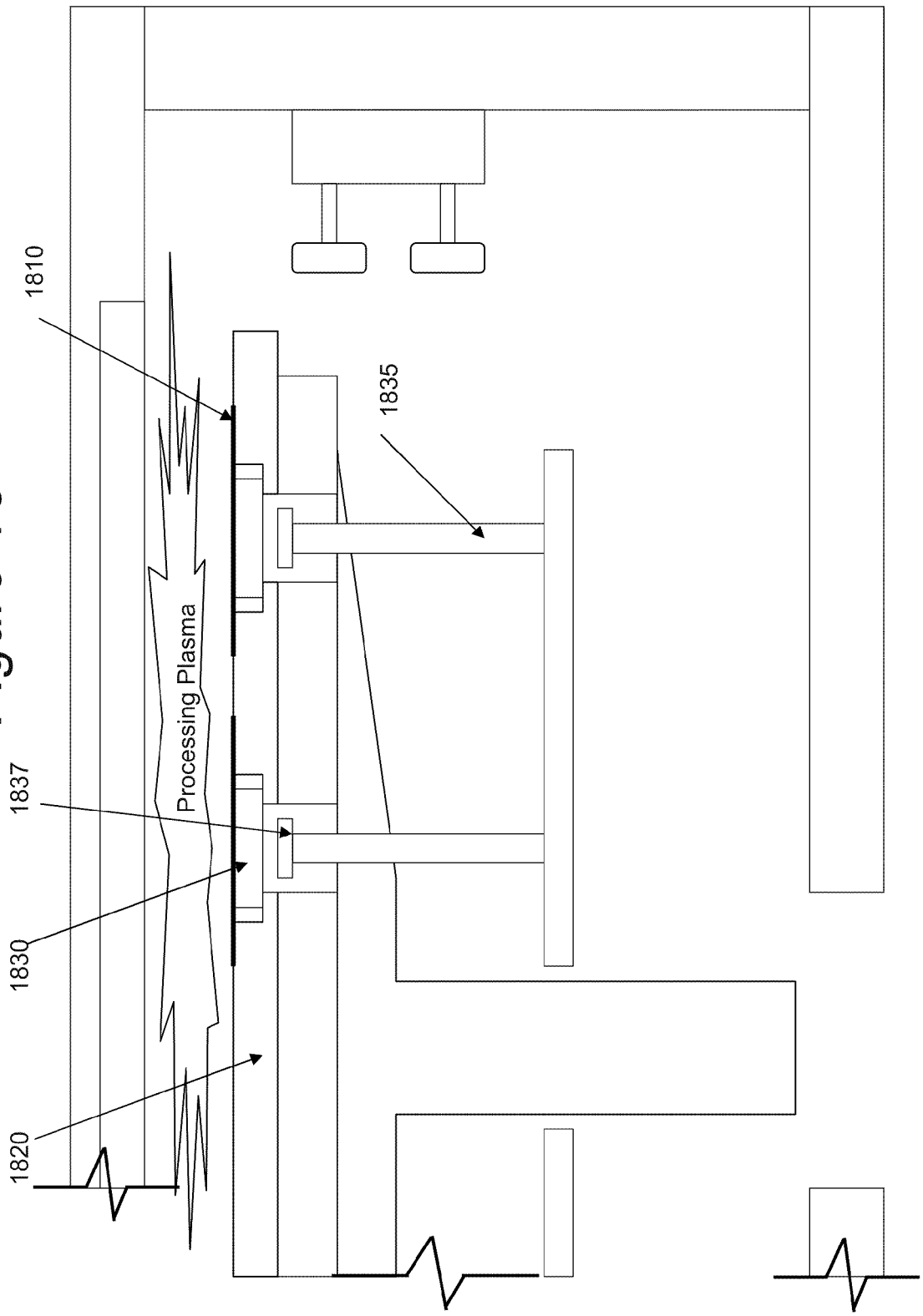

In FIG. 15 the floating part 1540 of the upper hanger is lifted slightly by the susceptor 1520 so as to align it with the susceptor 1520 using the alignment pin as described above. The susceptor 1520 is then returned to the position shown in FIG. 13 and, as illustrated in FIG. 16, the lift pins 1635 are moved to the upper position, lifting the lift pads 1630 and contacting the substrates 1610 prior to lifting the substrates 1610. FIG. 17 illustrates the lift pins 1735 in their extended position, lifting the substrates 1710 off of the upper hanger 1740. The upper hanger is then removed from the processing chamber and, as shown in FIG. 18, the susceptor 1820 is raised to its upper processing position, having the substrates 1810 deposited thereupon. As shown, the lift tops 1837 of the lift pins 1835 is lowered a bit, so that the pucks 1830 rest in their seats below the wafers.

Figure 19:
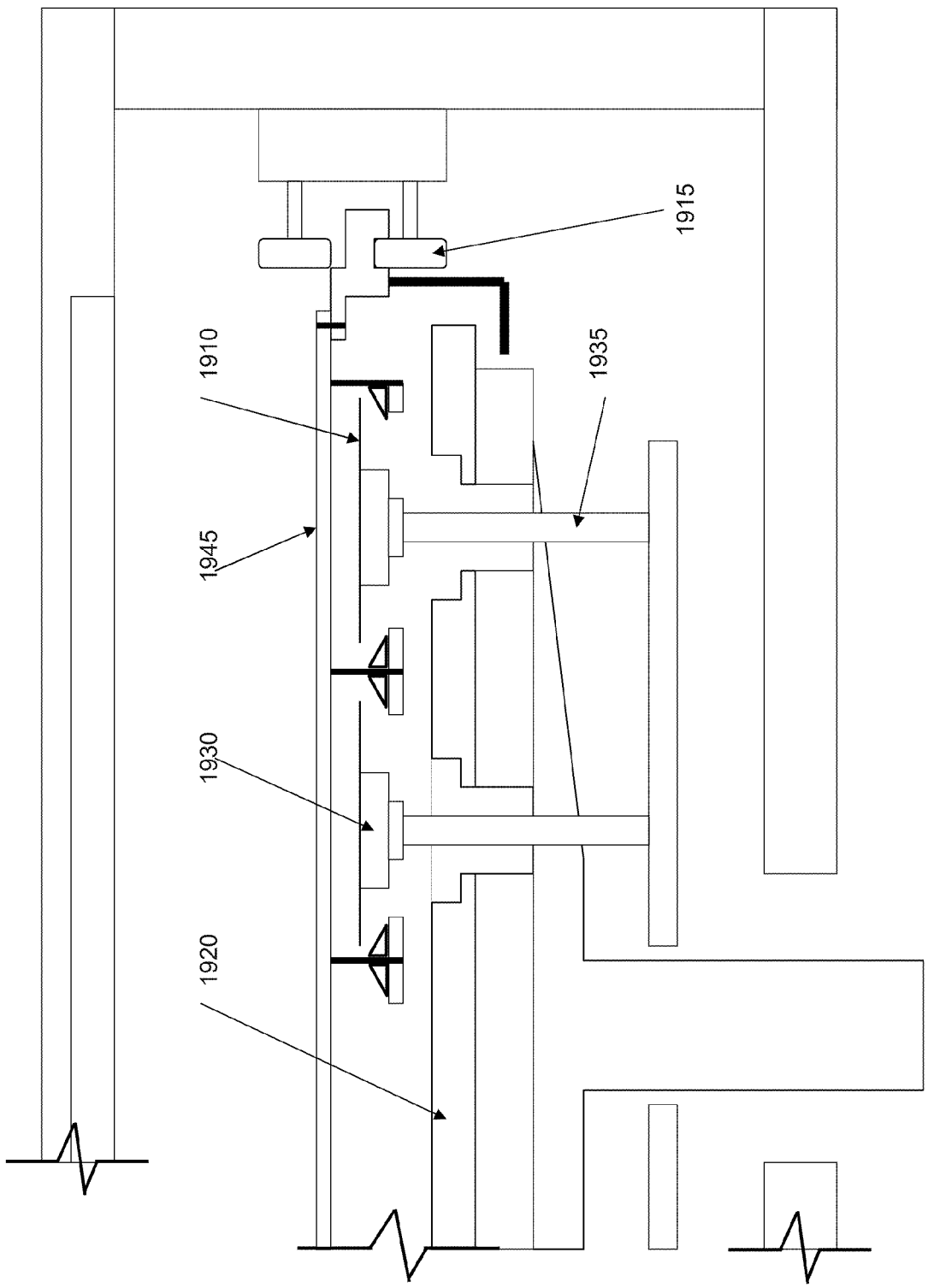

FIG. 19 illustrates the susceptor 1920 in its unloading position, with the lift pins 1935 extended so as to engage the lift pads 1930 and remove the substrates 1910 from the susceptor 1920. The lift pins 1935 are then lowered so as to deposit the wafers 1910 onto the lower hanger 1945 for removal of the substrates 1910 from the processing chamber. As shown, the lower hanger 1945 rides on the lower idle rollers 1915.

Figure 20:
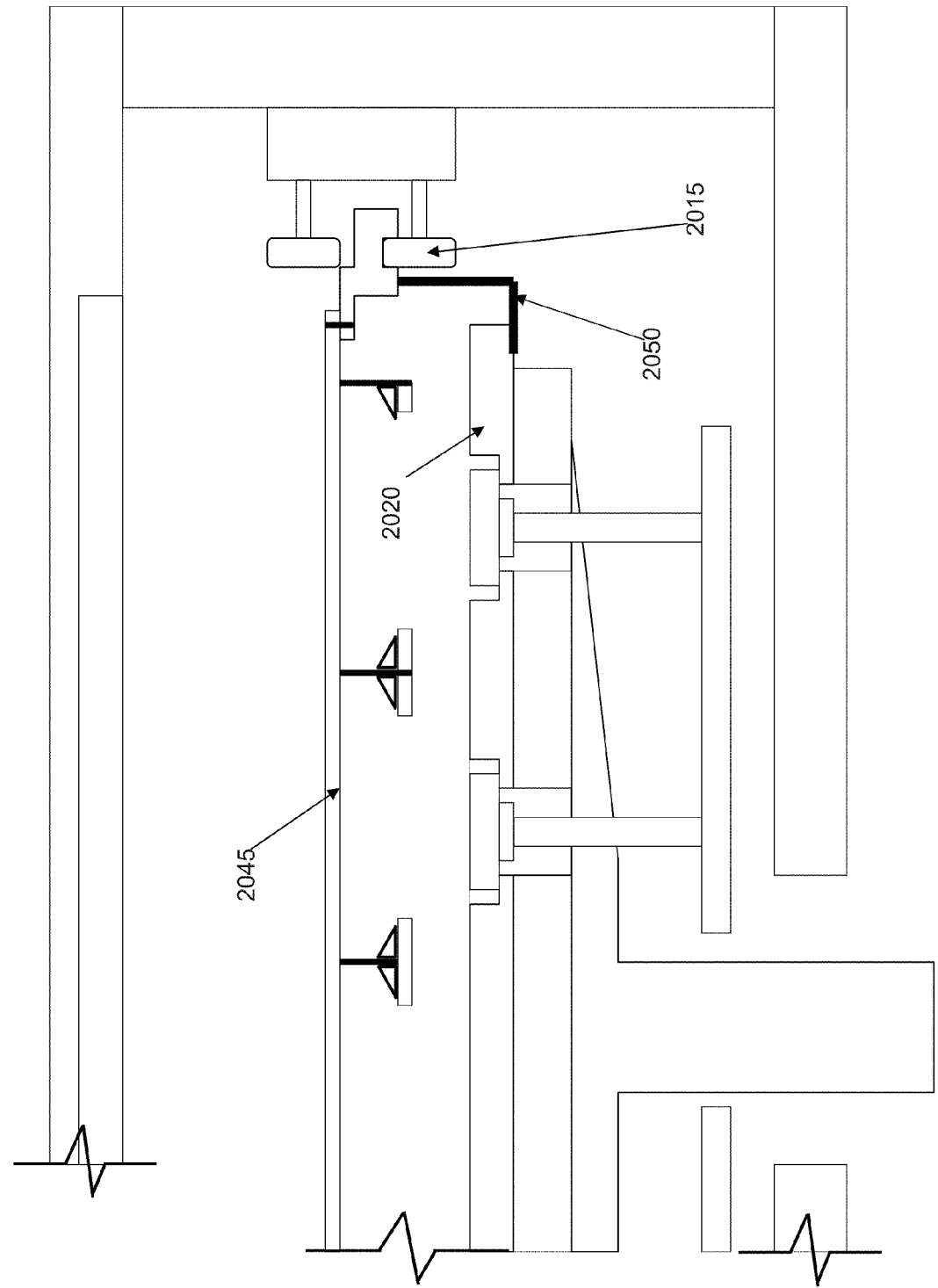
FIGS. 20-21 illustrate a cross-section of the processing chamber in various susceptor loading/unloading positions.
Figure 21:
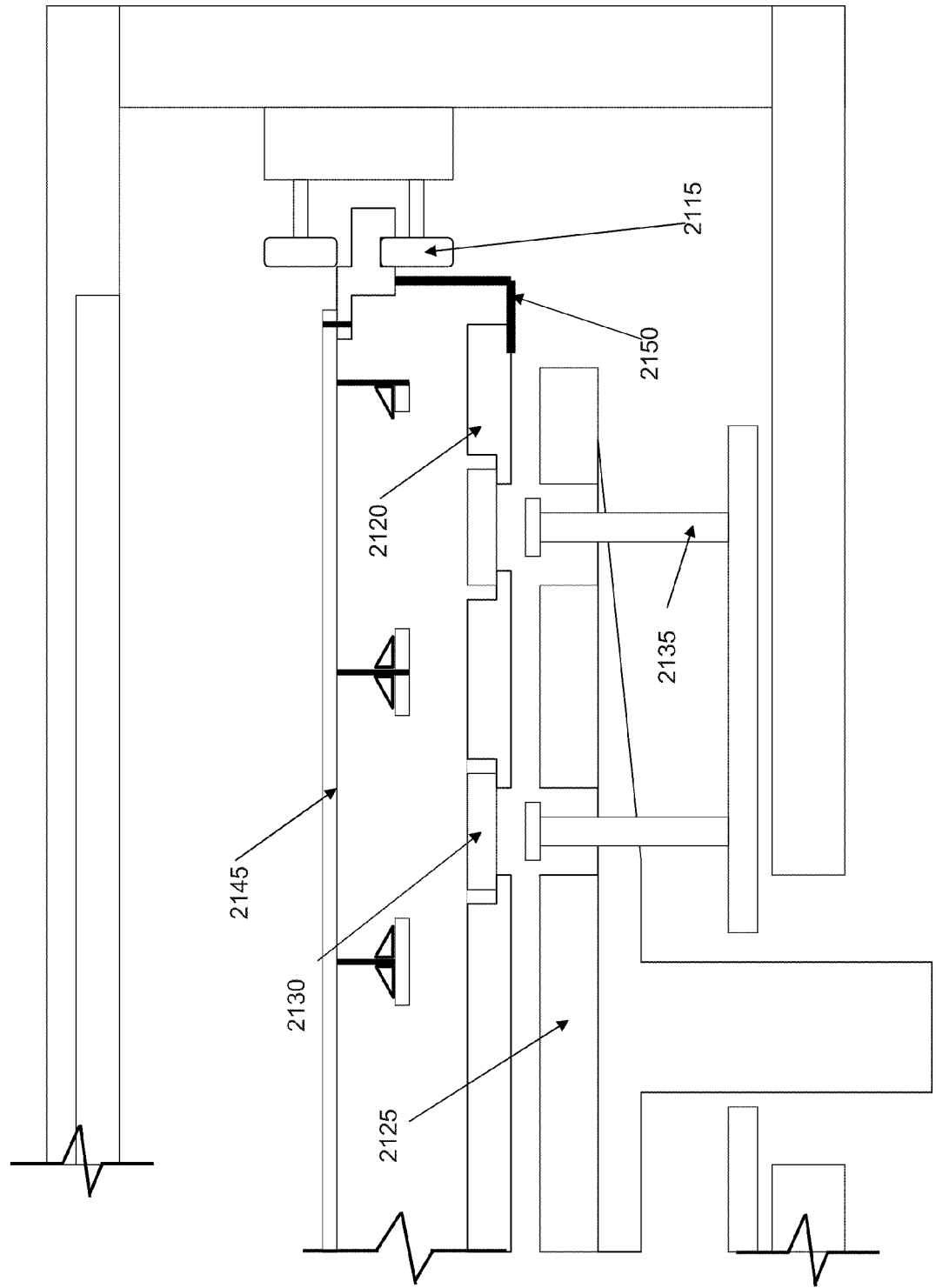

FIGS. 20-21 illustrate a cross-section of the processing chamber in various susceptor loading/unloading positions. As described above, a feature of the subject invention is the ability to remove the susceptor without having to open and expose the chamber to ambient atmosphere. This operation can be performed whenever the susceptor requires servicing. Also, this operation is beneficial when a wafer breaks inside the processing chamber. As can be appreciated, when a wafer breaks inside the processing chamber its parts would be deposited on the susceptor. Using the following operation, the susceptor can be removed so that it could be cleaned of the broken pieces and returned to the chamber. In this manner, the chamber need not be opened when a wafer breaks.

In FIG. 20 the lower hanger 2045 has been introduced into the processing chamber, riding on idle roller 2015. The susceptor 2020 is lowered onto the susceptor hooks 2050 that are provided on the lower hanger 2045. In FIG. 21 the pedestal 2125 is lowered so as to disengage from the susceptor 2120. As shown, the lift pads, or pucks 2130 remain with the susceptor 2120, while susceptor 2120 is held by the hooks 2150. The lower hanger 2145 can then be driven out of the chamber for removal of the susceptor. This enables replacement or cleaning of the susceptor without having to open the processing chamber. Moreover, a replacement susceptor can be loaded from the other side of the system, such that the system can continue to operate. In fact, according to one embodiment replacement susceptor can be parked in one or both load chambers for use when needed.

Figure 22:
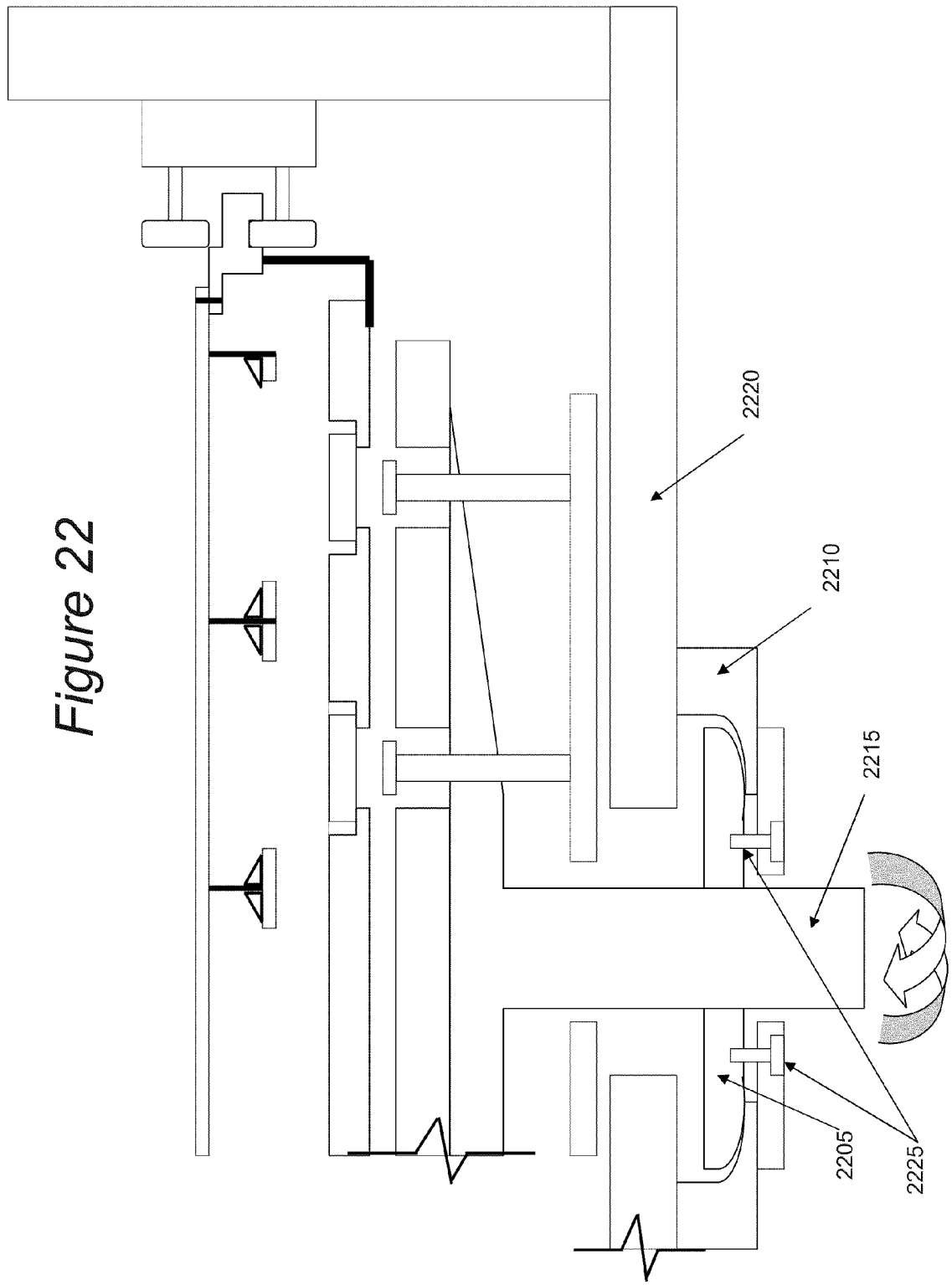
FIG. 22 illustrates a cross section of the processing chamber, showing an alignment feature according to an embodiment of the invention.

When the processing chamber is rather large, it may be required to ensure that the susceptor is positioned accurately parallel to the showerhead. This is especially true when the susceptor is moved vertically for loading/unloading and for processing. FIG. 22 illustrates a cross section of the processing chamber, showing an alignment feature according to an embodiment of the invention. In FIG. 22, a spherical seat 2210 is attached to the bottom plane 2220 of the chamber. The seat 2210 has a cut in the shape of a part of a sphere of a given diameter. The lifting mechanism that supports the susceptor has a matching spherical core 2205, that "rides" on the spherical seat 2210. This enables a slight tilting of the lifting assembly 2215 until the susceptor is accurately parallel to the showerhead, as shown by the double-head curved arrows. Then the anchoring bolts 2225 are tightened so that the lifting assembly is anchored in the desired tilted position.

Figure 23:
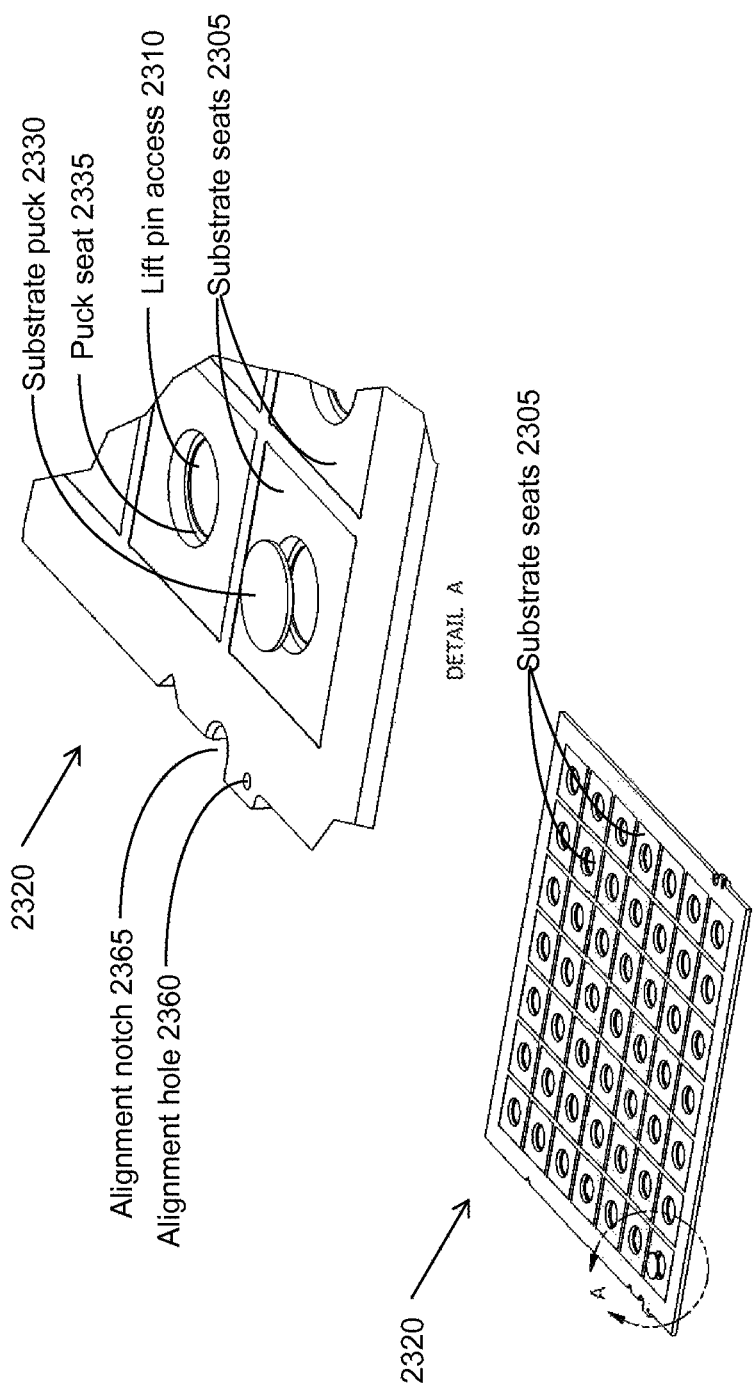
FIG. 23 illustrates an embodiment of a susceptor according to the invention.

FIG. 23 illustrates an embodiment of a susceptor according to the invention. As shown in FIG. 23, the susceptor 2320 is generally a rectangular plate having a plurality of substrate seats 2305. Each substrate seat 2305 has a lift pin access opening 2310 for a lift pin to access and engage a substrate pad or puck 2330. Each puck is seated in a puck seat 2335 that is formed in the susceptor outside of the pin access opening 2310. A lift pin is used to lift the substrate pad 2330 and thereby lift each individual substrate off of the susceptor. Also shown in FIG. 23 is the hole 2360 for aligning the susceptor to the pedestal, and a notch 2365 that enable the hanger alignment pin to pass through and engage the upper hanger's alignment orifice.

Figure 24:
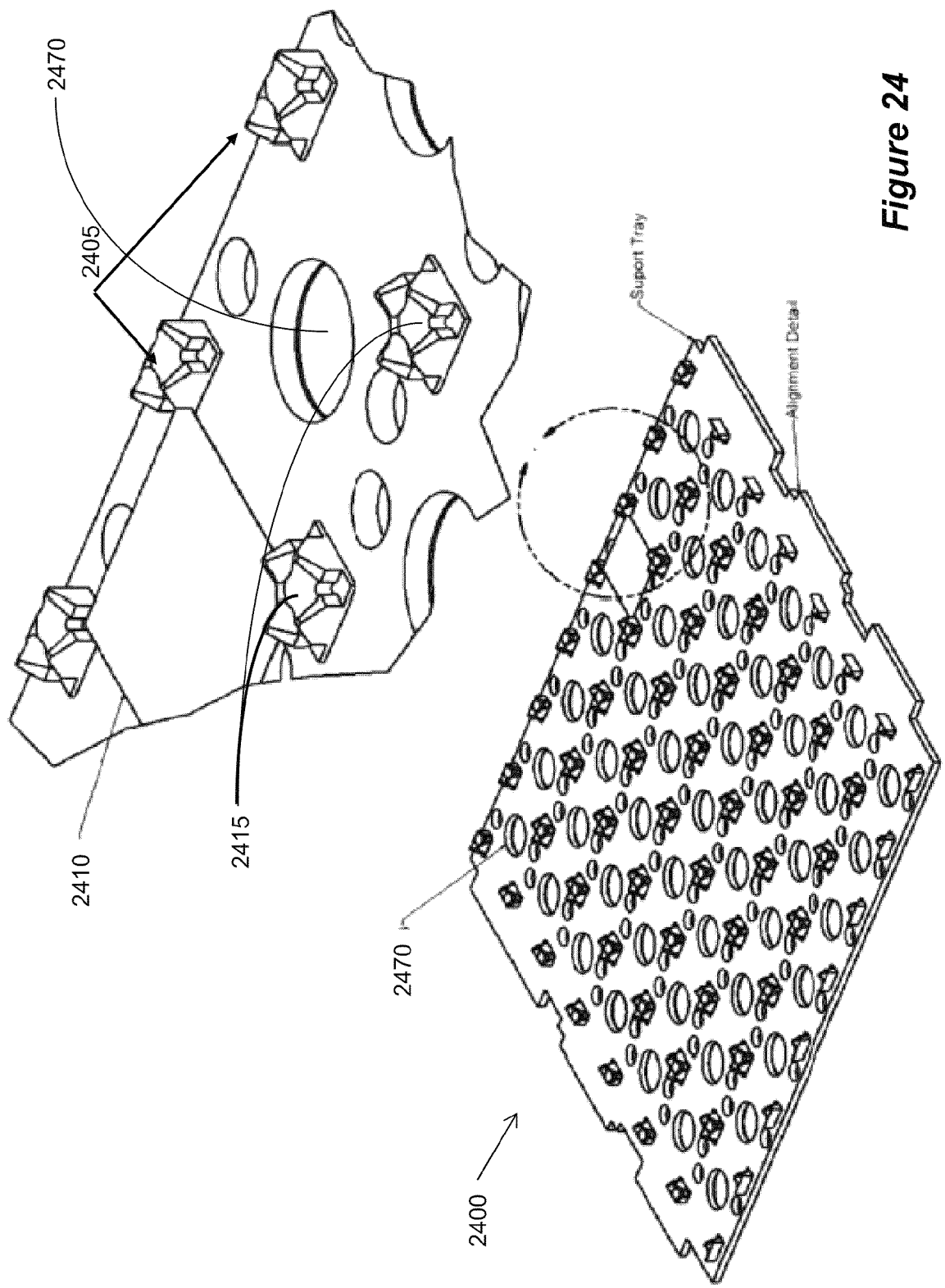
FIG. 24 illustrates a tray that can be used in the load chambers of the various embodiments of the invention.

FIG. 24 illustrates a tray 2400 that can be used in the load chambers of the various embodiments of the invention. The tray 2400 is generally a plate having substrate nests 2405, 2415 for each substrate location. The nest comprises four nest elements 2415 structured to center the substrate in its nest. It should be appreciated from FIG. 24 that each nest element 2415 serves four wafer positions, except for those provided at the edge of the tray 2405. Nest elements 2405 at the edge of the tray 2400 may serve one or two wafer locations. In the detailed illustration of FIG. 24 a substrate 2410 is shown seated in its nest. Also, in the middle of each substrate seat there is an access hole 2470 to allow for lift pins to lift the substrate from the tray.

FIG. 25 illustrates another feature of the invention which enables detection of wafer breakage inside the processing chamber. According to this feature, a digital camera is used to take an image of the wafers inside the processing chamber, and then the image is processed to check for wafer breakage. In FIG. 25 processing chamber 2500 is shown schematically in an outline form. A vacuum door assembly 2505 is also shown schematically in outline form. Cameras 2510 are positioned within the vacuum door assembly 2505 such that when the door opens, the cameras can take an image of the interior of the chamber. The broken lines illustrate the field of view of each camera. When processing is finished inside the processing chamber 2500, the door is opened to remove the wafers. Before a tray is moved in, the cameras are activated to take an image of the wafers inside the chamber, so as to determine whether there is any broken wafer inside the chamber. If so, the lower hanger can be moved in to remove the susceptor, as explained above.

It should be appreciated that placing two cameras inside the vacuum door assembly is but one example and the number of cameras and their placement may vary. The main idea here is to capture an image of the wafers before they are removed from the chamber, so as to determine whether any wafer is broken. Another example is shown in FIG. 25 where three cameras 2510' are placed on the side of the chamber body and view its interior via windows 2515. Similar arrangement can be provided on the other side of the chamber.

The images from the cameras are sent to processor 2520 for processing. Processor 2520 first transposes and/or corrects the image from the camera's view angle to normal coordinates, since the image has a perspective dictated by the angle of view of the camera. In this operation the processor may remove lens distortion and calibrate the image for constant size and orientation. The processor then identify the expected wafer locations and then detect whether wafers are actually present in the expected locations. The processor then inspect each identified wafer to classify it as broken or not. The processor may repeat this process for a number, N, or cameras in an array and may also repeat this process a number, M, of camera positions. Alternatively, the images from the camera can be simply sent to a display 2530 for an operator to view and determine whether there are any broken wafers. Of course, the images can be sent to both a processor and a display, so that the operator acts as a control or verification of the processor's determinations whether a broken wafer is present or not. Moreover, the camera can also be used to take an image before processing starts within the chamber, so as to ensure that all of the wafers are properly seated on the susceptor. As can be appreciated, if a wafer is not properly seated on the susceptor, it may cause plasma arching.

Also, illumination mechanism 2535 is provided that illuminates the interior of the processing chamber when an image is taken. The illumination mechanism 2535 may be in the form of an independent light source, such as LED, flash light, etc., which is provided with its own window. Alternatively, the illumination mechanism can be in the form of LED's provided around each camera and having similar field of view as the camera. In yet another embodiment, the illumination is directed towards the ceiling of the chamber, so as to reflect from the showerhead. In this manner, light is distributed evenly inside the chamber.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. An inline substrate processing system, comprising:
a vacuum processing chamber;
a first loadlock chamber coupled to a first side of the vacuum processing chamber;
a second loadlock chamber coupled to a second side of the vacuum processing chamber, opposite the first side;
a first exchange station coupled to the first loadlock opposite the vacuum processing chamber;
a second exchange station coupled to the second loadlock opposite the vacuum processing chamber;
a first exchange mechanism positioned in the first exchange station and operable to load fresh substrates into the first exchange station and remove processed substrates from the first exchange station;
wherein the second exchange station comprises a substrate flipping mechanism;
wherein the substrate flipping mechanism comprises:
a frame;
a plurality of pivots rotatably coupled to the frame;
a plurality of substrate holders, at least one of the substrate holders coupled to each of the pivot;
a rotating driver coupled to the pivots and rotating the pivots synchronously; and,
wherein each of the first and second loadlock chambers comprises:
an upper hanger structured to support at least one substrate;
a lower hanger structured to support at least one substrate; and,
a transport mechanism structured to move the upper and lower hangers into and out of the vacuum processing chamber.

2. The system of claim 1, further comprising a second exchange mechanism positioned in the second exchange station and operable to load fresh substrates into the second exchange station and remove processed substrates from the second exchange station.

3. The system of claim 1, wherein each of the pivots comprises a vacuum conduit.

4. The system of claim 1, further comprising:
a susceptor positioned within the vacuum processing chamber; and,
an exchanger structured to exchange substrates between the upper hanger and the susceptor and between the lower hanger and the susceptor.

5. The system of claim 4, further comprising a lift mechanism structured to move the susceptor in a vertical motion and position the susceptor in one of at least three positions:
a lower position for hanger transfer, an intermediate position for substrates exchange, and
an upper position for substrate processing.

6. The system of claim 5, wherein the lower hanger further comprises hooks for engaging the susceptor and transporting the susceptor to one of the first or second exchange stations.

7. The system of claim 6, wherein the processing chamber comprises a heater and the susceptor is freely positioned on top of the heater.

8. The system of claim 7, further comprising an alignment pin positioned to align the susceptor to the heater.

9. The system of claim 8, wherein one of the upper hanger or lower hanger comprises a floating plate and wherein the lift mechanism is structured to engage and lift the floating plate to thereby align the floating plate to the susceptor.

10. The system of claim 4, wherein the susceptor comprises a plurality of substrate seats, each of the substrate seats having a lift pad positioned therein.

11. The system of claim 10, wherein the vacuum processing chamber further comprises a lift pin mechanism having a plurality of lift pins, each lift pin structured to engage one of the lift pads.

12. The system of claim 1, wherein one of the upper hanger or lower hanger is structured to exclusively introduce fresh substrates into the vacuum processing chamber, while the other one of the upper hanger or lower hanger is structured to exclusively remove processed substrates from the vacuum processing chamber.

13. The system of claim 1, wherein each of the first and second loadlock chambers comprises active drivers and wherein each of the upper and lower hangers comprise drive extensions, such that each of the upper and lower hangers can be driven into the vacuum processing chamber by the active drivers engaging the drive extensions.

14. The system of claim 13, further comprising a controller programmed to energize the active drivers to introduce both of the upper and lower hangers from one of the first or second loadlock chambers into the vacuum processing chamber for substrate exchange, and to remove the upper and lower hangers out of the vacuum processing chamber prior to processing the substrates inside the vacuum processing chamber.

15. The system of claim 13, wherein the controller is programmed to await a ready signal indicating whether the first or the second loadlock chamber is ready, and to energize the active drivers corresponding to the ready signal.

16. The system of claim 1, further comprising a sensor array positioned to detect presence/absence of substrates on at least one of the upper and lower hangers.

17. The system of claim 16, wherein at least one of the upper hanger or lower hanger comprises trigger mechanism for activating the sensor array.

18. The system of claim 1, further comprising:
a vacuum door positioned between the first loadlock chamber and the vacuum processing chamber; and,
at least one camera positioned outside the processing chamber and having a field of view inside the chamber via the vacuum door.

19. The system of claim 1, further comprising:
at least one camera positioned outside the processing chamber and having a field of view inside the chamber via a window;
a processor receiving the images from the camera and inspecting the image to determine whether any broken wafer appears in the image.

* * * * *